US012062658B2

(12) United States Patent
Huang

(10) Patent No.: US 12,062,658 B2
(45) Date of Patent: Aug. 13, 2024

(54) METHOD FOR FORMING AN INTEGRATED CIRCUIT HAVING TRANSISTOR GATES OVER AN INTERCONNECTION STRUCTURE

(71) Applicant: TAIWAN SEMICONDUCTOR MANUFACTURING COMPANY, LTD., Hsinchu (TW)

(72) Inventor: Yu-Lien Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 385 days.

(21) Appl. No.: 17/385,634

(22) Filed: Jul. 26, 2021

(65) Prior Publication Data

US 2022/0320084 A1 Oct. 6, 2022

Related U.S. Application Data

(60) Provisional application No. 63/168,933, filed on Mar. 31, 2021.

(51) Int. Cl.
*H01L 29/66* (2006.01)
*H01L 21/768* (2006.01)
(Continued)

(52) U.S. Cl.
CPC .... *H01L 27/0886* (2013.01); *H01L 21/76895* (2013.01); *H01L 21/76897* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/8221;
(Continued)

(56) References Cited

U.S. PATENT DOCUMENTS 9,093,530 B2  7/2015 Huang et al.
9,171,929 B2  10/2015 Lee et al.
(Continued)

*Primary Examiner* — Younes Boulghassoul
(74) *Attorney, Agent, or Firm* — Maschoff Brennan

(57) ABSTRACT

An integrated circuit structure includes a lower interconnect structure, a first semiconductor fin, a lower gate structure, first source/drain structures, an upper gate structure, and an upper interconnect structure. The first semiconductor fin is above the lower interconnect structure. The lower gate structure is under the first semiconductor fin and extends across the first semiconductor fin. The first source/drain structures are in the first semiconductor fin and on opposite sides of the lower gate structure. The first source/drain structures forms a lower transistor with the lower gate structure. The upper gate structure is above the first semiconductor fin and extends across the first semiconductor fin. The upper gate structure forms an upper transistor with the first source/drain structures. The upper interconnect structure is above the upper gate.

20 Claims, 53 Drawing Sheets

(51) Int. Cl.
*H01L 21/8234* (2006.01)
*H01L 23/485* (2006.01)
*H01L 23/528* (2006.01)
*H01L 27/06* (2006.01)
*H01L 27/088* (2006.01)
*H01L 29/08* (2006.01)
*H01L 29/78* (2006.01)

(52) U.S. Cl.
CPC ........ *H01L 21/823431* (2013.01); *H01L 21/823475* (2013.01); *H01L 23/485* (2013.01); *H01L 23/5283* (2013.01); *H01L 27/0694* (2013.01); *H01L 29/0843* (2013.01); *H01L 29/66795* (2013.01); *H01L 29/7851* (2013.01)

(58) Field of Classification Search
CPC ............ H01L 27/0688; H01L 27/0694; H01L 27/0922; H01L 21/82345; H01L 21/823842; H01L 21/76897; H01L 21/823475; H01L 21/823871; H01L 21/28525; H01L 21/76805; H01L 21/76816; H01L 23/5283; H01L 29/41725; H01L 29/41733
See application file for complete search history.

(56) References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 10,420,171 B2* | 9/2019 | Goktepeli | H01L 23/481 |
| 2015/0061026 A1* | 3/2015 | Lin | H01L 21/823475 257/369 |
| 2015/0348945 A1* | 12/2015 | Or-Bach | H10B 43/20 257/384 |
| 2019/0252253 A1* | 8/2019 | Verma | H01L 29/78618 |
| 2020/0006388 A1* | 1/2020 | Dewey | H01L 27/0688 |
| 2020/0203345 A1* | 6/2020 | Matsuzaki | H01L 27/1207 |
| 2020/0211905 A1* | 7/2020 | Huang | H01L 27/092 |
| 2020/0328201 A1* | 10/2020 | Li | H01L 27/0688 |
| 2020/0328212 A1* | 10/2020 | Wu | H01L 27/0924 |
| 2021/0035975 A1* | 2/2021 | Kim | H01L 29/78684 |
| 2021/0407999 A1* | 12/2021 | Huang | H01L 21/823878 |
| 2022/0231013 A1* | 7/2022 | Hong | H01L 27/092 |
| 2023/0187551 A1* | 6/2023 | Cheng | H01L 21/823814 257/369 |

* cited by examiner

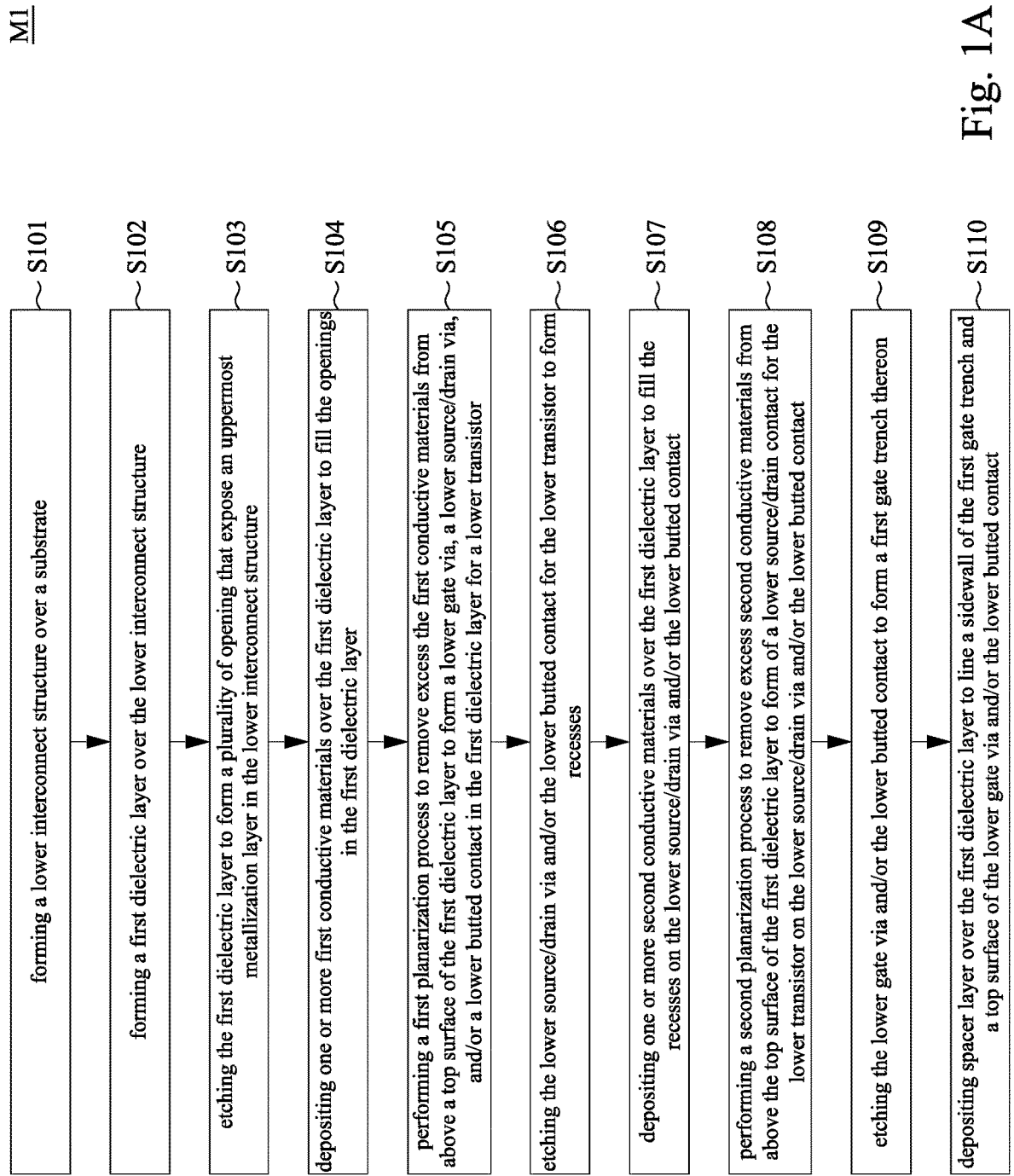

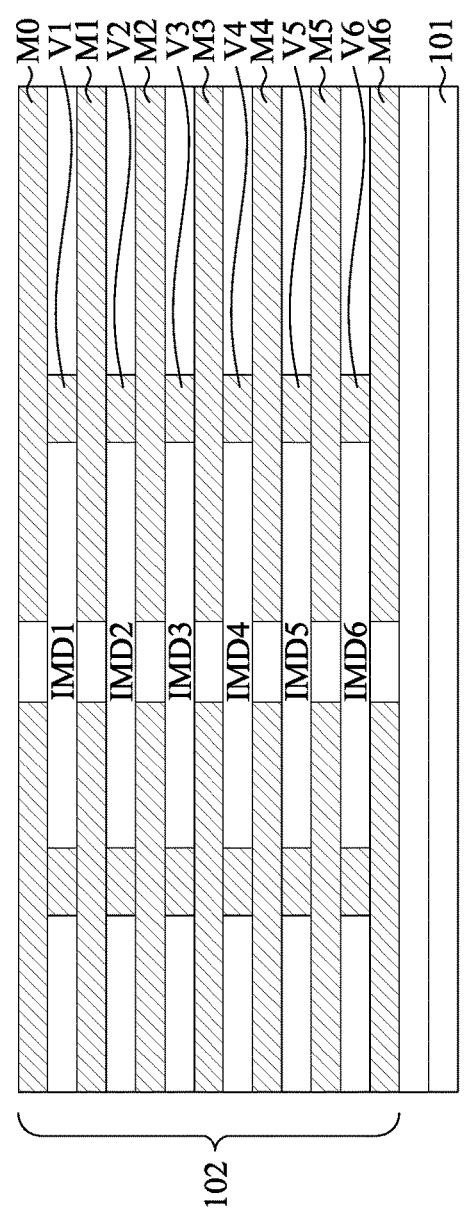

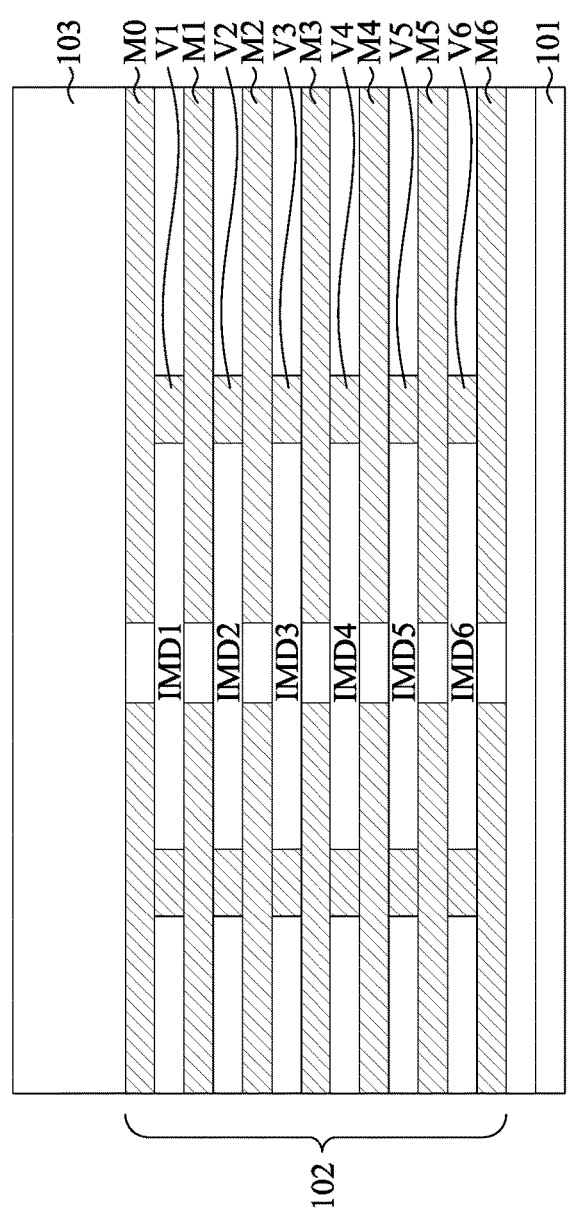

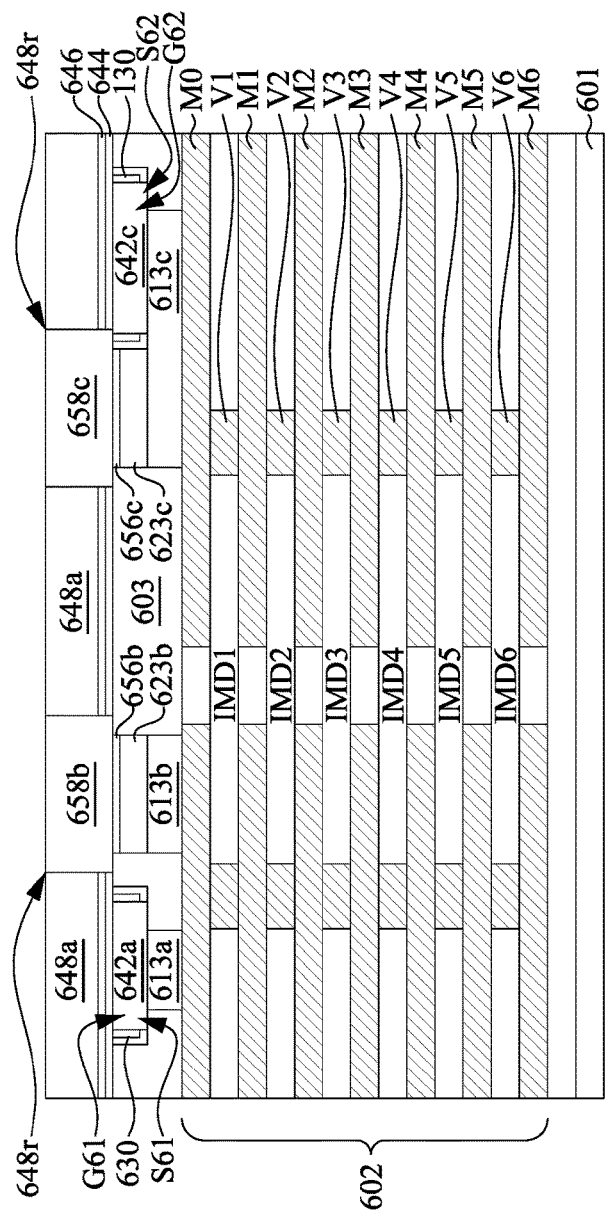

METHOD FOR FORMING AN INTEGRATED CIRCUIT HAVING TRANSISTOR GATES OVER AN INTERCONNECTION STRUCTURE

PRIORITY CLAIM AND CROSS-REFERENCE

This application claims priority to U.S. Provisional Application Ser. No. 63/168,933, filed Mar. 31, 2021, which is herein incorporated by reference in its entirety.

BACKGROUND

The semiconductor integrated circuit (IC) industry has experienced rapid growth. Technological advances in IC materials and design have produced generations of ICs. Each generation has smaller and more complex circuits than the previous generation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C are flowcharts of a method for forming an integrated circuit structure in accordance with some embodiments of the present disclosure.

FIGS. 2-28 illustrate a method in various stages of forming an integrated circuit structure in accordance with some embodiments of the present disclosure.

FIGS. 34-36 illustrate a method in various stages of forming an integrated circuit structure in accordance with some embodiments of the present disclosure.

DETAILED DESCRIPTION

Figure 1B:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In the course of an integrated circuit (IC) evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, these advances have increased the complexity of processing and manufacturing ICs. Since feature sizes continue to decrease, fabrication processes continue to become more difficult to perform. Therefore, it is a challenge to form reliable semiconductor devices with smaller and smaller sizes.

Therefore, the present disclosure in various embodiments provides "double semiconductor devices" on a given transistor area of a chip. More particularly, within a given transistor area, a transistor is disposed above another transistor, which in turn doubles the number of transistors within the given transistor area, so that a functional density of the IC can be increased.

Figure 1C:
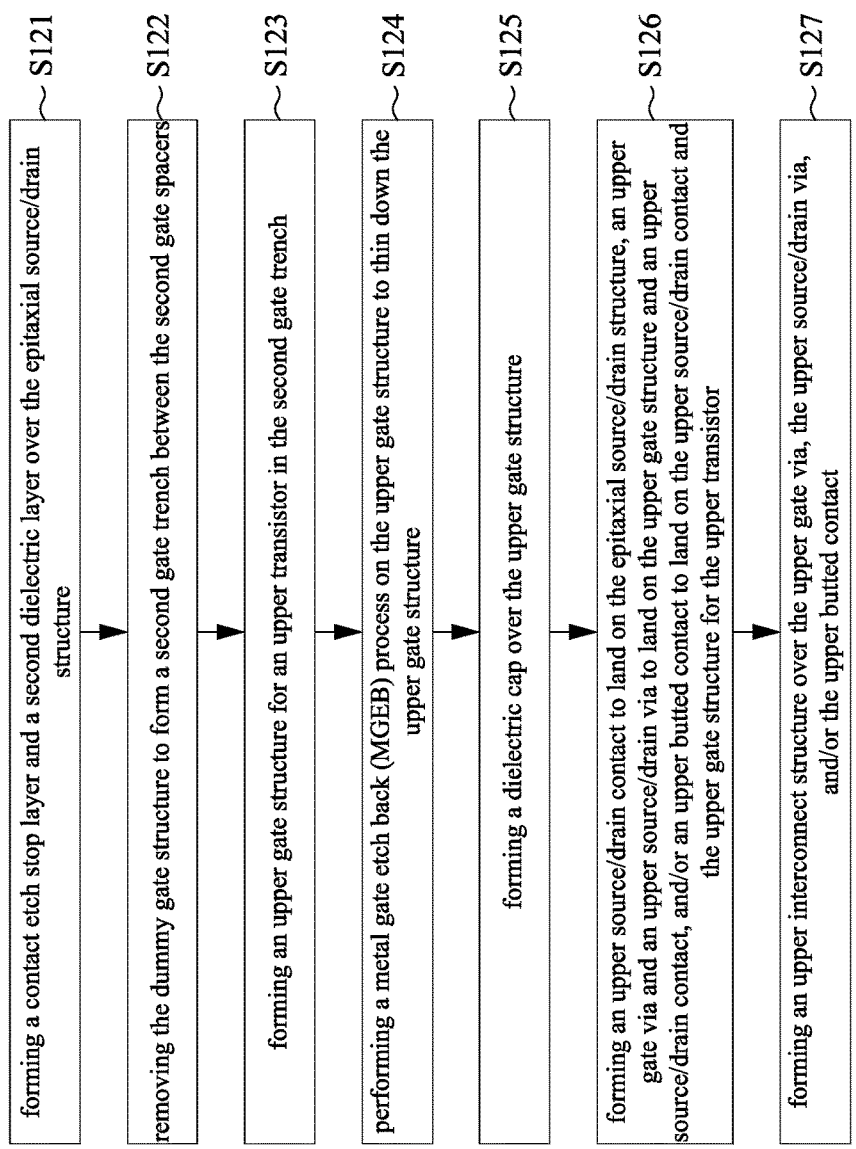

Referring now to FIGS. 1A-1C, illustrated are flowcharts of an exemplary method M1 for fabrication of an integrated circuit structure in accordance with some embodiments. The method M1 includes a relevant part of the entire manufacturing process. It is understood that additional operations may be provided before, during, and after the operations shown by FIGS. 1A-1C, and some of the operations described below can be replaced or eliminated for additional embodiments of the method. The order of the operations/processes may be interchangeable. The method M1 includes fabrication of an integrated circuit structure. However, the fabrication of the integrated circuit structure is merely an example for describing the manufacturing process according to some embodiments of the present disclosure.

FIGS. 2-28 illustrate the method M1 in various stages of forming an integrated circuit structure 100 in accordance with some embodiments of the present disclosure. FIGS. 14A, 15A, 16A, and 18A illustrate top views of the integrated circuit structure 100 in accordance with some embodiments of the present disclosure. FIGS. 2-13, 14 C, 14B, 15 C, 15B, 16 C, 16B, 17, 18 C, 18B, and 19-28 illustrate cross-sectional views of the integrated circuit structure 100 in accordance with some embodiments of the present disclosure, wherein FIGS. 14B, 15B, 16B, and 18B are the cross-sectional views taken along line B-B' in FIGS. 14A, 15A, 16A, and 18A, and FIGS. 14C, 15C, 16C, and 18C are the cross-sectional views taken along line C-C' in FIGS. 14A, 15A, 16A, and 18A including a lower gate electrode for a lower transistor of the integrated circuit structure 100.

The method M1 begins at block S101 where a lower interconnect structure is formed over a substrate. Referring to FIG. 2, in some embodiments of block S101, a substrate 101 includes silicon. Alternatively, the substrate 101 may include germanium, silicon germanium, gallium arsenide or other appropriate semiconductor materials. Also alternatively, the substrate 101 may include an epitaxial layer. For example, the substrate 101 may have an epitaxial layer overlying a bulk semiconductor. Further, the substrate 101 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such a strained substrate may be formed by selective epitaxial growth (SEG). Furthermore, the substrate 101 may include a semiconductor-on-insulator (SOI) structure. Also alternatively, the substrate 101 may include a buried dielectric layer, such as a buried oxide (BOX) layer, such as that formed by separation by implantation of oxygen (SIMOX) technology, wafer bonding, SEG, or another appropriate method.

In some embodiments, an interconnect structure 102 is formed on the substrate 101, before transistor formation. The interconnect structure 102 includes, for example, seven metallization layers, labeled as M0 through M6, with six layers of metallization vias or interconnects, labeled as V1 through V6. Other embodiments may contain more or fewer metallization layers and corresponding more or fewer number of vias. The metal line illustrated here just for an example, and the metal line may be otherwise oriented (rotated 90 degrees or at other orientations). The integrated circuit structure 100 includes a full metallization stack, including a portion of each of metallization layers M0-M6 connected by interconnects V1-V6, with M0 connecting the stack to a subsequently formed source/drain contact of a subsequently formed transistor. Also included in integrated circuit is a plurality of IMD layers. Six IMD layers, identified as IMD1 through IMD6 are depicted in FIG. 2. The IMD layers may provide electrical insulation as well as structural support for the various features of the integrated circuit during many fabrication process steps.

Referring back to FIG. 1A, the method M1 then proceeds to block S102 where a first dielectric layer is formed over the lower interconnect structure. With reference to FIG. 3, in some embodiments of block S102, a dielectric layer 103 is formed over the interconnect structure 102. In some embodiments, an etch stop layer (not shown) is formed over the interconnect structure 102 prior to forming the dielectric layer 103. In some embodiments, the dielectric layer 103 may be formed of a similar material as the IMD layers. By way of example but not limiting the present disclosure, the dielectric layer 103 may be made of silicon oxide, silicon nitride, silicon oxynitride, tetraethoxysilane (TEOS) oxide, phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the dielectric layer 103 may be deposited using any suitable method, such as CVD, physical vapor deposition (PVD), ALD, PEALD, PECVD, SACVD, FCVD, spin-on, and/or the like, or a combination thereof.

Figure 4:
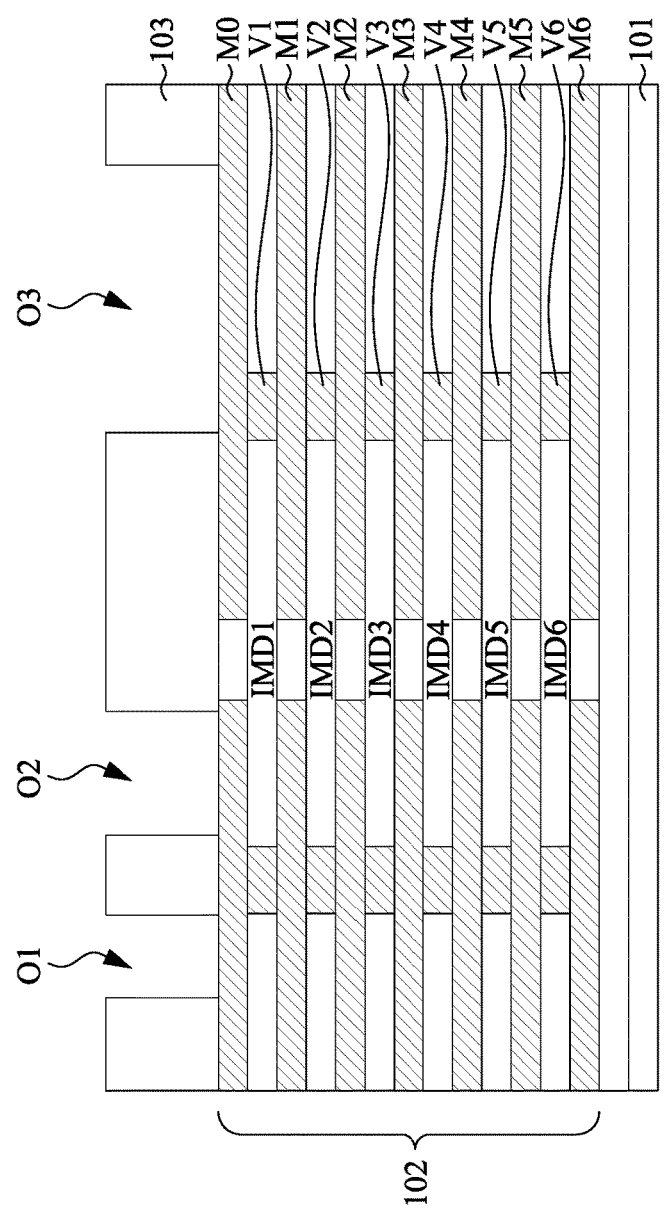
Figure 28:
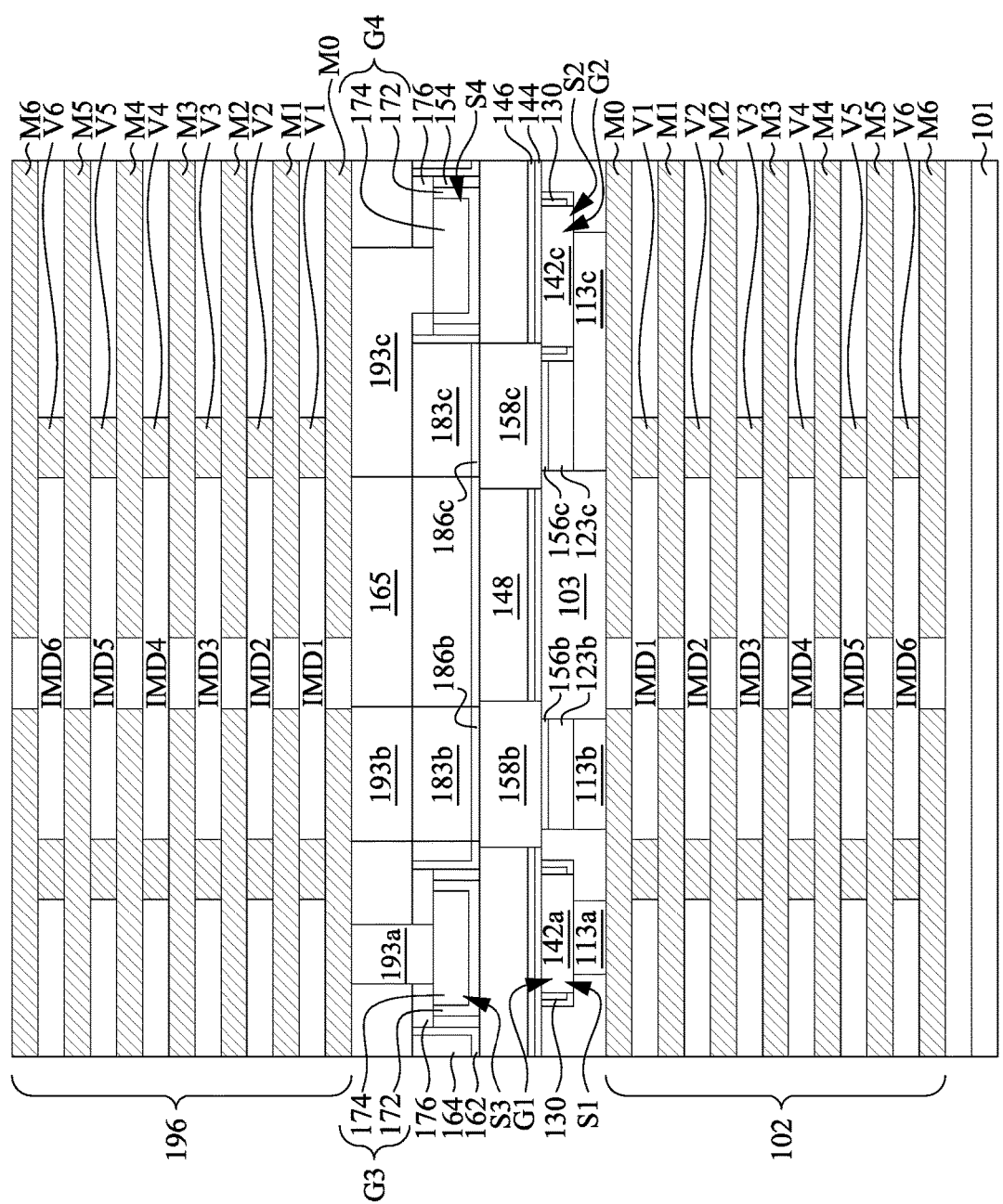

Referring back to FIG. 1A, the method M1 then proceeds to block S103 where the first dielectric layer is etched to form a plurality of first opening that exposes an uppermost metallization layer in the lower interconnect structure. With reference to FIG. 4, in some embodiments of block S103, the dielectric layer 103 is etched to form openings O1, O2, and O3 that expose an uppermost metallization layer M0 in the interconnect structure 102, wherein the openings O1, O2, and O3 may have a gate via (or called gate contact) 113a, a source/drain via 113b, and a butted contact 113c (see FIG. 6) therein which will be formed in the subsequent processes, these vias will make physical and electrical connections to subsequently formed gate electrodes 142a and 142c and epitaxial source/drain structures 158b and 158c of transistors S1 and S2, as shown in FIG. 28. In particular, these openings O1, O2, and O3 expose a plurality of separate regions of the metallization layer M0. The openings O1, O2, and O3 are formed by using a photolithography and a first etching process. For example, a first patterned mask (not shown) may be formed over the dielectric layer 103 and used to protect the dielectric layer 103 underlying thereof from the first etching process. Subsequently, the first etching process is performed on the dielectric layer 103 through the first patterned mask and stops until the metallization layer M0 is reached. The first etching process may include a dry etch, a wet etch, a reactive ion etch (RIE), another suitable etching process, or combinations thereof. Accordingly, the metallization layer M0 is exposed in the openings O1, O2, and O3. The first patterned mask subsequently stripped, such as by wet stripping or plasma ashing.

Figure 5:
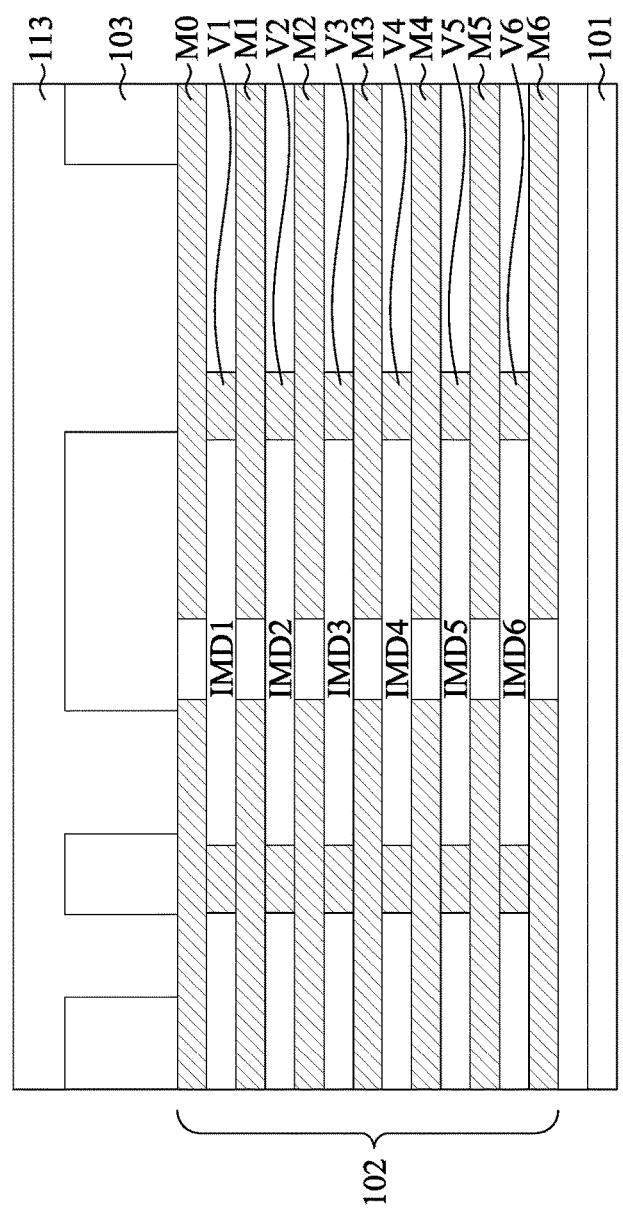

Referring back to FIG. 1A, the method M1 then proceeds to block S104 where one or more first conductive materials are deposited over the first dielectric layer to fill the first openings in the first dielectric layer. With reference to FIG. 5, in some embodiments of block S105, one or more conductive materials 113 are deposited over the dielectric layer 103 to fill the openings O1, O2, and O3 in the dielectric layer 103. In some embodiments, the conductive material 113 may be formed of copper (Cu), aluminum (Al), Co (Cobalt), titanium (Ti), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof. In some embodiments, the conductive material 113 may be deposited using any suitable method, such as CVD, ALD, PEALD, PECVD, PVD, ECP, electroless plating, and/or the like, or a combination thereof.

Figure 6:
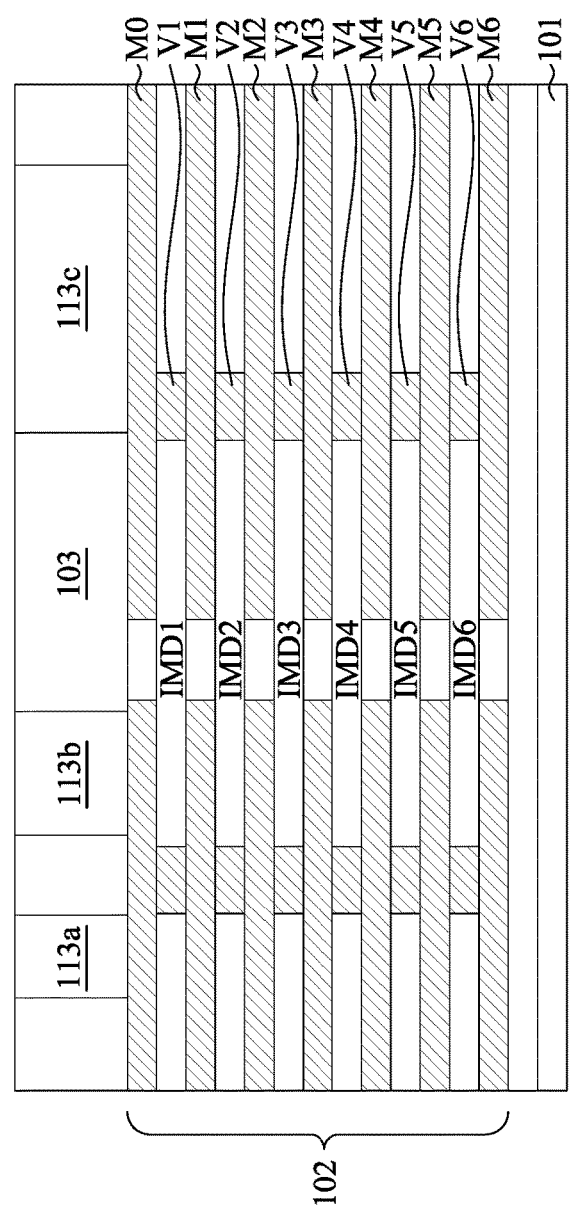

Referring back to FIG. 1A, the method M1 then proceeds to block S105 where a first planarization process is performed to remove excess the first conductive materials from above a top surface of the first dielectric layer to form a lower gate via, a lower source/drain via, and/or a lower butted contact in the first dielectric layer for a lower transistor. With reference to FIG. 6, in some embodiments of block S105, a chemical mechanical polish (CMP) process may be used to remove excess the conductive material 113 from above a top surface of the dielectric layer 103. The remaining conductive structures fill the openings O1, O2, and O3 in the dielectric layer 103 and serve as the gate via 113a, the source/drain via 113b, and the butted contact 113c making physical and electrical connections to the metallization layer M0 in the interconnect structure 102. In some embodiments, the gate via 113a, the source/drain via 113b, and the butted contact 113c may be formed simultaneously or by separated patterning process by using photolithography, etching and deposition techniques.

Figure 7:
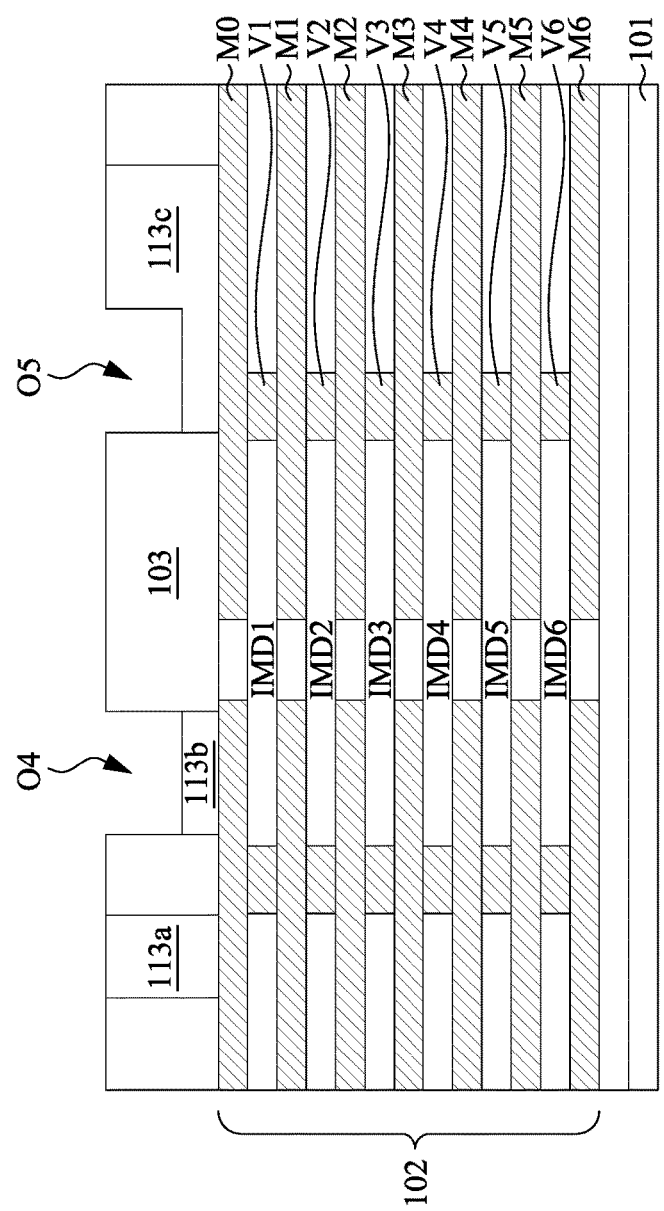

Referring back to FIG. 1A, the method M1 then proceeds to block S106 where the lower source/drain via and/or the lower butted contact for the lower transistor is etched to form recesses. With reference to FIG. 7, in some embodiments of block S106, portions of the source/drain via 113b and the butted contact 113c are etched to form recesses O4 and O5 in the dielectric layer 103. In particular, these recesses O4 and O5 expose the etched source/drain via 113b and butted contact 113c. The recesses O4 and O5 are formed by using a second photolithography and a second etching process. For example, a second patterned mask (not shown) may be formed over the gate via 113a, a first portion of the butted contact 113c, and a first portion of the source/drain via 113b. Subsequently, the second etching process is performed on a second portion of the source/drain via 113b and a second portion of the butted contact 113c through the second patterned mask to recess the second portion of the source/drain via 113b and the second portion of the butted contact 113, thus forming the recess O4 above the second portion of the source drain via 113b and the recess O5 above the second portion of the butted contact. The second etching process may include a dry etch, a wet etch, a reactive ion etch (RIE), another suitable etching process, or combinations thereof. The second patterned mask subsequently stripped, such as by wet stripping or plasma ashing.

Figure 8:
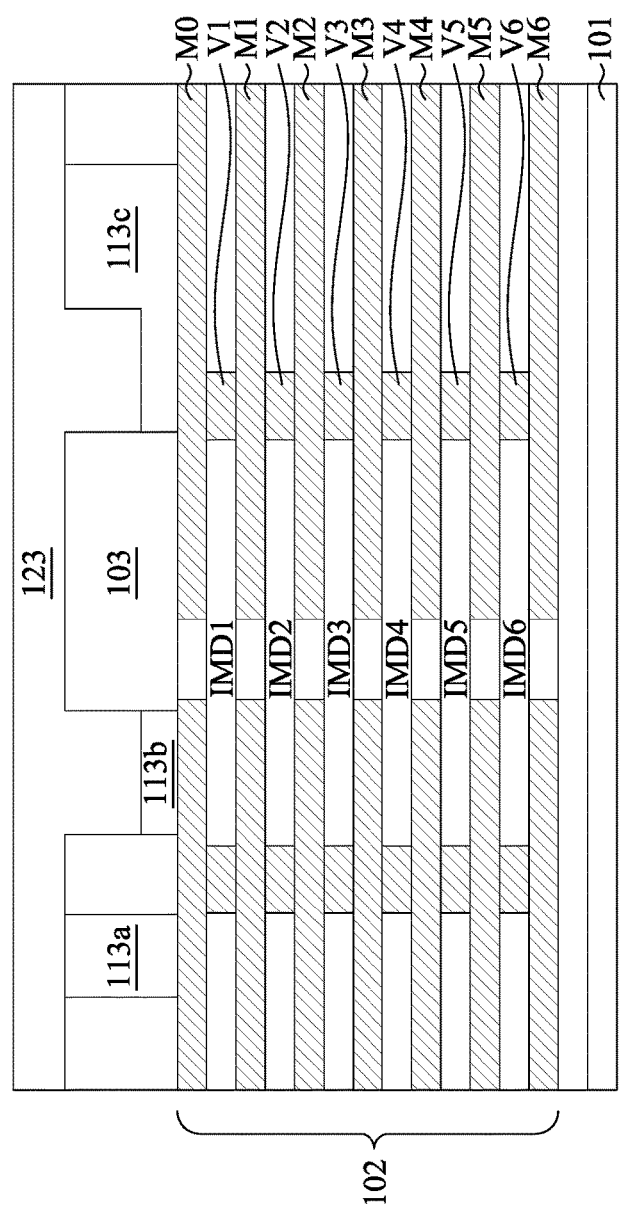

Referring back to FIG. 1A, the method M1 then proceeds to block S107 where one or more second conductive materials are deposited over the first dielectric layer to fill the recesses on the lower source/drain via and/or the lower butted contact. With reference to FIG. 8, in some embodiments of block S107, one or more conductive materials 123 are deposited over the dielectric layer to fill the recesses O4 and O5 in the dielectric layer 103. In some embodiments, the conductive material 123 may be formed of copper (Cu), aluminum (Al), titanium (Ti), Co (Cobalt), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof. In some embodiments, the conductive material 123 may be deposited using any suitable method, such as CVD, ALD, PEALD, PECVD, PVD, ECP, electroless plating, and/or the like, or a combination thereof.

Figure 9:
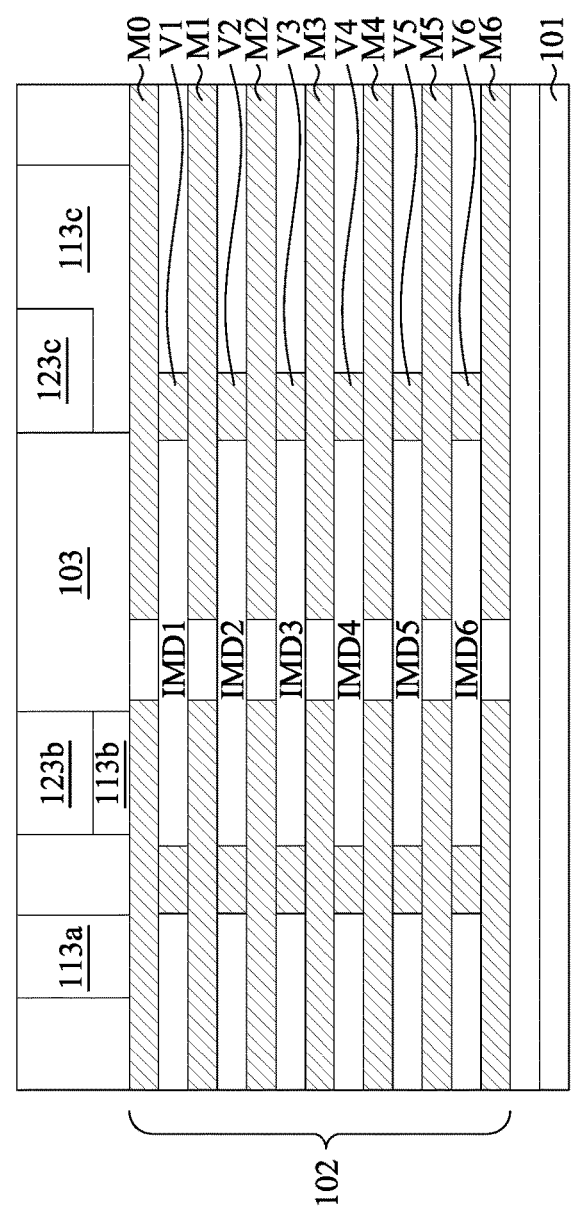

Referring back to FIG. 1A, the method M1 then proceeds to block S108 where a second planarization process is performed to remove excess second conductive materials from above the top surface of the first dielectric layer to form of a lower source/drain contact for the lower transistor on the lower source/drain via and/or the lower butted contact. With reference to FIG. 9, in some embodiments of block S108, a planarization process (e.g., CMP) may be used to remove excess the conductive material 123 from above the top surface of the dielectric layer 103. The remaining conductive structures fill the recesses O4 and O5 in the dielectric layer 103 and serve as the source/drain contact 123b and the source/drain contact 123c on the source/drain via 113b and the butted contact 113c. In some embodiments, the source/drain contacts 123b and 123c may be formed simultaneously by using photolithography, etching and deposition techniques.

Figure 10:
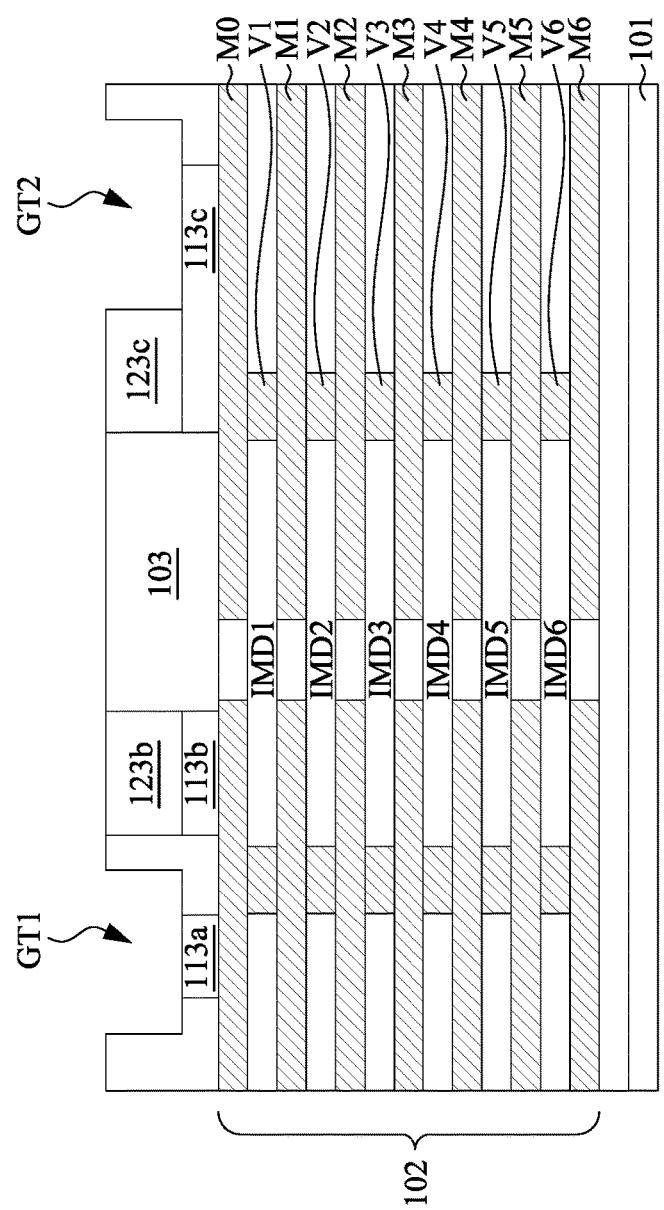

Referring back to FIG. 1A, the method M1 then proceeds to block S109 where the lower gate via and/or the lower butted contact is etched to form a first gate trench thereon. With reference to FIG. 10, in some embodiments of block S109, the gate via 113a, the butted contact 113c, and portions of the dielectric layer 103 adjacent to the gate via 113a and the butted contact 113c are etched to form gate trenches GT1 and GT2 in the dielectric layer 103. In particular, these gate trenches GT1 and GT2 expose the gate via 113a and the first portion of the butted contact 113c. The gate trenches GT1 and GT2 are formed by using a third photolithography and a third etching process. For example, a third patterned mask (not shown) may be formed over the source/drain contacts 123b and 123c and used to protect the source/drain contacts 123b and 123c from the third etching process. Subsequently, the third etching process is performed on the gate via 113a and the first portion of the butted contact 113c through the third patterned mask to recess the gate via 113a and the first portion of the butted contact 113c and results in the gate trenches GT1 and GT2. The third etching process may include a dry etch, a wet etch, a reactive ion etch (RIE), another suitable etching process, or combinations thereof. The third patterned mask subsequently stripped, such as by wet stripping or plasma ashing.

Figure 11:
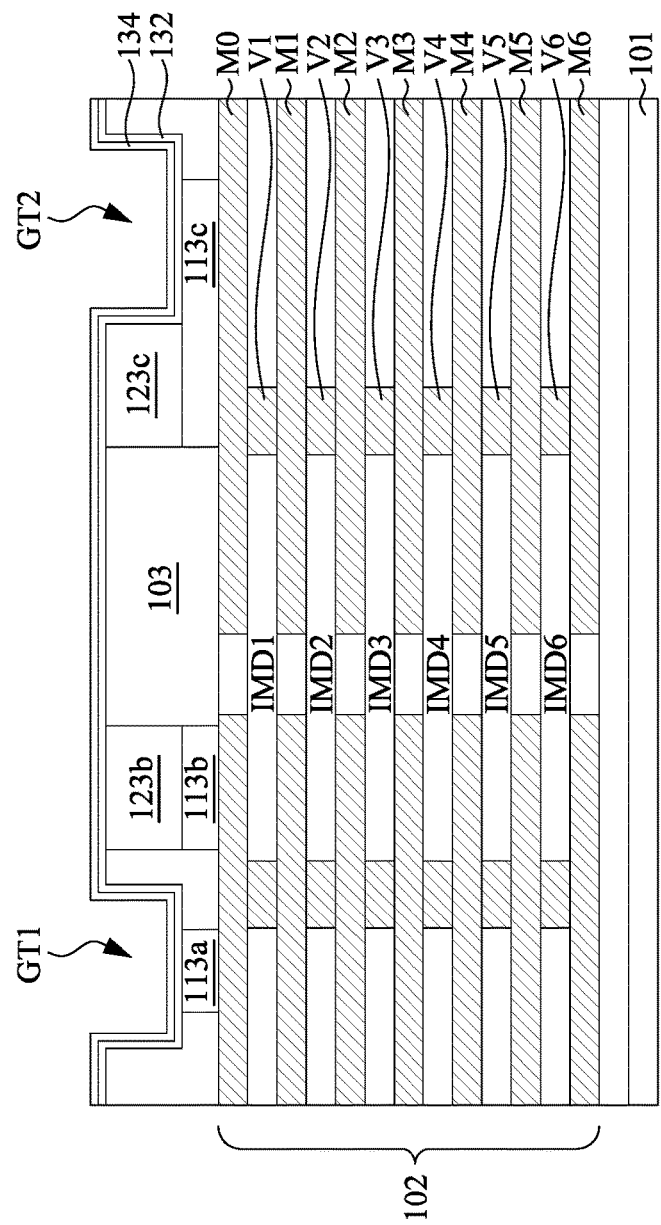

Referring back to FIG. 1B, the method M1 then proceeds to block S110 where spacer layers are deposited over the first dielectric layer to line a sidewall of the first gate trench and a top surface of the lower gate via and/or the lower butted contact. With reference to FIG. 11, in some embodiments of block S110, a first spacer layer 132 and a second spacer layer 134 are deposited over the structure shown in FIG. 10. Other embodiments may contain more or fewer spacer layers. In FIG. 11, the first spacer layer 132 lines sidewalls of the gate trenches GT1 and GT2 and a top surface of the gate via 113a in the gate trench GT1, and a top surface of the butted contact 113c in the gate trench GT2. Subsequently, the second spacer layer 134 is conformally formed over the first spacer layer 132. The second spacer layer 134 may be made of a different material than the first spacer layer 132. In some embodiments, the second spacer layer 134 has a dielectric constant less than that of the first spacer layer 132.

In some embodiments, the first spacer layer 132 and/or the second spacer layer 134 may include low-k carbon-containing materials such as, for example, silicon oxide, silicon nitride, silicon oxycarbonitride (SiOCN), silicon oxycarbide (SiOC), silicon carbide (SiC), or other suitable dielectric materials. In some embodiments, the first spacer layer 132 and/or the second spacer layer 134 may include porous dielectric materials. In some embodiments, the first spacer layer 132 and/or the second spacer layer 134 may include other low-k dielectric materials, such as carbon doped silicon dioxide, low-k silicon nitride, low-k silicon oxynitride, polyimide, spin-on glass (SOG), fluoride-doped silicate glass (FSG), phosphosilicate glass (PSG), borophosphosilicate glass (BPSG), Xerogel, Aerogel, amorphous fluorinated carbon, Parylene, BCB (bis-benzocyclobutenes), other suitable low-k dielectric materials, and/or combinations thereof. In some embodiments, the first spacer layer 132 and/or the second spacer layer 134 may be formed by a deposition process, such as an atomic layer deposition (ALD) process, a physical vapor deposition (PVD) process, a sputter deposition process, a chemical vapor deposition (CVD) process such as plasma enhanced CVD (PECVD), low pressure CVD (LPCVD), atomic layer deposition (ALD), or other suitable techniques.

Figure 12:
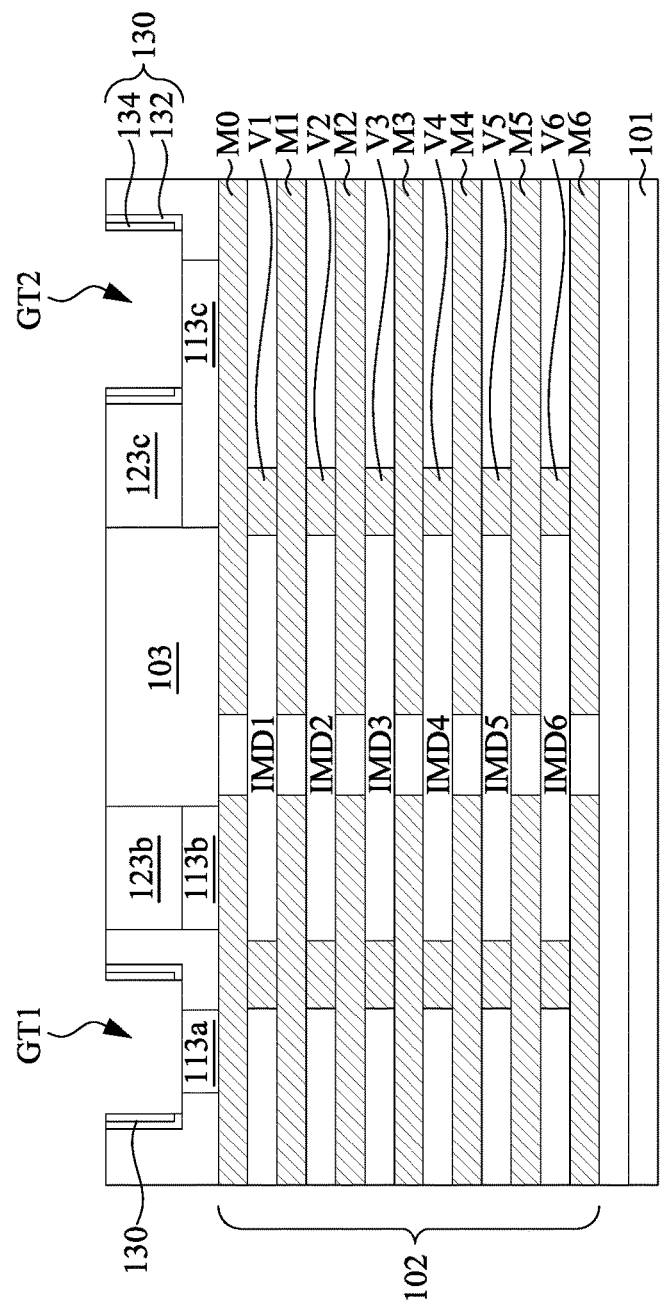
Figure 13:
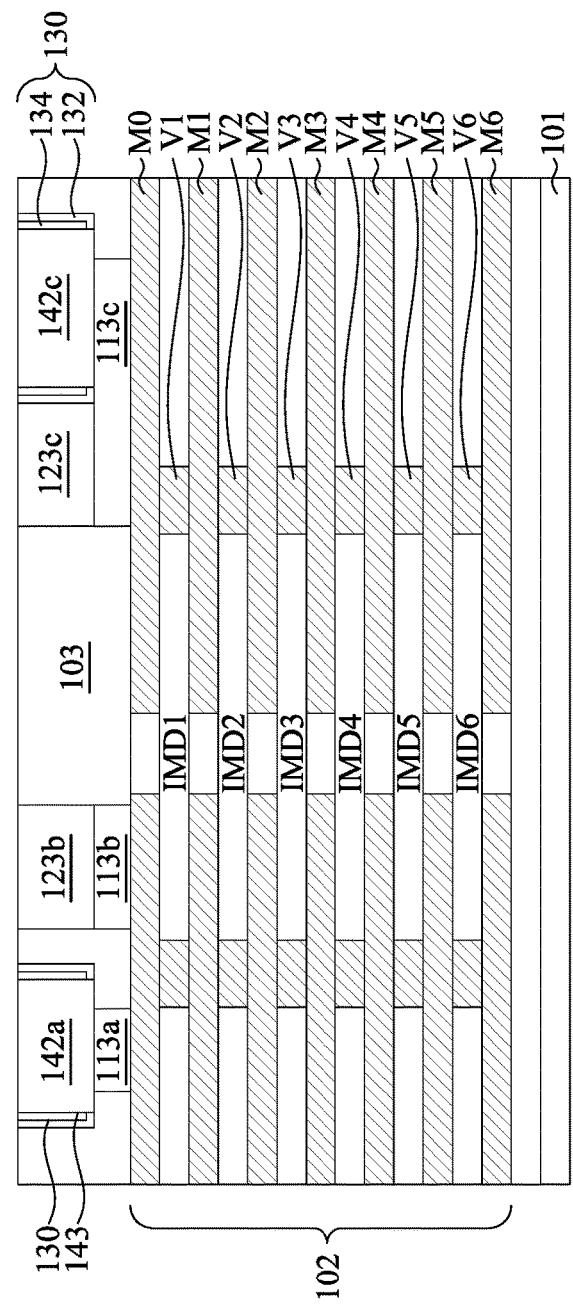

Referring back to FIG. 1B, the method M1 then proceeds to block S111 where the spacer layers are patterned to form first gate spacers. With reference to FIG. 12, in some embodiments of block S111, a fourth etching process is performed to remove portions of first and second dielectric layer 132 and 134, and remaining portions of the first and second dielectric layer 132 and 134 can serve as gate spacers 130 located on opposite sides of the gate electrodes 142a and 142c (see FIG. 13) which will be formed in the subsequent process. That is, two gate spacers 130 are respectively located on two opposite sidewalls 143 of the subsequently formed gate electrodes 142a and 142c, as shown in FIG. 13. The fourth etching process may be, for example, an anisotropic etching process. The fourth etching process may include a single step or multiple steps. In some embodiments, the fourth etching process is a dry etching process. By way of example and not limitation, a dry etching process may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Referring back to FIG. 1B, the method M1 then proceeds to block S112 where a lower gate electrode is formed in the first gate trench for the lower transistor. With reference to FIG. 13, in some embodiments of block S112, the gate electrodes 142a and 142c are respectively formed in the gate trenches GT1 and GT2 and over the gate via 113a and the first portion of the butted contact 113c. On the other hand, the first portion of the butted contact 113c overlaps with the gate electrode 142c and the second portion of the butted contact 113c overlaps with the source/drain contact 123c. An exemplary method of forming these gate electrodes 142a and 142c may include forming one or more work function metal layers over the dielectric layer 103, forming a fill metal layer over the one or more work function metal layers, and performing a CMP process to remove excessive materials of the fill metal layer and the one or more work function metal layers outside the gate trenches GT1 and GT2.

In some embodiments, the gate electrode 142a or 142c may include suitable work function metals to provide suitable work functions. In some embodiments, the gate electrode 142a or 142c may include one or more n-type work function metals (N-metal) for forming an n-type transistor on the substrate 101. The n-type work function metals may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the gate electrode 142a or 142c may include one or more p-type work function metals (P-metal) for forming a p-type transistor over the substrate 101. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the gate electrode 142a and 142c may be made of different work function metals so as to achieve suitable work functions in some embodiments. In some embodiments, an entirety of the gate electrode 142a or 142c is a work function metal.

Figure 14A:
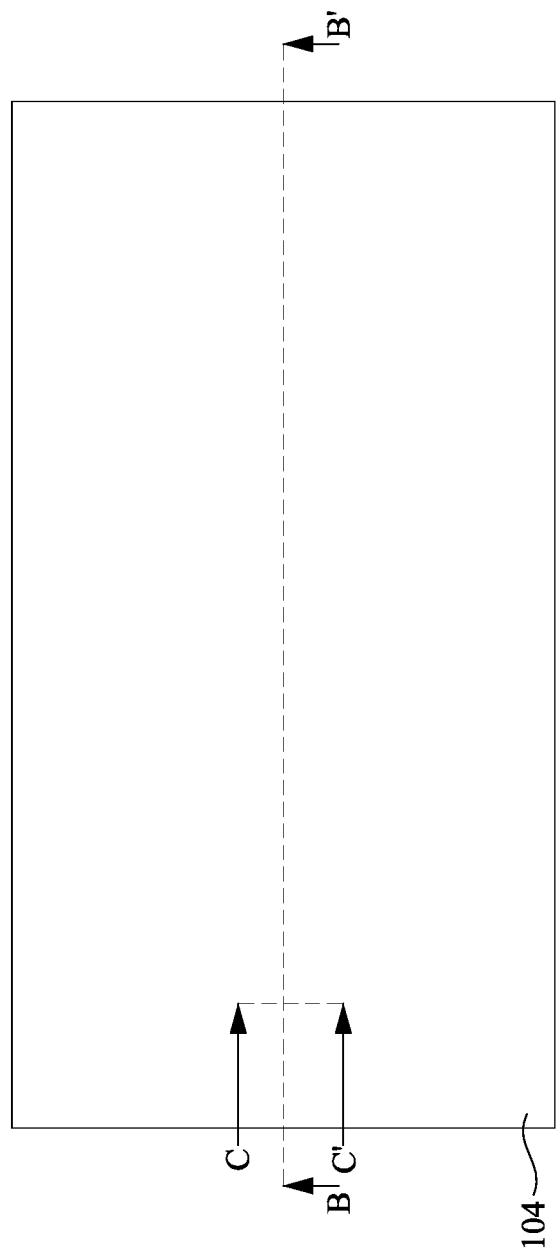
Figure 14C:
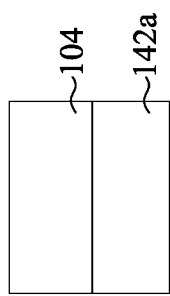
Figure 14B:
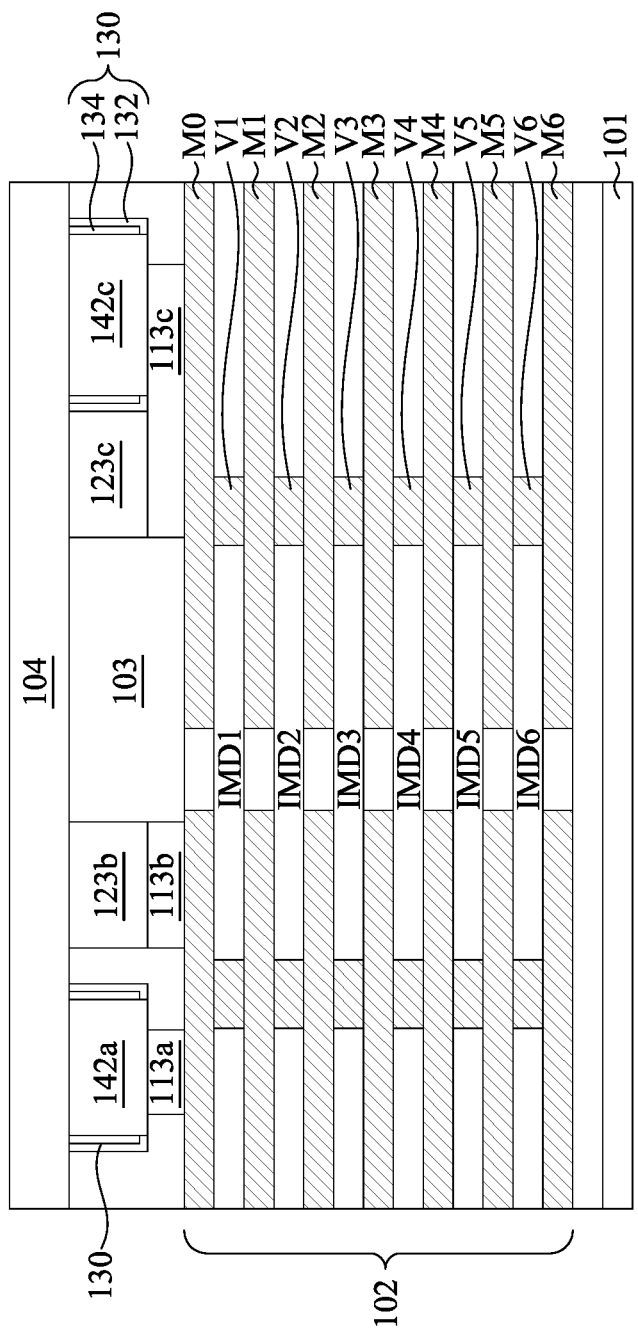

Referring back to FIG. 1B, the method M1 then proceeds to block S113 where an isolation dielectric is deposited over the first dielectric layer. With reference to FIGS. 14A-14C, in some embodiments of block S113, an isolation dielectric 104 is deposited over the dielectric layer. The isolation dielectric 104 may include any suitable dielectric material, such as silicon oxide. The method of forming the isolation dielectric 104 may include depositing an isolation dielectric 104 on the dielectric layer 103 to cover the gate electrode 142a and 142c, the gate spacers 130, and the source/drain contacts 123b and 123c. In some embodiments, the isolation dielectric 104 may be formed by a deposition processes, such as chemical vapor deposition (CVD), physical vapor deposition (PVD), atomic layer deposition (ALD), plasma enhanced CVD (PECVD) or other suitable techniques.

Figure 15A:
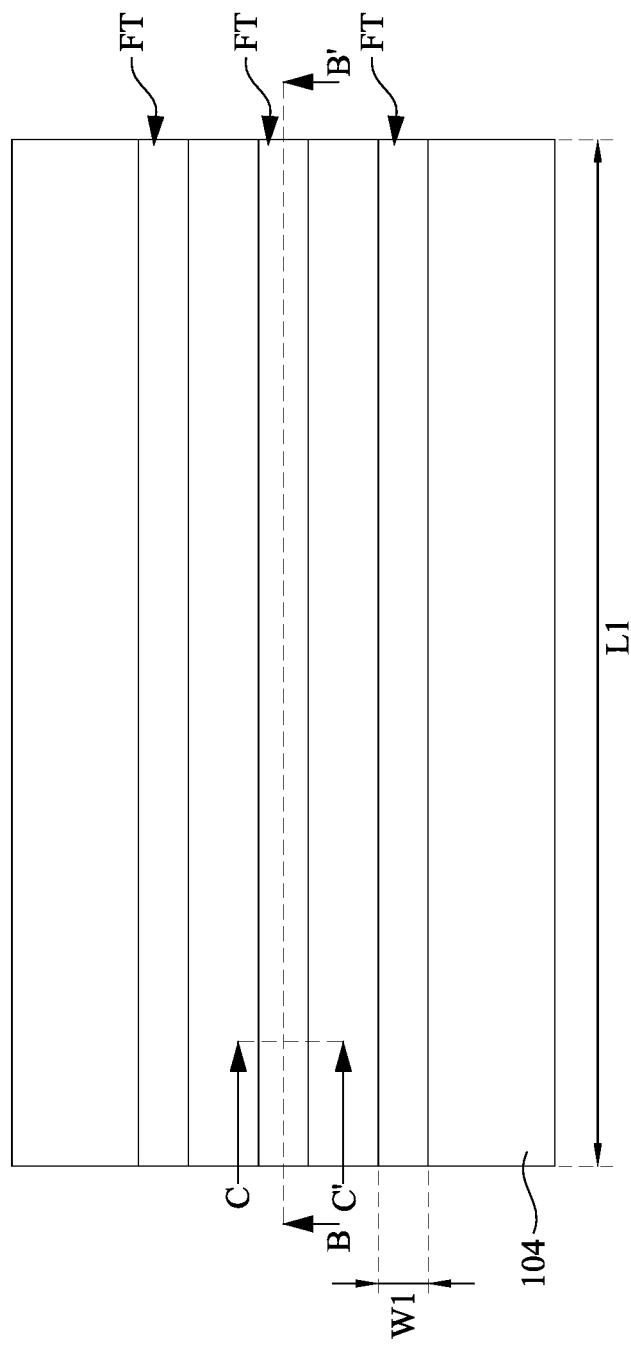
Figure 15C:
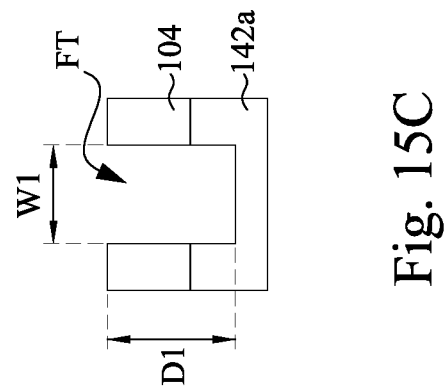
Figure 15B:
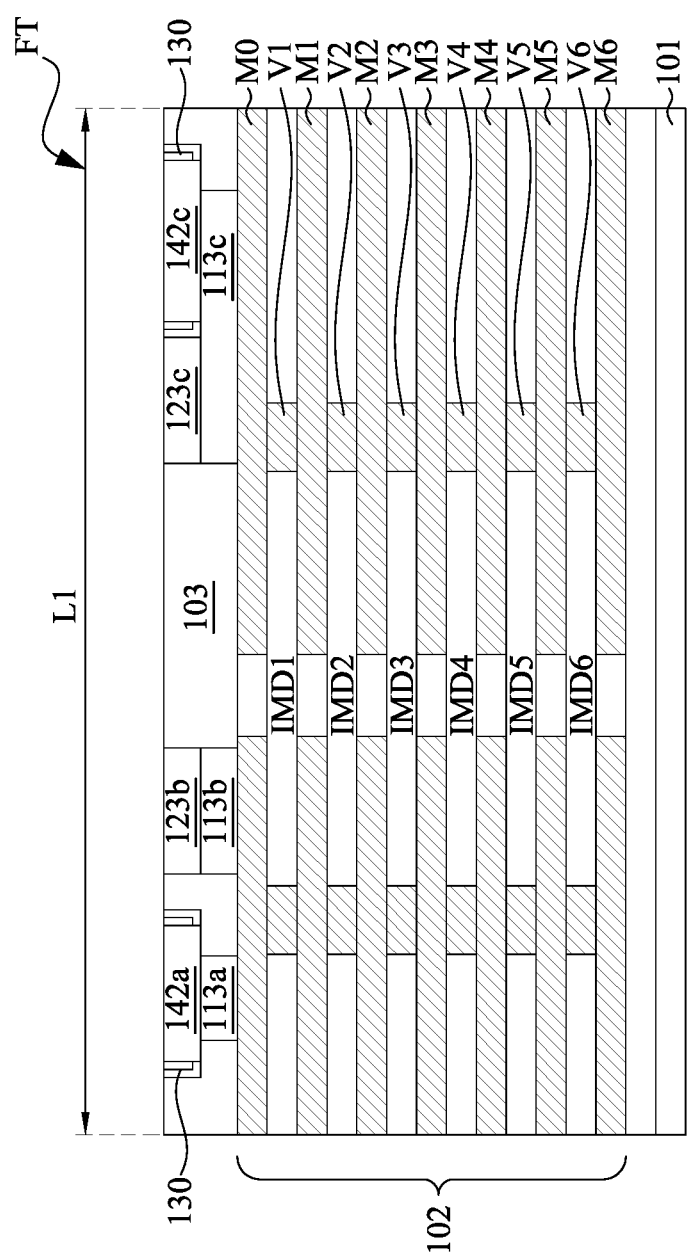

Referring back to FIG. 1B, the method M1 then proceeds to block S114 where the isolation dielectric is etched to form a plurality of fin trenches having a length extending across the gate electrode and having a depth down into the lower gate electrode. With reference to FIGS. 15A-15C, in some embodiments of block S114, a fifth etching process is performed on the isolation dielectric 104 to form a plurality of fin trenches FT. Each fin trench FT has a length L1 as shown in FIGS. 15A and 15B extending across the gate electrodes 142a and 142c, a depth D1 as shown in FIG. 15C down into the gate electrodes 142a and 142c, and a width W1 as shown in FIGS. 15A and 15C. In other words, the depth D1 of the fin trench FT is greater than a thickness of the isolation dielectric 104. In some embodiments, the fin trench FT is formed by using a fifth photolithography and the fifth etching process. For example, a fifth patterned mask (not shown) may be formed over the isolation dielectric 104. Subsequently, the fifth etching process is performed on the isolation dielectric 104 through the fifth patterned mask to etch through the isolation dielectric 104 and further etch portions of the gate electrodes 142a and 142c, thus forming the fin trenches FT. The fifth etching process may include a dry etch, a wet etch, a reactive ion etch (RIE), another suitable etching process, or combinations thereof. The fifth patterned mask subsequently stripped, such as by wet stripping or plasma ashing.

Figure 16A:
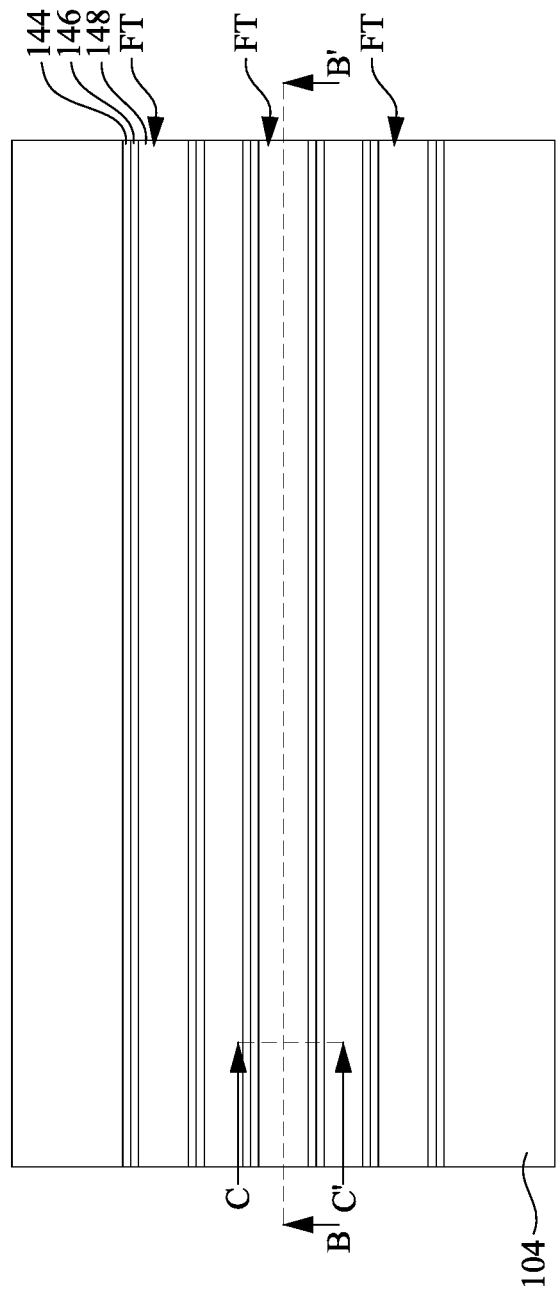
Figure 16C:
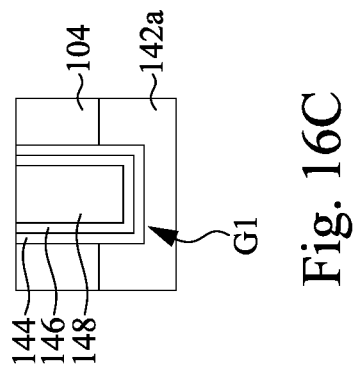
Figure 16B:
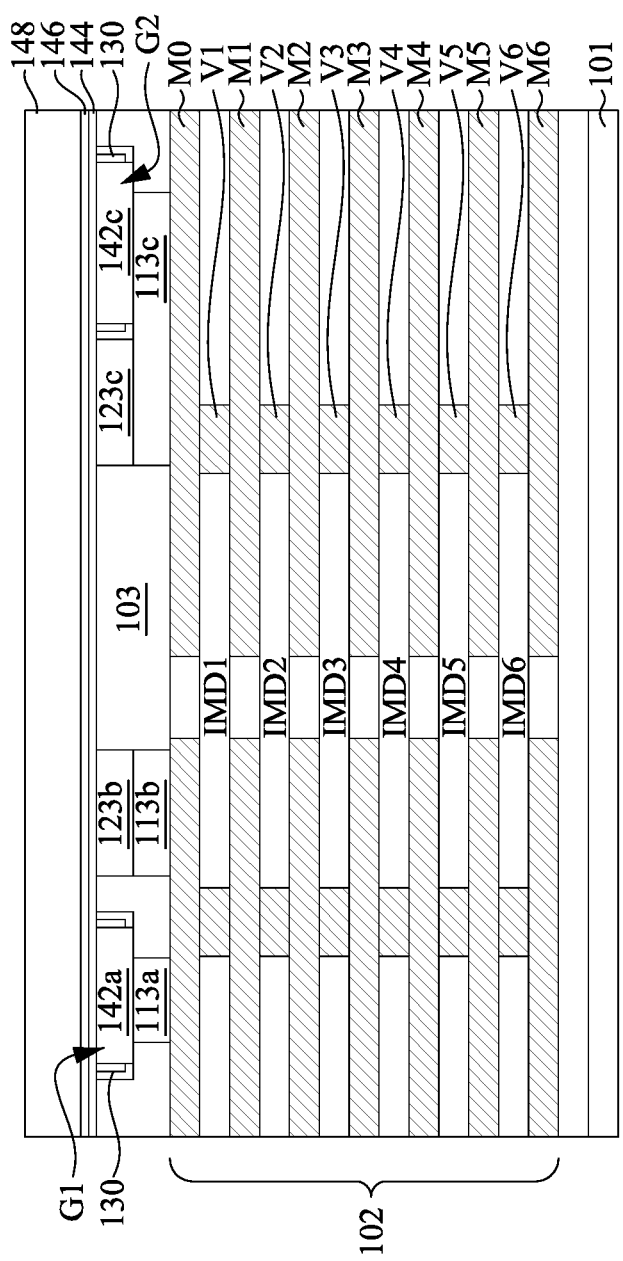

Referring back to FIG. 1B, the method M1 then proceeds to block S115 where an interfacial layer, a gate dielectric layer, and a semiconductor fin are formed in the fin trench for the lower transistor, wherein the interfacial layer and the gate dielectric layer wrap around the semiconductor fin. With reference to FIGS. 16A-16C, in some embodiments of block S115, a gate dielectric layer 144 is formed to line sidewalls and a bottom surface of the fin trench FT. In some embodiments, the gate dielectric layer 144 with the underlying gate electrode 142a or 142c can be collectively referred to as a gate structure G1 or G2. Subsequently, an interfacial layer 146 is conformally formed on the gate dielectric layer 144. Subsequently, a semiconductor fin 148 is formed to fill the fin trench FT and to be wrapped around by the gate dielectric layer 144 and the interfacial layer 146 as shown in FIG. 16C. The method of forming the semiconductor fin 148 may include depositing a semiconductor material over the isolation dielectric 104 and fill in the fin trench FT, optionally performing a planarization process, such as a chemical mechanical polishing (CMP) process, to remove the excess semiconductor fin 148, the gate dielectric layer 144, and the interfacial layer 146 outside the fin trench FT and results in a structure as shown in FIGS. 16A-16C. In some embodiments, the semiconductor material may be formed by a deposition processes, such as chemical vapor deposition (CVD), physical vapor deposition (PVD), Furnace (LPCVD), atomic layer deposition (ALD), plasma enhanced CVD (PECVD) or other suitable techniques. In some embodiments, the deposition processes may be performed at a temperature in a range from about 300° C. to about 600° C. (e.g., about 300, 350, 400, 450, 500, 550, or 600° C.). The temperature and other process conditions of the deposition process are selected to allow for forming a semiconductor material on the gate electrode material, via material and dielectric material. In some embodiments, the semiconductor fin may be formed by depositing an amorphous semiconductor material (e.g., amorphous silicon) in the fin trench FT, followed by crystallizing the amorphous semiconductor material into a single-crystalline semiconductor material (e.g., single-crystalline silicon) using, for example, RTA (rapid thermal annealing).

In some embodiments, the semiconductor fin 148 may include silicon, silicon germanium ($Si_xGe_{1-x}$, where x can be between approximately 0 and 1), silicon carbide, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

In some embodiments, the gate dielectric layer 144 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 144 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), silicon oxynitrides (SiON), and combinations thereof. In some embodiments, the interfacial layer 146 may include such as silicon oxide. In some embodiments, the interfacial layer 146 may be made of a different material than the gate dielectric layer 144.

Figure 17:
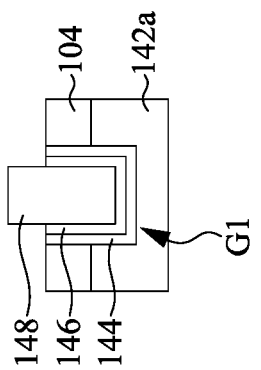

Referring back to FIG. 1B, the method M1 then proceeds to block S116 where the isolation dielectric is recessed to below a top surface of the semiconductor fin. With reference to FIG. 17, in some embodiments of block S116, the isolation dielectric 104 is recessed to below a top surface of the semiconductor fin 148. After recessing the isolation dielectric 104, the semiconductor fin 148 protrudes from the isolation dielectric 104. In other words, an upper portion of the semiconductor fin 148 is higher than a top surface of the isolation dielectric 104. In some embodiments, the etching process performed may be a wet etching process. By way of example but not limiting the present disclosure, the wet etching process may be performed using diluted HF, SiCoNi (including HF and $NH_3$), or the like, may be used as the etchant. In alternative embodiments, the etching process may be a dry etching process. By way of example but not limiting the present disclosure, the dry etching process may be performed using $CF_4$, $C_4F_6$, and/or $C_4F_8$ as the etching gas.

Figure 18A:
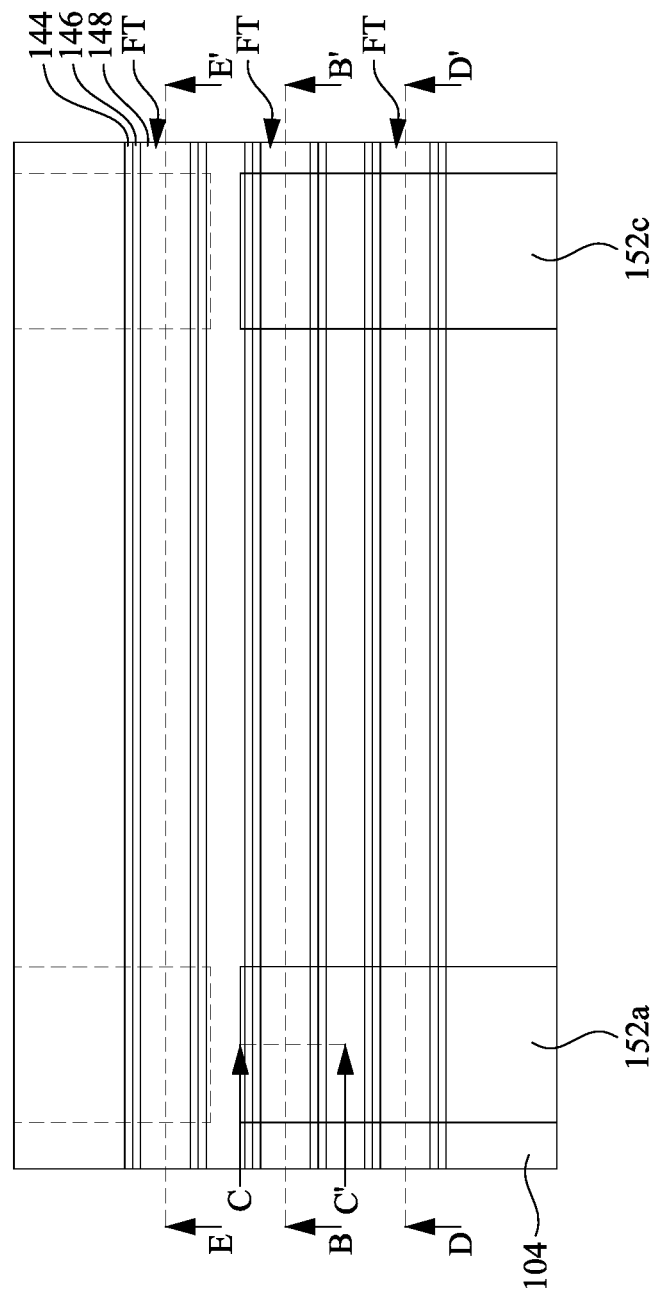
Figure 18C:
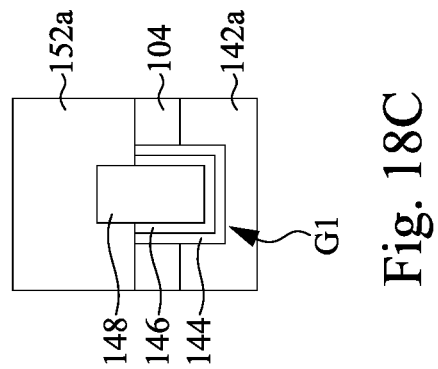
Figure 18B:
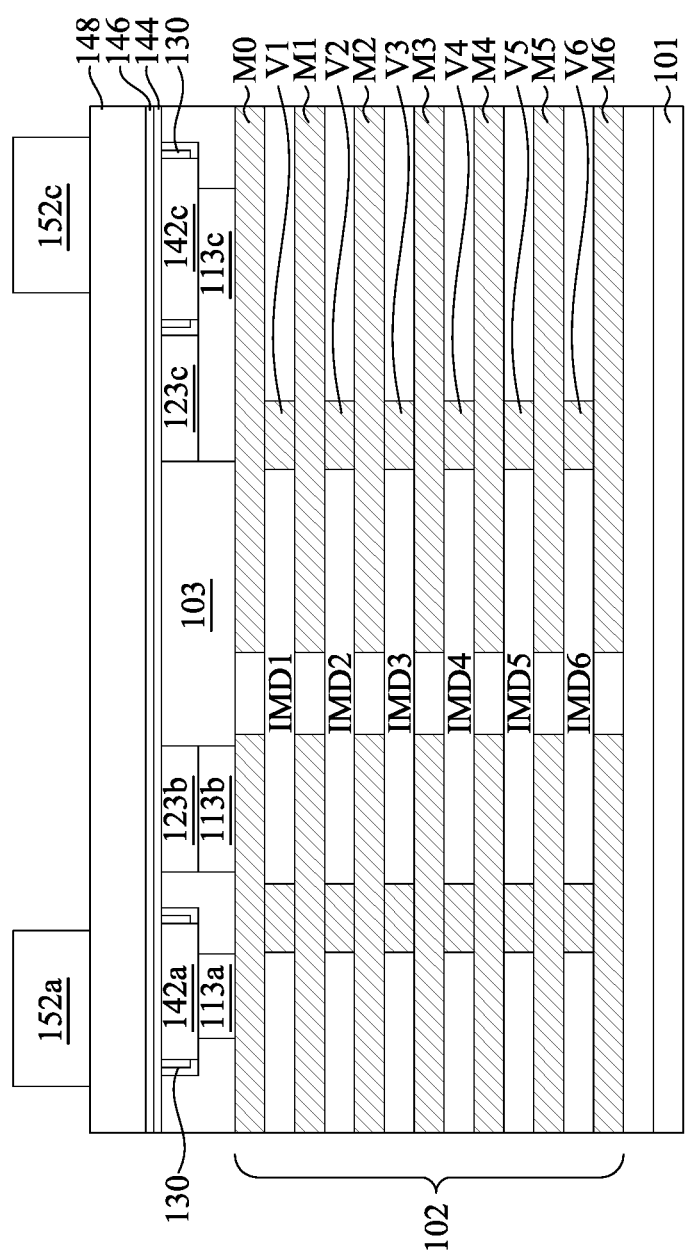

Referring back to FIG. 1B, the method M1 then proceeds to block S117 where at least one dummy gate structure is formed to extend across the semiconductor fin. With reference to FIGS. 18A-18C, in some embodiments of block S117, dummy gate structures 152a and 152c are formed to extend across the semiconductor fin 148. This is described in greater detail with reference to FIGS. 18A-18C, a gate dielectric layer is blanket formed over the substrate 101 to cover the semiconductor fin 148 and the isolation dielectric 104, and a dummy gate electrode layer is formed over the gate dielectric layer.

In some embodiments, the gate dielectric layer is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer may be an oxide layer. The gate dielectric layer may be formed by a deposition processes, such as chemical vapor deposition (CVD), physical vapor deposition (PVD), atomic layer deposition (ALD), plasma enhanced CVD (PECVD) or other suitable techniques. In some embodiments, the dummy gate electrode layer may include polycrystalline-silicon (poly-Si), poly-crystalline silicon-germanium (poly-SiGe), metallic nitrides, metallic silicides, metallic oxides, or metals. In some embodiments, the dummy gate electrode layer may include a metal-containing material such as TiN, TaN, TaC, Co, Ru, Al, combinations thereof, or multi-layers thereof. The dummy gate electrode layer may be deposited by CVD, physical vapor deposition (PVD), sputter deposition, or other techniques suitable for depositing conductive materials.

Subsequently, a patterned mask layer (not shown) is formed over the dummy gate electrode layer and then patterned to form separated mask portions. The patterned mask layer may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). One or more etching processes are performed to form dummy gate structures 152a and 152c wrapping around the semiconductor fin 148 as shown in FIG. 18C using the patterned mask as an etching mask, and the patterned mask layer is removed after the etching. When viewed in a top view as shown in FIG. 18A, each dummy gate structures 152a and 152c includes the gate dielectric layer and the dummy gate electrode layer over the gate dielectric layer. As shown in FIG. 18A, the dummy gate structures 152a and 152c have substantially parallel longitudinal axes that are substantially perpendicular to a longitudinal axis of the semiconductor fin 148. The dummy gate structures 152a and 152c will be replaced with a replacement gate structure using a "gate-last" or replacement-gate process.

Figure 19:
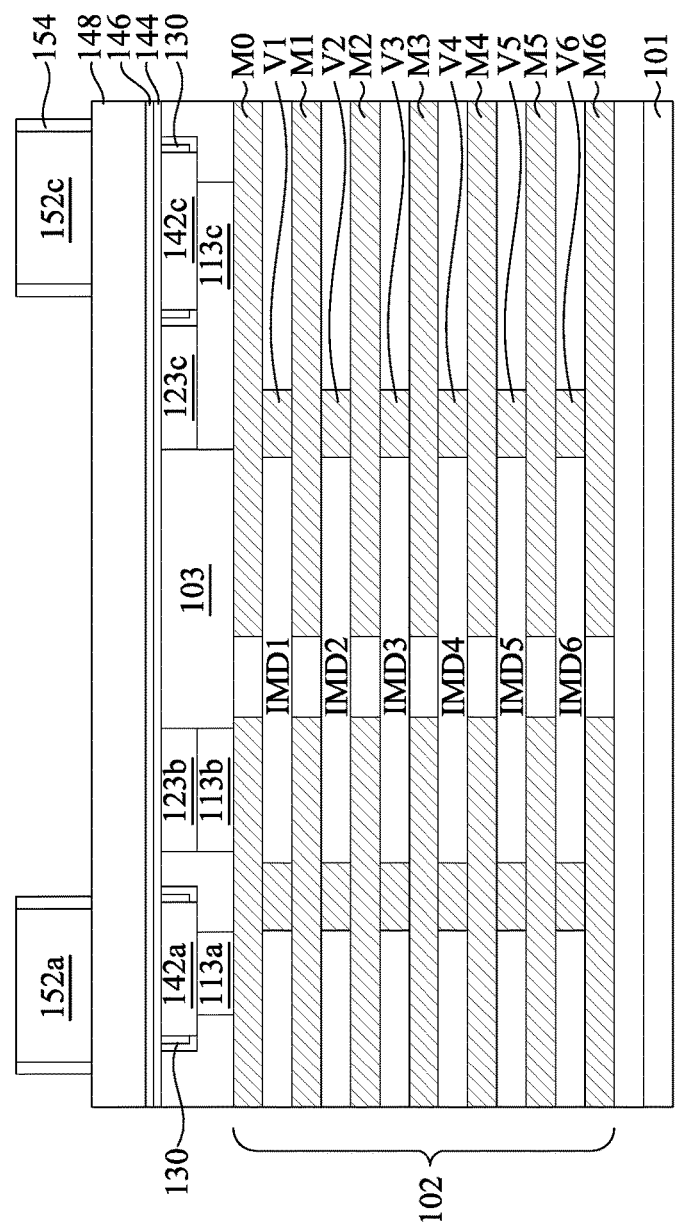

Referring back to FIG. 1B, the method M1 then proceeds to block S118 where second gate spacers are formed along sidewalls of the dummy gate structure. With reference to FIG. 19, in some embodiments of block S118, gate spacers 154 are formed along sidewalls of the dummy gate structures 152a and 152c. In some embodiments, the gate spacers 154 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The gate spacers 154 may include a single layer or multilayer structure made of different dielectric materials. The method of forming the gate spacers 154 includes blanket forming a dielectric layer on the structure shown in FIGS. 18A-18C using, for example, CVD, ALD, or PEALD and then performing an etching process such as anisotropic etching to remove horizontal portions of the dielectric layer. The remaining portions of the dielectric layer on sidewalls of the dummy gate structures 152a and 152c can serve as the gate spacers 154. In some embodiments, the gate spacers 154 may be used to offset subsequently formed doped regions, such as source/drain regions. The gate spacers 154 may further be used for designing or modifying the source/drain region profile.

Figure 20:
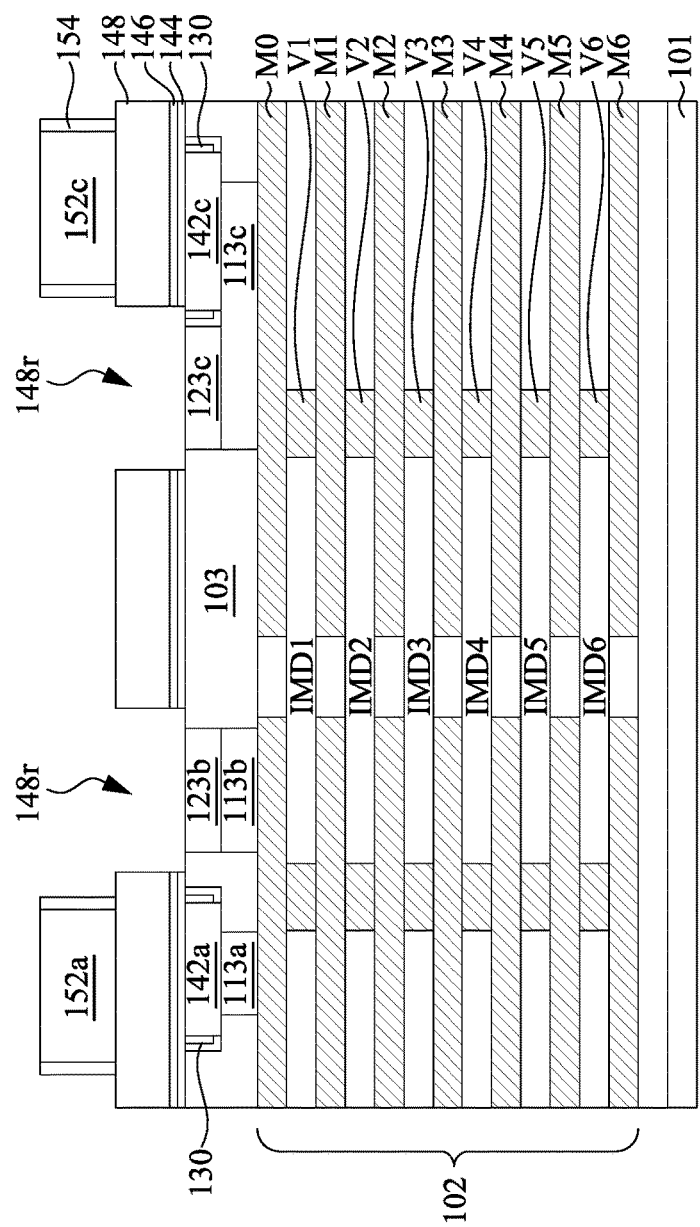

Referring back to FIG. 1B, the method M1 then proceeds to block S119 where source/drain openings are formed into the semiconductor fin. With reference to FIG. 20, in some embodiments of block S119, portions of the semiconductor fin 148 not covered by the dummy gate structures 152a and 152c and the gate spacers 154 are removed to form source/drain openings 148r to expose the source/drain contacts 123b and 123c. In some embodiments, the source/drain openings 148r are formed by using a photolithography and the etching process. The etching process may include a dry etching process, a wet etching process, or combination dry and wet etching processes. By way of example but not limiting the present disclosure, this etching process may include reactive ion etch (RIE) using the dummy gate structures 152a and 152c and gate spacers 154 as masks, or by any other suitable removal process. After the etching process, a pre-cleaning process may be performed to clean the source/drain openings 148r with hydrofluoric acid (HF) or other suitable solution in some embodiments.

Figure 21:
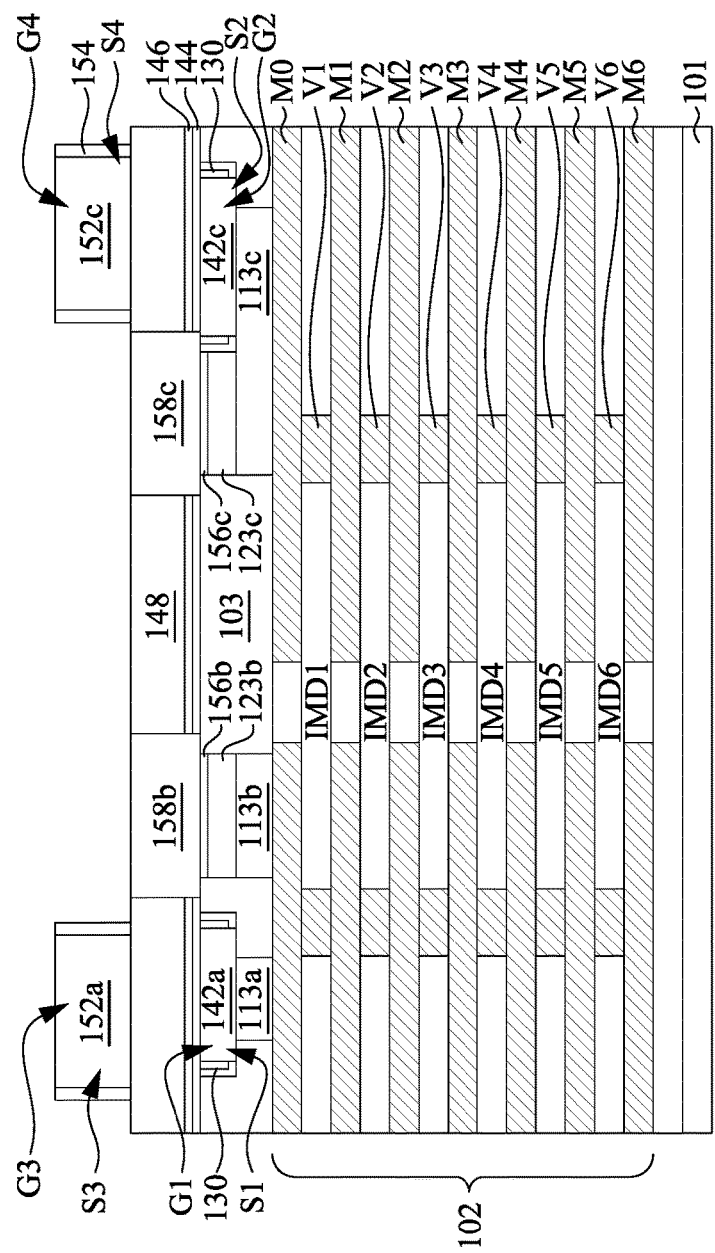
Figure 38:
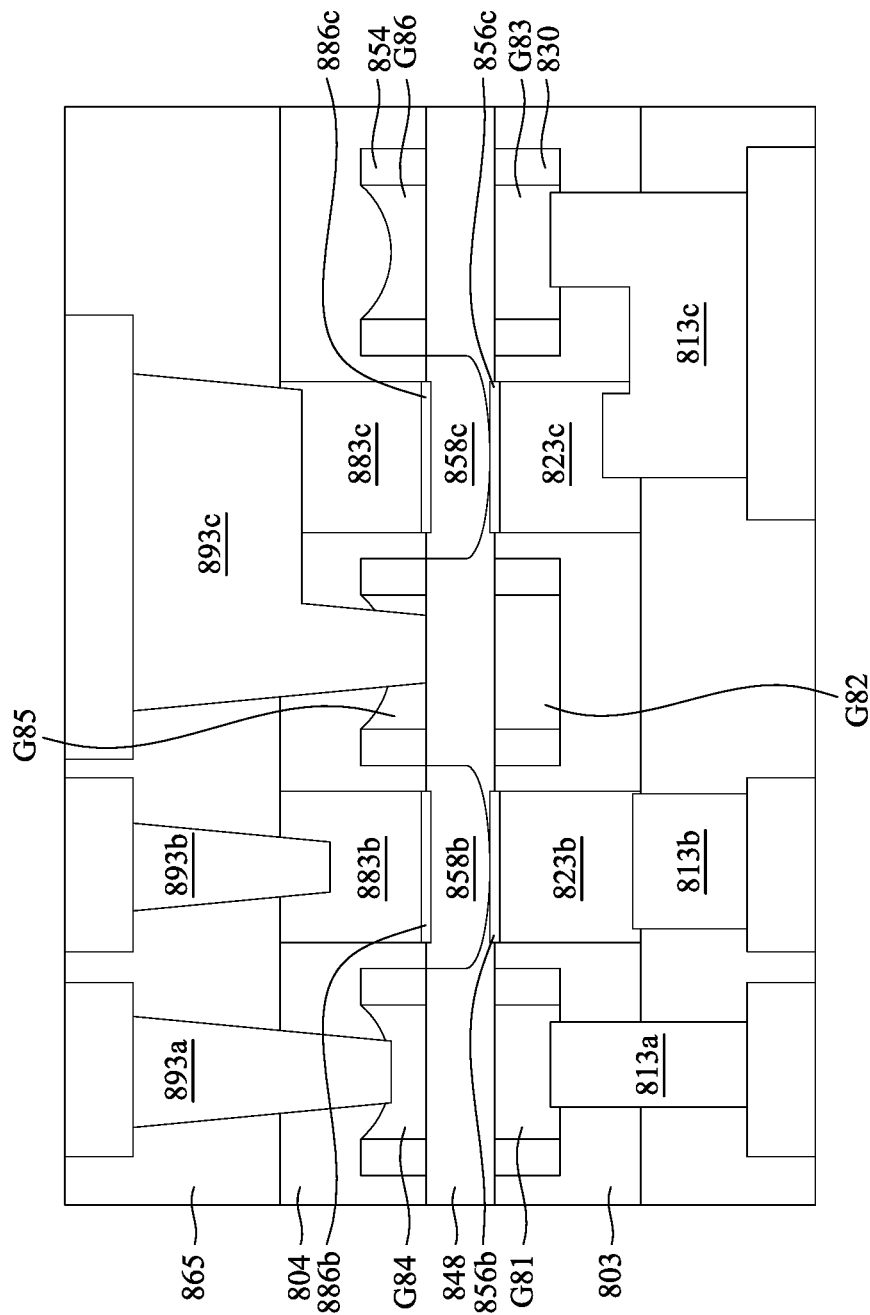
FIGS. 38 and 39 illustrate cross-sectional views in fabricating an integrated circuit structures in accordance with some embodiments of the present disclosure.

Referring back to FIG. 1C, the method M1 then proceeds to block S120 where epitaxial source/drain structures are formed in the source/drain openings. With reference to FIG. 21, in some embodiments of block S120, the epitaxial source/drain structures 158b and 158c are respectively formed in the source/drain openings 148r. Therefore, the gate structure G1 and source/drain structures on opposite sides of the gate structure G1 (as shown in FIG. 38, epitaxial source/drain structures 858b and 858c on opposite sides of a gate structure G82/G85) collectively form a first transistor S1, the gate structure G2 and source/drain structures on opposite sides of the gate structure G2 collectively form a second transistor S2, the gate structure 152a and source/drain structures on opposite sides of the gate structure 152a collectively form a third transistor S3, and the gate structure 152c and source/drain structures on opposite sides of the gate structure 152c form a fourth transistor S4. This is described in greater detail with reference to FIGS. 38-39, the first and third transistors S1 and S3 share a first channel region of the semiconductor fin 148 and the epitaxial source/drain structures 158b, and the second and fourth transistors S2 and S4 share a second channel region of the semiconductor fin 148 and the epitaxial source/drain structures 158c.

Although in the illustrated embodiments as shown in FIGS. 18A-27, the epitaxial source/drain structures 158b and 158c are formed after the dummy gate formation, in other some embodiments, the epitaxial source/drain structures 158b and 158c may be formed in the semiconductor fin 148 before the dummy gate formation.

The epitaxial source/drain structures 158b and 158c may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fin 148. In some embodiments, lattice constants of the epitaxial source/drain structures 158b and 158c are different from that of the semiconductor fin 148, so that the channel region adjacent to the epitaxial source/drain structures 158b and 158c can be strained or stressed by the epitaxial source/drain structures 158b and 158c to improve carrier mobility of the semiconductor device and enhance the device performance.

The epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 148 (e.g., silicon, silicon germanium, silicon phosphate, or the like). The epitaxial source/drain structures 158b and 158c may be in-situ doped. The doping species include p-type dopants, such as boron or $BF_2$; n-type dopants, such as phosphorus or arsenic; and/or other suitable dopants including combinations thereof. If the epitaxial source/drain structures 158a and 158c are not in-situ doped, an implantation process is performed to dope the epitaxial source/drain structures 158b and 158c. One or more annealing processes may be performed to activate the epitaxial source/drain structures 158b and 158c. The annealing processes include rapid thermal annealing (RTA) and/or laser annealing processes.

After forming the epitaxial source/drain structures 158b and 158c on the source/drain contacts 123b and 123c, one or more annealing steps are performed to induce a reaction between semiconductor materials of the epitaxial source/drain structures 158b and 158c and metal materials of the source/drain contacts 123b and 123c, thus forming silicide layers 156b and 156c between the epitaxial source/drain structures 158b and 158c and the source/drain contacts 123b and 123c. The silicidation process is to make a reaction between metal and silicon (or polycrystalline silicon). A first rapid thermal annealing (RTA) process may be performed in, for example, Ar, He, N2 or other inert atmosphere at a first temperature, such as lower than about 200~300° C., to convert the metal material of the source/drain contacts 123b and 123c into metal silicide. A subsequent second annealing or RTA step at a second temperature higher than the first temperature, such as about 400~500° C., thereby forming stable silicide layers 156b and 156c with low resistance. In some embodiments, the silicide layers 156b and 156c may include titanium silicide (TiSi), nickel silicide (NiSi), cobalt silicide (CoSi), Ni—Pt, or combinations thereof.

Figure 22:
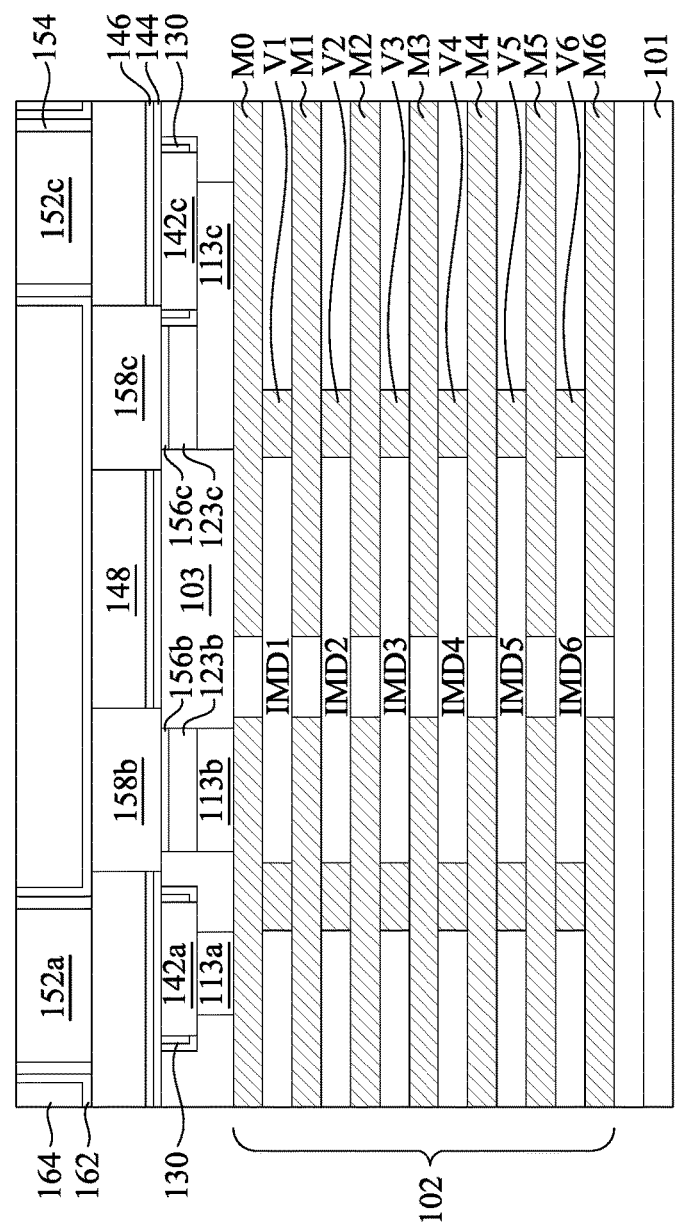

Referring back to FIG. 1C, the method M1 then proceeds to block S121 where a contact etch stop layer (CESL) and a second dielectric layer are formed over the epitaxial source/drain structure. With reference to FIG. 22, in some embodiments of block S121, a contact etch stop layer (CESL) 162 is formed over the epitaxial source/drain structures 158b and 158c, the dummy gate structures 152a and 152c and the gate spacers 154, and a dielectric layer 164 is formed over the CESL 162, followed by performing a CMP process to remove excessive material of the dielectric layer 164 and the CESL 162 to expose the dummy gate structures 152a and 152c and the gate spacers 154. The CMP process may planarize a top surface of the dielectric layer 164 with top surfaces of the dummy gate structures 152a and 152c and the gate spacers 154. In some embodiments, the dielectric layer 164 includes silicon oxide, silicon nitride, silicon oxynitride, tetraethoxysilane (TEOS) oxide, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The dielectric layer 164 may be formed using, for example, CVD, ALD, spin-on-glass (SOG) or other suitable techniques. In some embodiments, the CESL 162 may include silicon nitride, silicon oxynitride or other suitable materials. The CESL 162 can be formed using, for example, plasma enhanced CVD, low pressure CVD, ALD or other suitable techniques.

Figure 23:
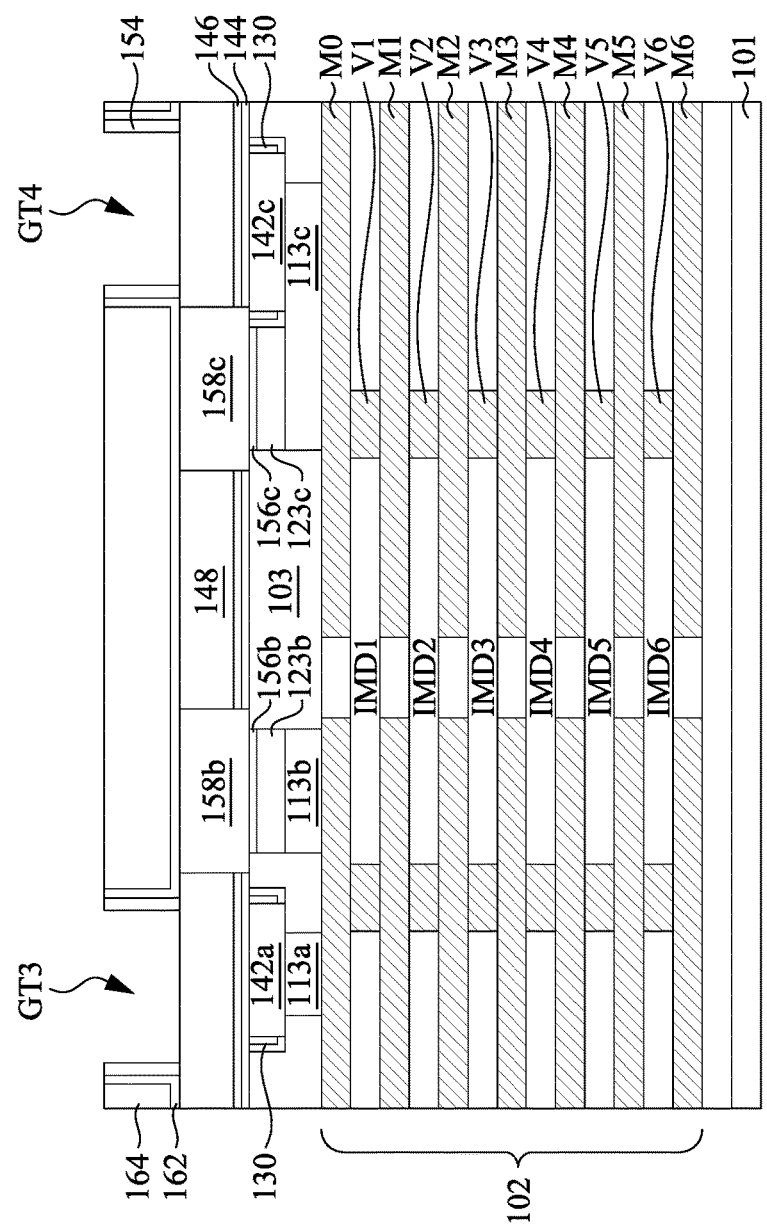

Referring back to FIG. 1C, the method M1 then proceeds to block S122 where the dummy gate structure is removed to form a second gate trench between the second gate spacers. With reference to FIG. 23, in some embodiments of block S122, the dummy gate structures 152a and 152c (as shown in FIG. 22) are removed to form gate trenches GT3 and GT4 with the gate spacers 154 as their sidewalls. In other words, the gate trenches GT3 and GT4 each is formed between the gate spacers 154. Widths of the gate trenches GT3 and GT4 are associated with the corresponding dummy gate structures 152a and 152c as shown in FIG. 22. In some embodiments, the dummy gate structures 152a and 152c are removed by performing a first etching process and performing a second etching process after the first etching process. In some embodiments, the dummy gate electrode layers of the dummy gate structures 152a and 152c are mainly removed by the first etching process, and the gate dielectric layers of the dummy gate structures 152a and 152c are mainly removed by the second etching process that employs a different etchant than that used in the first etching process. In some embodiments, the dummy gate electrode layers of the dummy gate structures 152a and 152c are removed, while the gate dielectric layers of the dummy gate structures 152a and 152c remain in the gate trenches GT3 and GT4.

Figure 24:
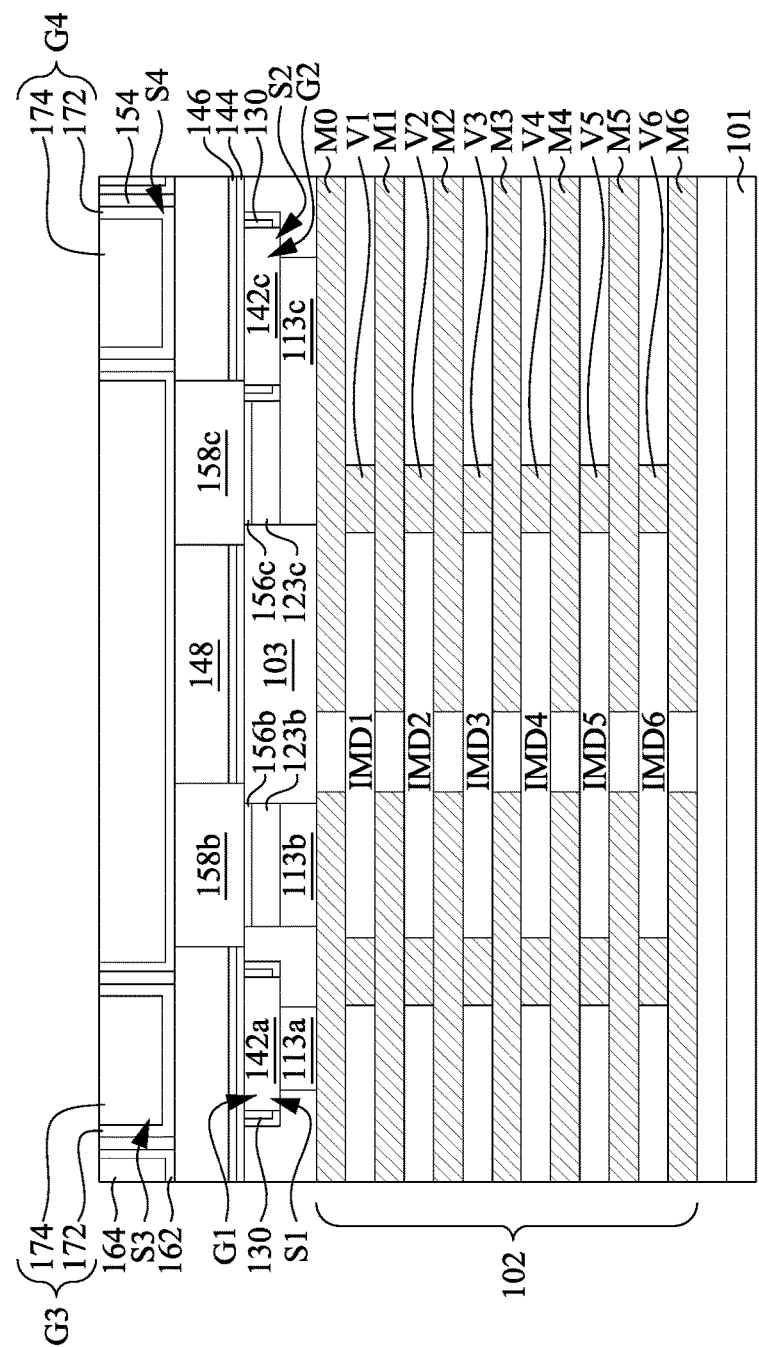

Referring back to FIG. 1C, the method M1 then proceeds to block S123 where an upper gate structure for an upper transistor is formed in the second gate trench. With reference to FIG. 24, in some embodiments of block S123, replacement gate structures G3 and G4 are respectively formed in the gate trenches GT3 and GT4 (as shown in FIG. 23). In FIG. 24, the gate structure G3 of the third transistor S3 overlaps with the gate structure G1 of the first transistor S1, and the gate structure G4 of the fourth transistor S4 overlaps with the gate structure G2 of the second transistor S2. An exemplary method of forming these replacement gate structures may include blanket forming a gate dielectric layer 172 over the substrate 101, forming one or more work function metal layers over the blanket gate dielectric layer, forming a fill metal layer over the one or more work function metal layers, and performing a CMP process to remove excessive materials of the fill metal layer, the one or more work function metal layers and the gate dielectric layer 172 outside the gate trenches GT3 and GT4. As a result of this method, the replacement gate structures G3 and G4 each include the gate dielectric layer 172 and a metal gate electrode 174 wrapped around by the gate dielectric layer 172.

In some embodiments, the gate dielectric layer 172 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 172 may include hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide (Ta$_2$O$_5$), yttrium oxide (Y$_2$O$_3$), strontium titanium oxide (SrTiO$_3$, STO), barium titanium oxide (BaTiO$_3$, BTO), barium zirconium oxide (BaZrO), hafnium lanthanum oxide (HfLaO), lanthanum silicon oxide (LaSiO), aluminum silicon oxide (AlSiO), aluminum oxide (Al$_2$O$_3$), silicon nitride (Si$_3$N$_4$), silicon oxynitrides (SiON), and combinations thereof. In alternative embodiments, the gate dielectric layer 172 may have a multilayer structure such as one layer of silicon oxide (e.g., interfacial layer) and another layer of high-k material. In some embodiments, the gate dielectric layer 172 is made of the same material because they are formed from the same dielectric layer blanket deposited over the substrate 101.

The metal gate electrode 174 may include suitable work function metals to provide suitable work functions. In some embodiments, the metal gate electrode 174 may include one or more n-type work function metals (N-metal) for forming an n-type transistor on the substrate 101. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the metal gate electrode 260 may include one or more p-type work function metals (P-metal) for forming a p-type transistor on the substrate 101. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the metal gate electrodes 174 are made of different work function metals so as to achieve suitable work functions in some embodiments. In some embodiments, an entirety of the metal gate electrode 174 is a work function metal.

Figure 25:
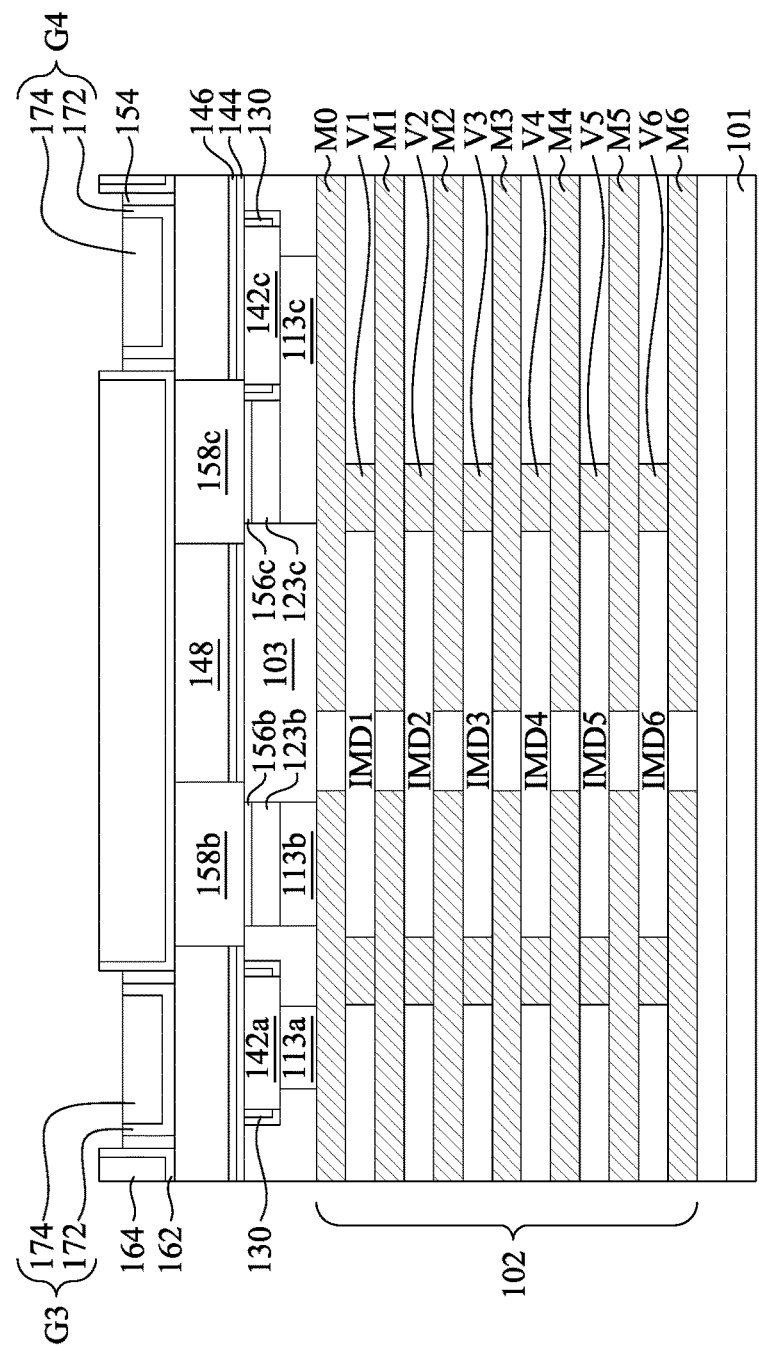

Referring back to FIG. 1C, the method M1 then proceeds to block S124 where a metal gate etch back (MGEB) process is performed on the upper gate structure to thin down the upper gate structure. With reference to FIG. 25, in some embodiments of block S124, the MGEB process can be a plasma etching process and drive plasmas to scale down the gate structures G3 and G4. In some embodiments, the MGEB process uses a gas mixture of $Cl_2$, $O_2$, $BCl_3$, and Ar with a bias in a range from about 25V to about 1200V.

Figure 26:
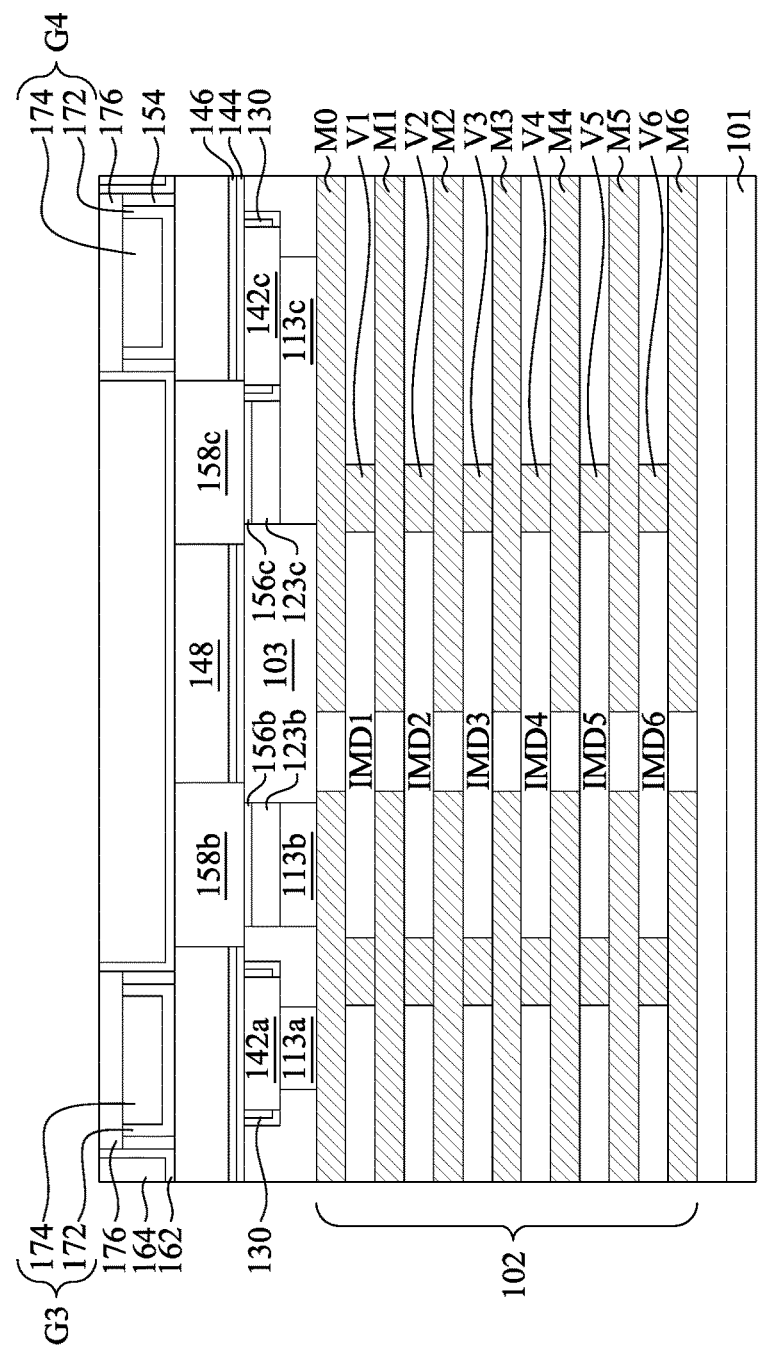

Referring back to FIG. 1B, the method M1 then proceeds to block S125 where dielectric cap are formed over the gate structure. With reference to FIG. 26, in some embodiments of block S125, dielectric caps 176 are formed over the gate structures G3 and G4 using, for example, a deposition process to deposit a dielectric material over the substrate 101, followed by a CMP process to remove excess dielectric material outside the gate trenches GT3 and GT4. In some embodiments, the dielectric caps 176 may include silicon nitride or other suitable dielectric material. In some embodiments, the dielectric caps 176 have different etch selectivity than the gate spacers 154, the CESL 162, and/or the dielectric layer 164. By way of example, if the dielectric cap 176 is SiN, the gate spacers 154, the CESL 162, and/or the dielectric layer 164 are dielectric materials different from SiN. In some embodiments, the dielectric caps 176 can be used to define self-aligned contact region and thus referred to as SAC structures or a SAC layer.

Figure 27:
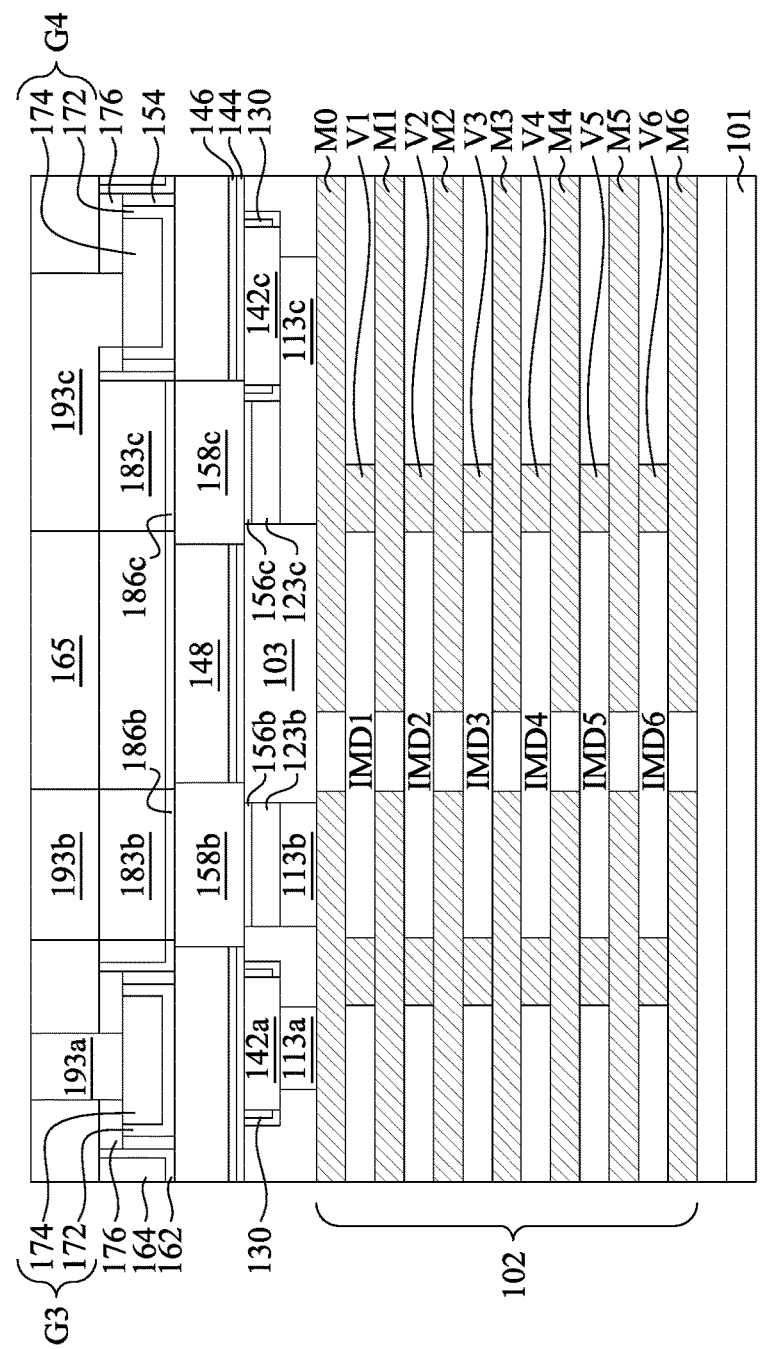

Referring back to FIG. 1C, the method M1 then proceeds to block S126 where an upper source/drain contact is formed on the epitaxial source/drain structure, an upper gate via and an upper source/drain via are formed on the upper gate structure and an upper source/drain contact, and/or an upper butted contact is formed on the upper source/drain contact and the upper gate structure for the upper transistor. With reference to FIG. 27, in some embodiments of block S126, source/drain contacts 183b and 183c are formed through the dielectric layer 164 and the CESL 162 to land on the epitaxial source/drain structures 158b and 158c. An exemplary formation method of the source/drain contacts 183b and 183c may include forming contact holes by one or more etching processes to sequentially etch through the dielectric layer 164 down to the respective epitaxial source/drain structures 158b and 158c, and depositing metal or other suitable conductive materials in the contact holes by a deposition process to form the source/drain contacts 183b and 183c. In some embodiments, the source/drain contacts 183b and 183c may include tungsten (W), aluminum (Al), copper (Cu), Cobalt (Co), another suitable conductive material, or combinations thereof.

In some embodiments, before the source/drain contact deposition process, silicide layers 186b and 186c are formed on the epitaxial source/drain structures 158b and 158c by a silicidation process. Subsequently, the source/drain contacts 183b and 183c are respectively formed on the silicide layers 186b and 186c. For example, the silicidation process is to make a reaction between metal and silicon (or polycrystalline silicon). A first rapid thermal annealing (RTA) process may be performed in, for example, Ar, He, N2 or other inert atmosphere at a third temperature, such as lower than 200~300° C., to convert the metal material into metal silicide. A subsequent second annealing or RTA step at a fourth temperature higher than the third temperature, such as 400~500° C., thereby forming stable silicide layers 186b and 186c with low resistance. In some embodiments, the silicide layers 186b and 186c may include titanium silicide (TiSi), nickel silicide (NiSi), cobalt silicide (CoSi), Ni—Pt, or combinations thereof.

An dielectric layer 165 is deposited over the gate structures G3 and G4. Via openings to the gate structure G3 and the source/drain contacts 183b are formed in the dielectric layer 165. A butted contact opening to the gate structure G4 and the source/drain contacts 183c is also formed in the dielectric layer 165. In some embodiments, a photoresist layer (not shown) is formed on the dielectric layer 165 and then patterned to define the position of the butted contact opening and the contact openings. The dielectric layer 165 is then etched according to the patterned photoresist layer to form the butted contact opening and the contact openings.

Subsequently, metal deposition processes may be used to fill conductive contact materials, such as copper, cobalt, titanium, tantalum, tungsten, aluminum, or alloys thereof, in the butted contact opening and contact openings. A planarization process such as a chemical mechanical polishing (CMP) process may be applied on the semiconductor substrate to remove the excess metal formation on the dielectric layer 165, remaining portions of the metal formation can serve as a butted contact 193c, a source/drain via 193b, and a gate via 193a. A first portion of the butted contact 193c lands on the replacement gate electrode G4 and a second portion of the butted contact 193c lands on the source/drain contacts 183c.

Referring back to FIG. 1C, the method M1 then proceeds to block S127 where an upper interconnect structure is formed over the upper gate via, the upper source/drain via, and/or the upper butted contact. With reference to FIG. 28, in some embodiments of block S127, an interconnect structure 196 is formed after transistor formation. The interconnect structure 196 includes, for example, seven metallization layers, labeled as M0 through M6, with six layers of metallization vias or interconnects, labeled as V1 through V6. Other embodiments may contain more or fewer metallization layers and corresponding more or fewer number of vias. The metal line illustrated here just for an example, and the metal line may be otherwise oriented (rotated 90 degrees or at other orientations). The integrated circuit structure 100 includes a full metallization stack, including a portion of each of metallization layers M0-M6 connected by interconnects V1-V6, with M0 connecting the stack to the source/drain contact of the transistor. Also included in integrated circuit is a plurality of IMD layers. Six IMD layers, identified as IMD1 through IMD6 are depicted in FIG. 28. The IMD layers may provide electrical insulation as well as structural support for the various features of the integrated circuit.

Figure 29A:
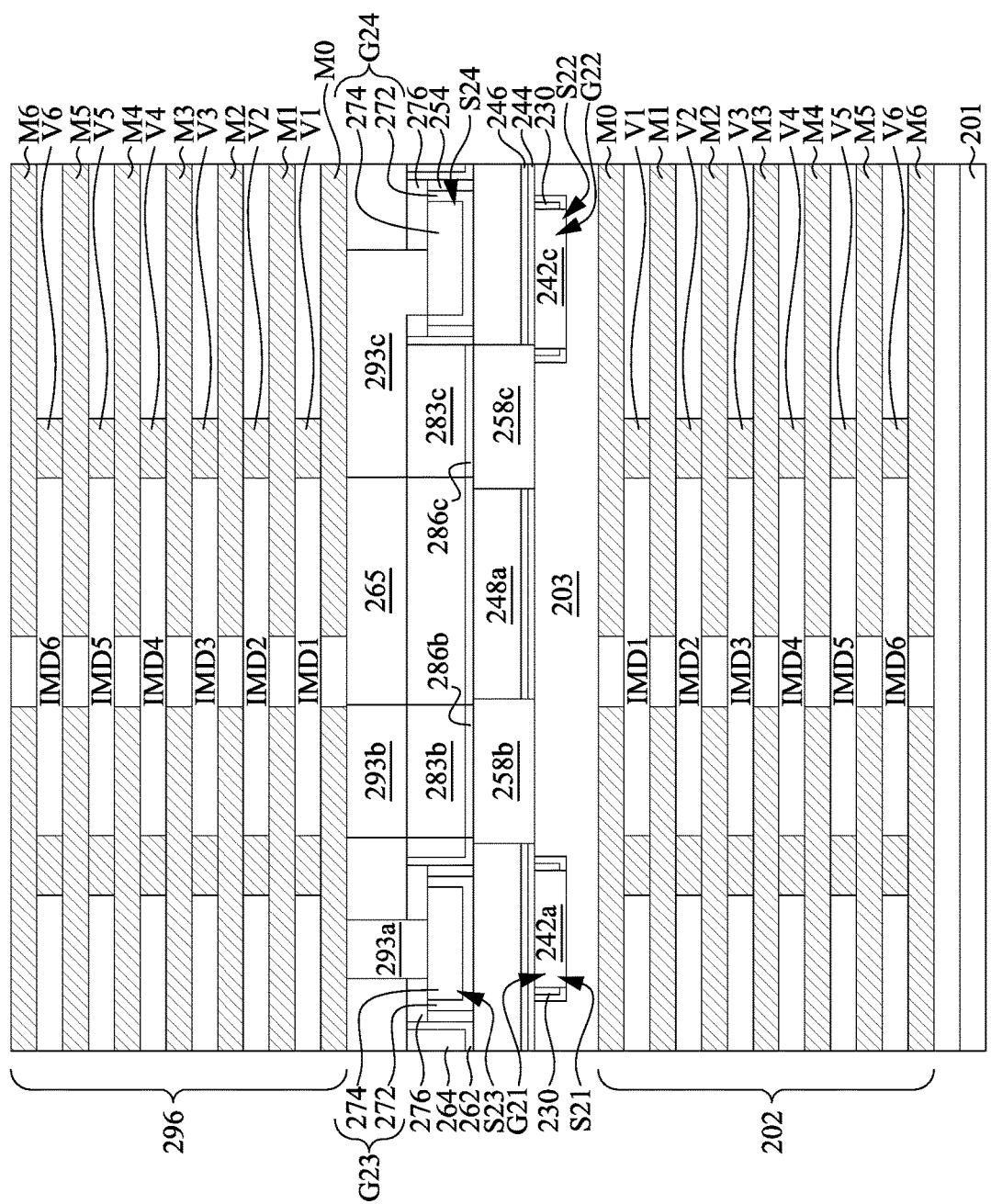
FIGS. 29A and 29B illustrate cross-sectional views of an integrated circuit structure along line B-B' and line D-D' as shown in FIG. 18A according to some other embodiments.
Figure 29B:
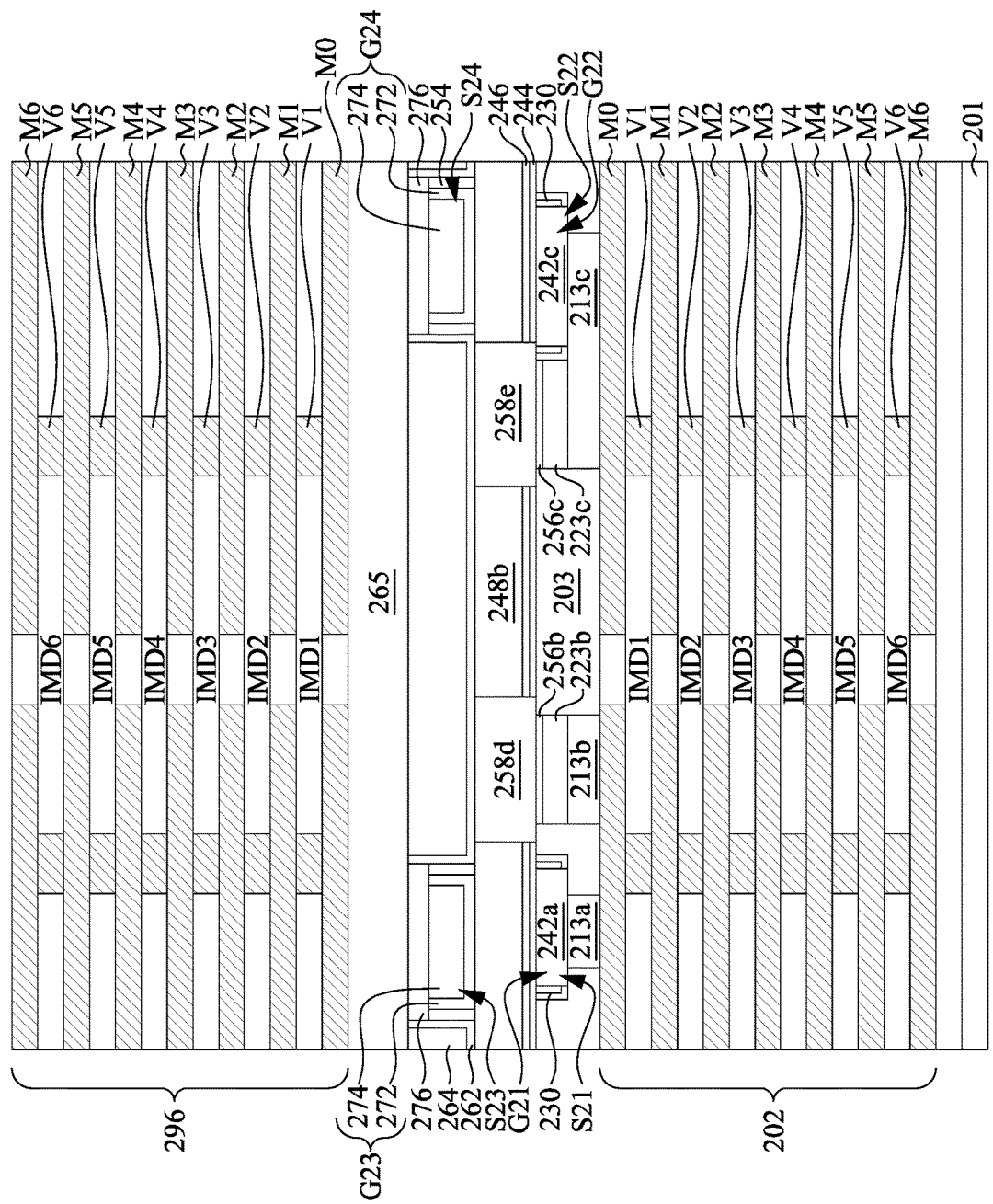

FIGS. 29A and 29B illustrate cross-sectional views of an integrated circuit structure 200 along line B-B' and line D-D' as shown in FIG. 18A according to some other embodiments. Operations for forming the integrated circuit structure 200 of the present embodiment are substantially the same as the operations for forming the integrated circuit structure 100 described in foregoing descriptions associated with FIGS. 2 to 28 and thus are not repeated herein for the sake of clarity. For example, materials and manufacturing processes related to a substrate 201, interconnect structures 202 and 296, first and second semiconductor fins 248a and 248b, gate structures G21, G22, G23, and G24, epitaxial source/drain structures 258b, 258c, 258d, and 258e, transistors S21, S22, S23, and S24, gate vias 213a and 293a, source/drain contacts 223b, 223c, 283b, and 283c, source/drain vias 213b and 293b, butted contacts 213c and 293c, silicide layers 256b, 256c, 286b, and 286c, gate spacers 230 and 254, dielectric layers 203 and 265, and a CESL 262 may be substantially the same as those of the substrate 101, the interconnect structures 102 and 196, the semiconductor fin 148, the gate structures G1, G2, G3, and G4, the epitaxial source/drain structures 158b and 158c, the transistors S1, S2, S3, and S4, the gate vias 113a and 193a, silicide layers 156b, 156c, 186b, and 186c, the source/drain contacts 123b, 123c, 183b, and 183c, the source/drain vias 113b and 193b, the butted contacts 113c and 193c, the gate spacers 130 and 154, the dielectric layers 103 and 165, and the CESL 162 as shown in FIGS. 2 to 28. Therefore, reference may be made to the foregoing paragraphs for the related detailed descriptions, and are not described again herein.

The difference between the present embodiment and the embodiment in FIGS. 2 to 28 is that the upper source/drain via 293b, the upper source/drain contacts 283b and 283c, and the upper butted contact 293c for the upper transistors S23 and S24 are formed on the epitaxial source/drain structures 258b and 258c in the first semiconductor fin 248a as shown in FIG. 29A, and the lower source/drain via 213b, the lower source/drain contacts 223b and 223c, and the lower butted contact 213c for the lower transistors S21 and S22 are formed on the epitaxial source/drain structures 258d and 258e in the second semiconductor fin 248b, rather than the first semiconductor fin 248a as shown in FIG. 29B. In some embodiments, the epitaxial source/drain structure 258b in the first semiconductor fin 248a as shown in FIG. 29A may merge with the epitaxial source/drain structure 258d in the second semiconductor fin 248b as shown in FIG. 29B, and/or the epitaxial source/drain structure 258c in the first semiconductor fin 248a as shown in FIG. 29A may merge with the epitaxial source/drain structure 258e in the second semiconductor fin 248b as shown in FIG. 29B. In some embodiments, the epitaxial source/drain structure 258b in the first semiconductor fin 248a as shown in FIG. 29A is laterally spaced apart from the epitaxial source/drain structure 258d in the second semiconductor fin 248b as shown in FIG. 29B, and/or the epitaxial source/drain structure 258c in the first semiconductor fin 248a as shown in FIG. 29A is laterally spaced apart from the epitaxial source/drain structure 258e in the second semiconductor fin 248b as shown in FIG. 29B.

Figure 30A:
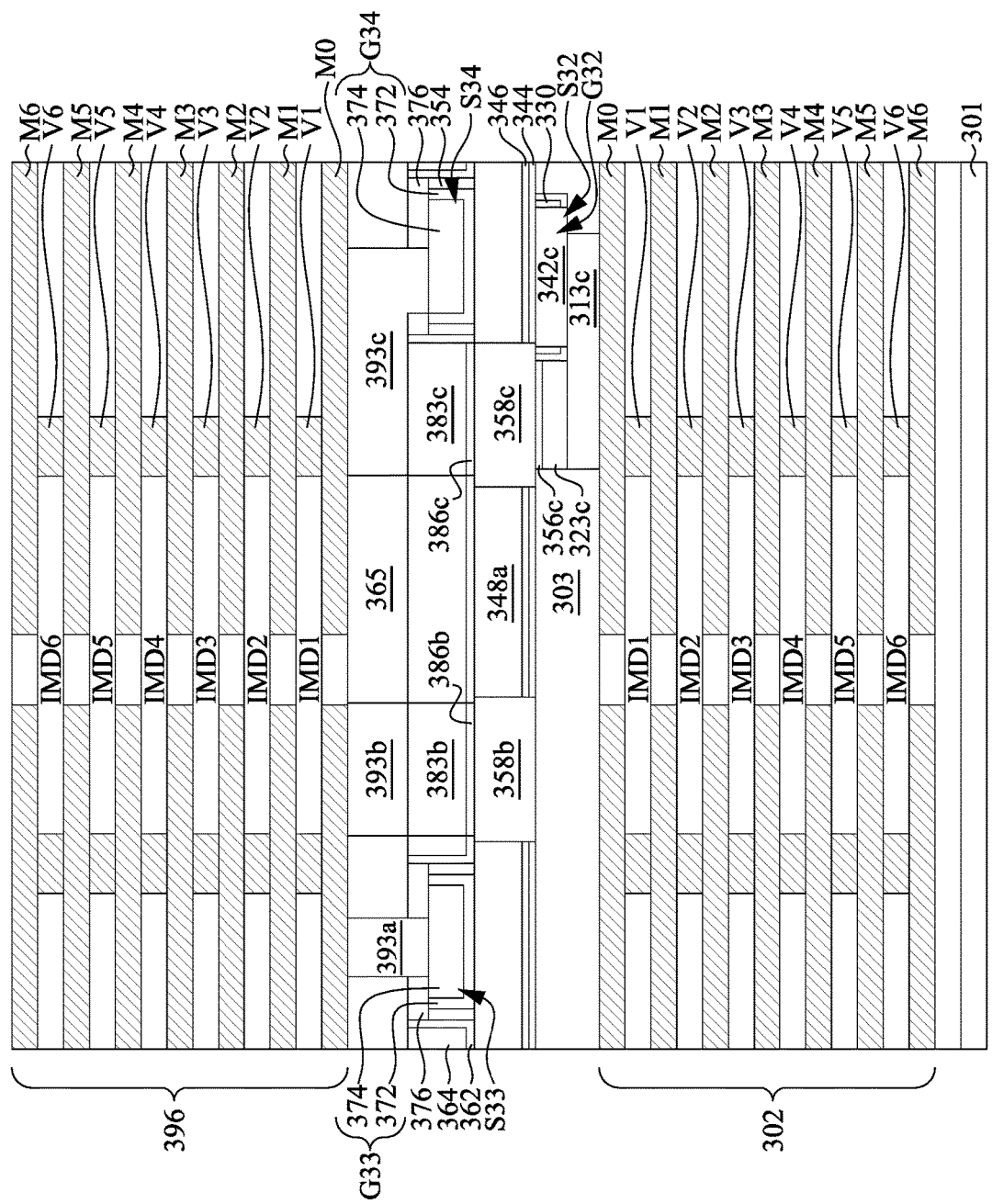
FIGS. 30A and 30B illustrate cross-sectional views of an integrated circuit structure along line B-B' and line D-D' as shown in FIG. 18A according to some other embodiments.
Figure 30B:
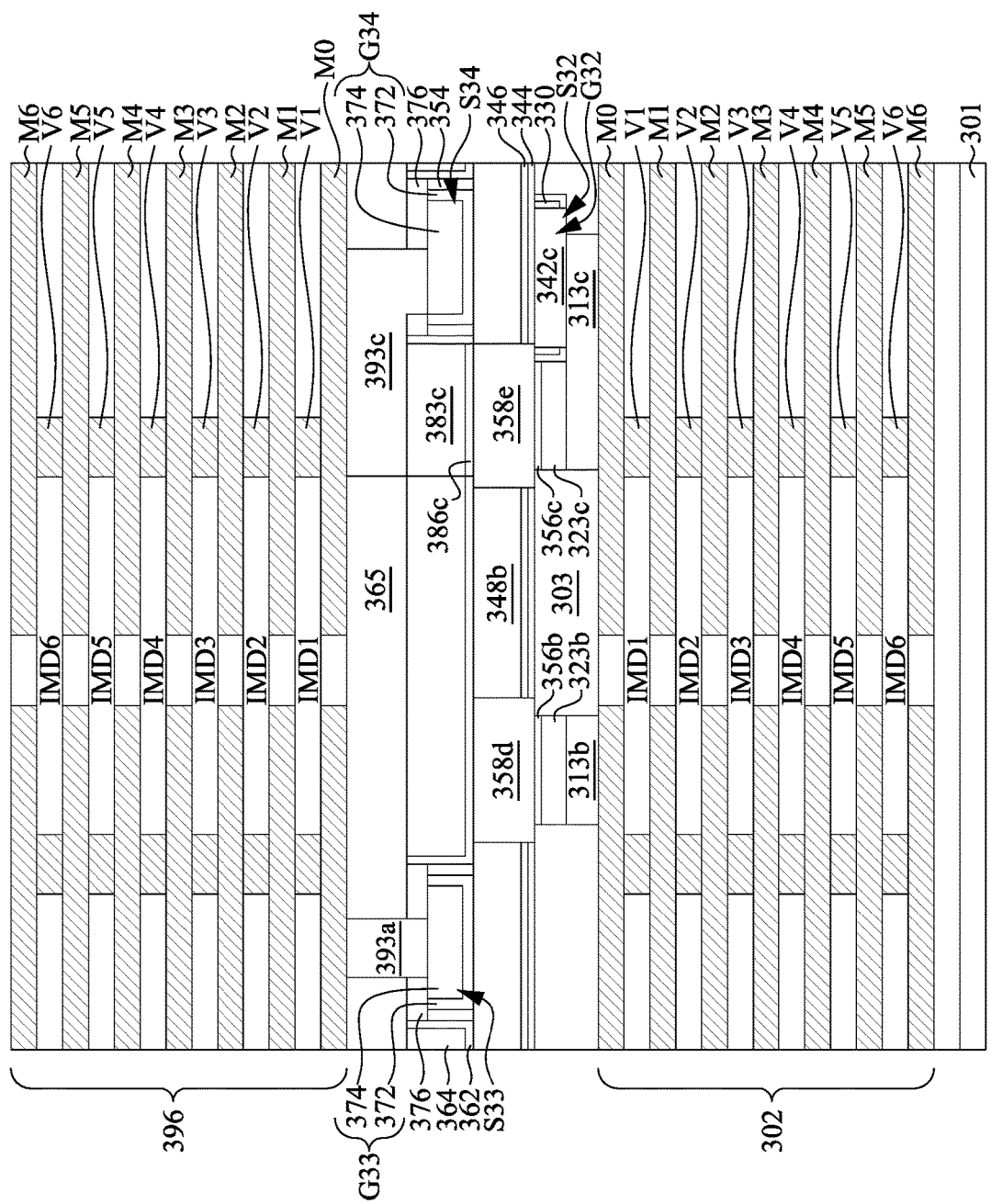

FIGS. 30A and 30B illustrate cross-sectional views of an integrated circuit structure 300 along line B-B' and line D-D' as shown in FIG. 18A according to some other embodiments. Operations for forming the integrated circuit structure 300 of the present embodiment are substantially the same as the operations for forming the integrated circuit structure 100 described in foregoing descriptions associated with FIGS. 2 to 28 and thus are not repeated herein for the sake of clarity. For example, materials and manufacturing processes related to a substrate 301, interconnect structures 302 and 396, first and second semiconductor fins 348a and 348b, gate structures G32, G33, and G34, epitaxial source/drain structures 358b, 358c, 358d, and 358e, a gate via 393a, source/drain contact 323b, 323c, 383b, and 383c, source/drain vias 313b and 393b, butted contacts 313c and 393c, silicide layers 356b, 356c, 386b, and 386c, gate spacers 330 and 354, dielectric layers 303 and 365, and a CESL 362 may be substantially the same as those of the substrate 101, the interconnect structures 102 and 196, the semiconductor fin 148, the gate structures G2, G3, and G4, the epitaxial source/drain structures 158b and 158c, the gate via 193a, silicide layers 156b, 156c, 186b, and 186c, the source/drain contact 123b, 123c, 183b, and 183c, the source/drain vias 113b and 193b, the butted contacts 113c and 193c, the gate spacers 130 and 154, the dielectric layers 103 and 165, and the CESL 162 as shown in FIGS. 2 to 28. Therefore, reference may be made to the foregoing paragraphs for the related detailed descriptions, and are not described again herein.

The difference between the present embodiment and the embodiment in FIGS. 2 to 28 is that the lower gate structure G1 and the lower gate via 113a as shown in FIGS. 2 to 28 are omitted in this embodiment, and thus the upper gate structures G33 may control a channel region in the first semiconductor fin 348a shown FIG. 30A electrically connected the upper interconnect structures 396 and may control a channel region in the second semiconductor fin 348b shown FIG. 30B electrically connected the lower interconnect structures 302 simultaneously.

Moreover, the upper source/drain via 393b and the upper source/drain contact 383b are formed on the epitaxial source/drain structure 358b in the first semiconductor fin 348a as shown in FIG. 30A, and the lower source/drain via 313b and the lower source/drain contact 323b are formed on the epitaxial source/drain structure 358d in the second semiconductor fin 348b, rather than the first semiconductor fin 348a as shown in FIG. 30B. In some embodiments, the epitaxial source/drain structure 358b in the first semiconductor fin 348a as shown in FIG. 30A may merge with the epitaxial source/drain structure 358d in the second semiconductor fin 348b as shown in FIG. 30B, and/or the epitaxial source/drain structure 358c in the first semiconductor fin 348a as shown in FIG. 30A may merge with the epitaxial source/drain structure 358e in the second semiconductor fin 348b as shown in FIG. 30B. In some embodiments, the epitaxial source/drain structure 358b in the first semiconductor fin 348a as shown in FIG. 30A is laterally spaced apart from the epitaxial source/drain structure 358d in the second semiconductor fin 348b as shown in FIG. 30B, and/or the epitaxial source/drain structure 358c in the first semiconductor fin 348a as shown in FIG. 30A is laterally spaced apart from the epitaxial source/drain structure 358e in the second semiconductor fin 348b as shown in FIG. 30B.

Figure 31A:
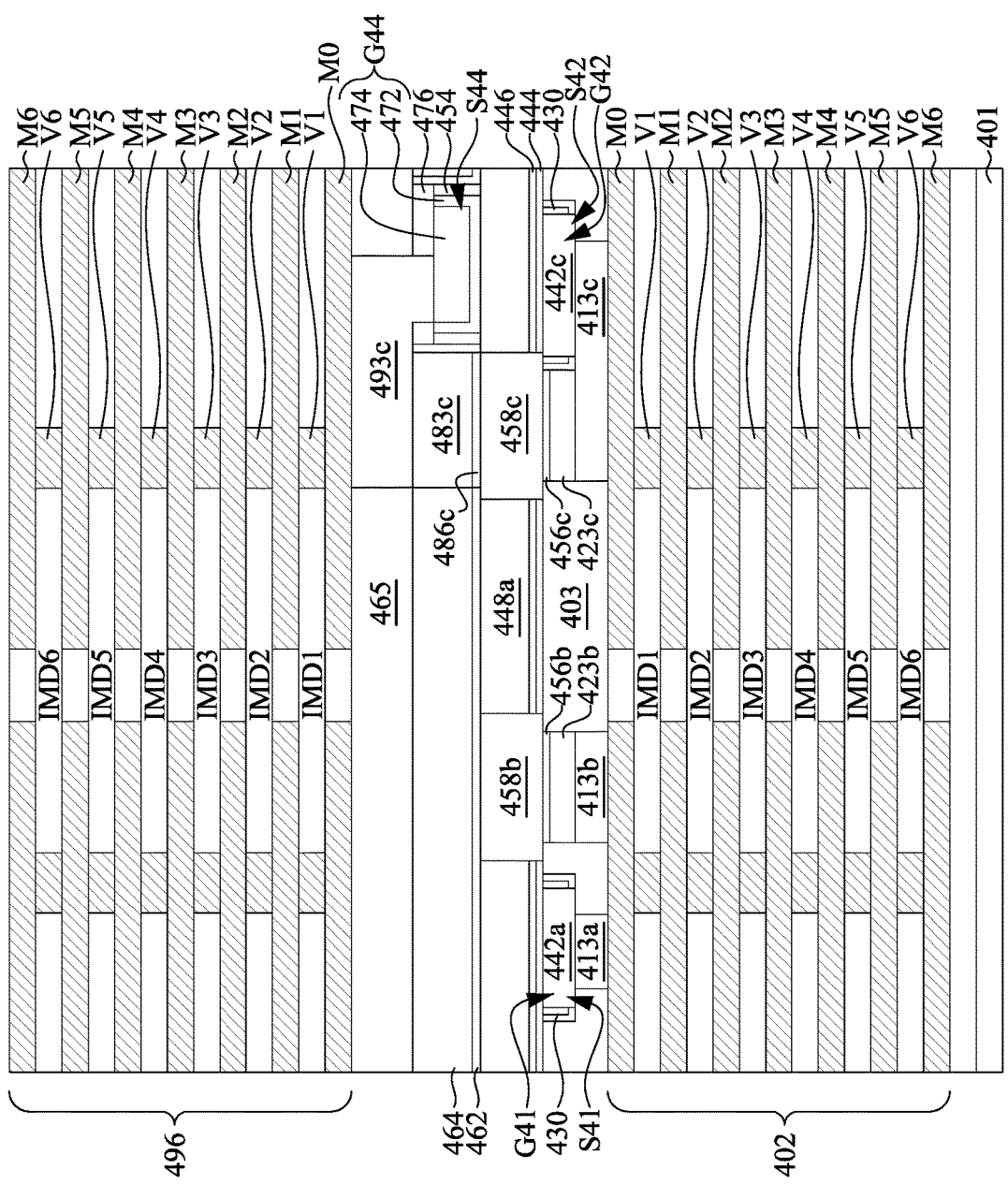
FIGS. 31A and 31B illustrate schematic diagrams of an integrated circuit structure along line B-B' and line D-D' as shown in FIG. 18A according to some other embodiments.
Figure 31B:
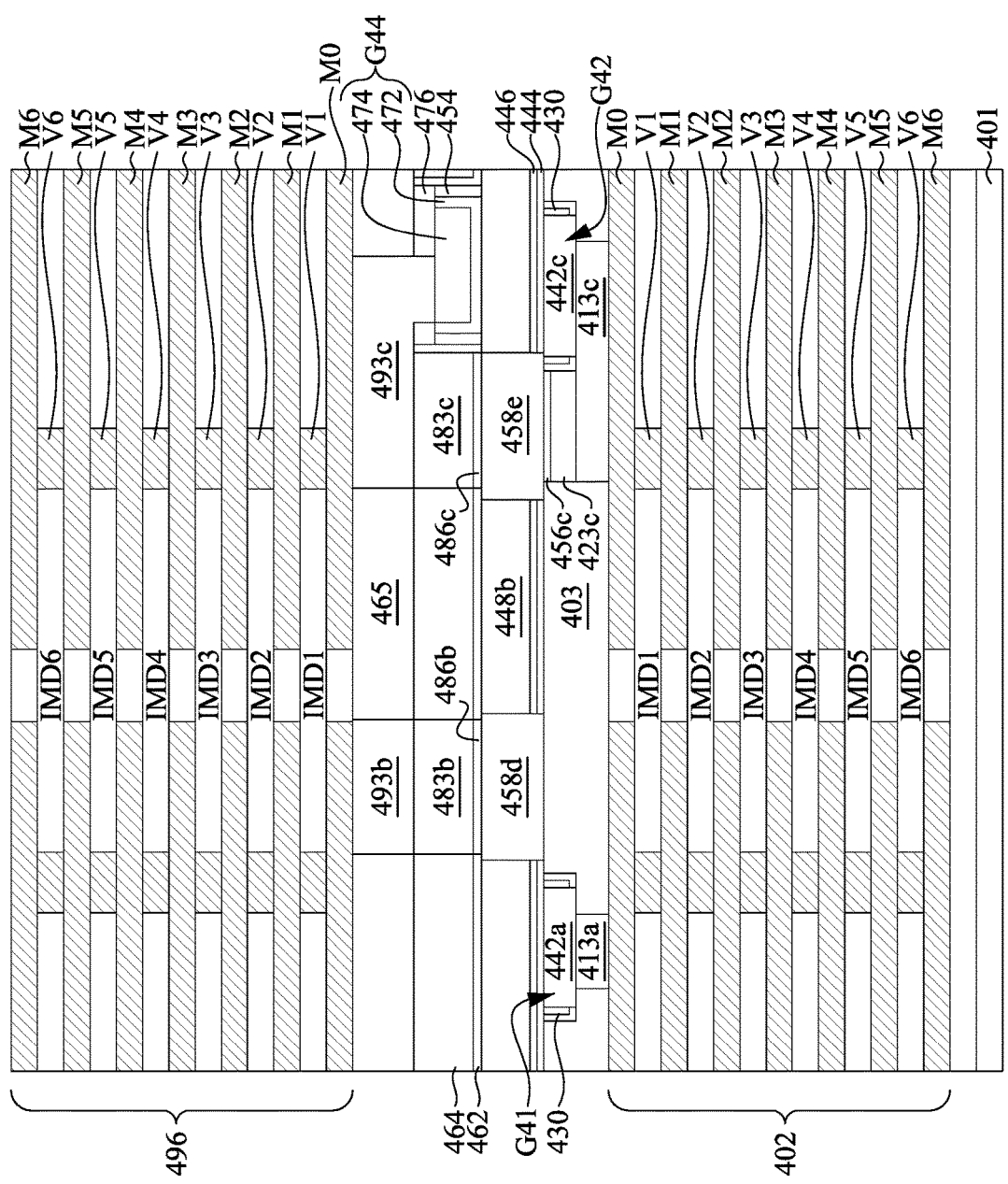

FIGS. 31A and 31B illustrate cross-sectional views of an integrated circuit structure 400 corresponding to FIG. 28 and along line B-B' and line D-D' as shown in FIG. 18A. Operations for forming the integrated circuit structure 400 of the present embodiment are substantially the same as the operations for forming the integrated circuit structure 100 described in foregoing descriptions associated with FIGS. 2 to 28 and thus are not repeated herein for the sake of clarity. For example, materials and manufacturing processes related to a substrate 401, interconnect structures 402 and 496, semiconductor fins 448a and 448b, gate structures G41, G42, and G44, epitaxial source/drain structures 458b, 458c, 458d, and 458e, a gate via 413a, source/drain contact 423b, 423c, 483b, and 483c, source/drain vias 413b and 493b, butted contacts 413c and 493c, silicide layers 456b, 456c, 486b, and 486c, gate spacers 430 and 454, dielectric layers 403 and 465, and a CESL 462 may be substantially the same as those of the substrate 101, the interconnect structures 102 and 196, the semiconductor fin 148, the gate structures G1, G2, and G4, the epitaxial source/drain structures 158b and 158c, the gate via 113a, silicide layers 156b, 156c, 186b, and 186c, the source/drain contact 123b, 123c, 183b, and 183c, the source/drain vias 113b and 193b, the butted contacts 113c and 193c, the gate spacers 130 and 154, the dielectric layers 103 and 165, and the CESL 162 as shown in FIGS. 2 to 28. Therefore, reference may be made to the foregoing paragraphs for the related detailed descriptions, and are not described again herein.

The difference between the present embodiment and the embodiment in FIGS. 2 to 28 is that the upper gate structure G3 and the upper gate via 193a as shown in FIGS. 2 to 28 are omitted in this embodiment, and thus the lower gate structures G41 may control a channel region in the first semiconductor fin 448a shown FIG. 31A electrically connected the lower interconnect structures 402 and may control a channel region in the second semiconductor fin 448b shown FIG. 31B electrically connected the upper interconnect structures 496 simultaneously.

Moreover, the lower source/drain via 413b and the lower source/drain contact 423b are formed on the epitaxial source/drain structure 458b in the first semiconductor fin 448a as shown in FIG. 31A, and the upper source/drain via 493b and the upper source/drain contact 483b are formed on the epitaxial source/drain structure 458d in the second semiconductor fin 448b, rather than the first semiconductor fin 448a as shown in FIG. 31B. In some embodiments, the epitaxial source/drain structure 458b in the first semiconductor fin 448a as shown in FIG. 31A may merge with the epitaxial source/drain structure 458d in the second semiconductor fin 448b as shown in FIG. 31B, and/or the epitaxial source/drain structure 458c in the first semiconductor fin 448a as shown in FIG. 31A may merge with the epitaxial source/drain structure 458e in the second semiconductor fin 448b as shown in FIG. 31B. In some embodiments, the epitaxial source/drain structure 458b in the first semiconductor fin 448a as shown in FIG. 31A is laterally spaced apart from the epitaxial source/drain structure 458d in the second semiconductor fin 448b as shown in FIG. 31B, and/or the epitaxial source/drain structure 458c in the first semiconductor fin 448a as shown in FIG. 31A is laterally spaced apart from the epitaxial source/drain structure 458e in the second semiconductor fin 448b as shown in FIG. 31B.

Figure 32A:
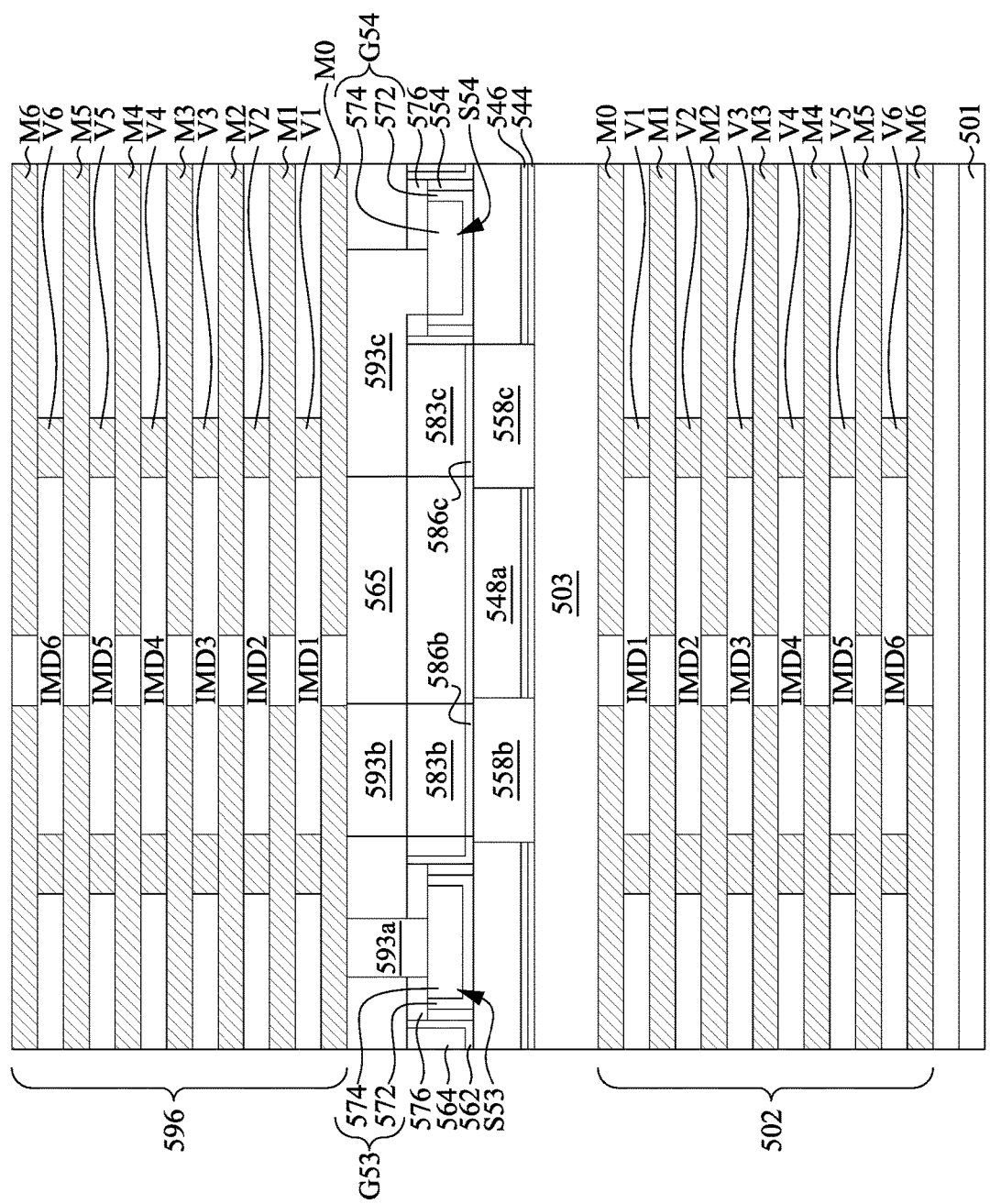
FIGS. 32A and 32B illustrate schematic diagrams of an integrated circuit structure along line B-B' and line D-D' as shown in FIG. 18A according to some other embodiments.
Figure 32B:
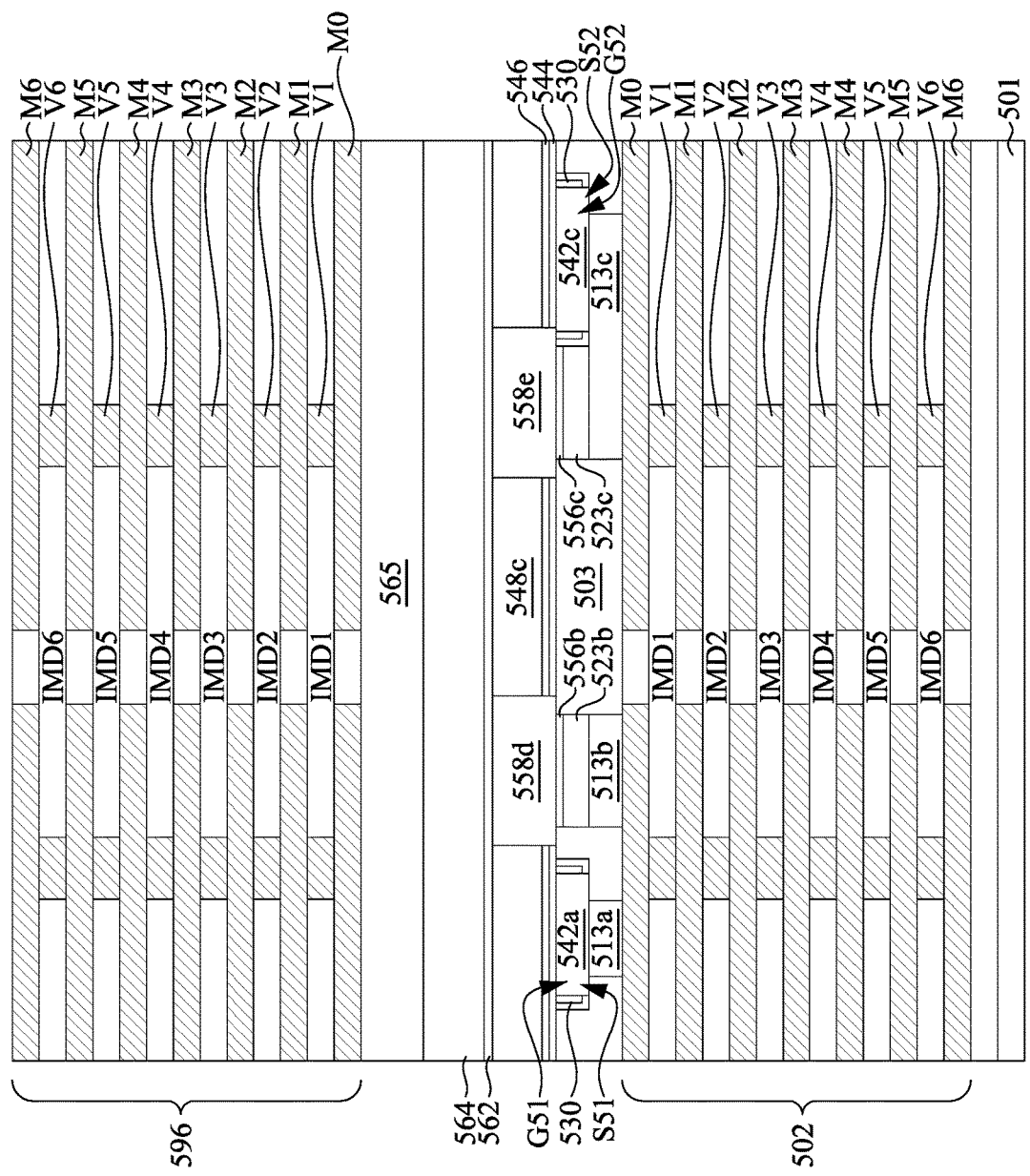

FIGS. 32A and 32B illustrate cross-sectional views of an integrated circuit structure 500 corresponding to FIG. 28 and along line B-B' and line D-D' as shown in FIG. 18A. Operations for forming the integrated circuit structure 500 of the present embodiment are substantially the same as the operations for forming the integrated circuit structure 100 described in foregoing descriptions associated with FIGS. 2 to 28 and thus are not repeated herein for the sake of clarity. For example, materials and manufacturing processes related to a substrate 501, interconnect structures 502 and 596, semiconductor fins 548a and 548c, gate structures G51, G52, G53, and G54, epitaxial source/drain structures 558b, 558c, 558d, and 558e, transistors S51, S52, S53, and S54, gate vias 513a and 593a, source/drain contact 523b, 523c, 583b, and 583c, source/drain vias 513b and 593b, butted contacts 513c and 593c, silicide layers 556b, 556c, 586b, and 586c, gate spacers 530 and 554, dielectric layers 503 and 565, and a CESL 562 may be substantially the same as those of the substrate 101, the interconnect structures 102 and 196, the semiconductor fin 148, the gate structures G1, G2, G3, and G4, the epitaxial source/drain structures 158b and 158c, the transistors S1, S2, S3, and S4, the gate vias 113a and 193a, silicide layers 156b, 156c, 186b, and 186c, the source/drain contact 123b, 123c, 183b, and 183c, the source/drain vias 113b and 193b, the butted contacts 113c and 193c, the gate spacers 130 and 154, the dielectric layers 103 and 165, and the CESL 162 as shown in FIGS. 2 to 28. Therefore, reference may be made to the foregoing paragraphs for the related detailed descriptions, and are not described again herein.

The difference between the present embodiment and the embodiment in FIGS. 2 to 28 is that the upper gate structure G53 shown in FIG. 32A extends along the same direction as the lower gate structure G51 of the upper transistor S51 shown in FIG. 32B and non-overlaps with the lower gate structure G51. Alternatively, the upper gate structure G54 of the upper transistor S54 shown in FIG. 32A extends along the same direction as the lower gate structure G52 of the upper transistor S52 shown in FIG. 32B and non-overlaps with the lower gate structure G52.

Moreover, the upper source/drain via 593b, the upper source/drain contacts 583b and 583c, and the upper butted contact 593c for the upper transistors S53 and S54 are formed on the epitaxial source/drain structures 558b and 558c in the first semiconductor fin 548a as shown in FIG. 32A, and the lower source/drain via 513b, the lower source/drain contacts 523b and 523c, and the lower butted contact 513c for the lower transistors S51 and S52 are formed on the epitaxial source/drain structures 558d and 558e in the third semiconductor fin 548c, rather than the first semiconductor fin 548a as shown in FIG. 32B. In some embodiments, the epitaxial source/drain structure 558b in the first semiconductor fin 548a as shown in FIG. 32A may merge with the epitaxial source/drain structure 558d in the third semiconductor fin 548c as shown in FIG. 32B, and/or the epitaxial source/drain structure 558c in the first semiconductor fin 548a as shown in FIG. 32A may merge with the epitaxial source/drain structure 558e in the third semiconductor fin 548c as shown in FIG. 32B. In some embodiments, the epitaxial source/drain structure 558b in the first semiconductor fin 548a as shown in FIG. 32A is laterally spaced apart from the epitaxial source/drain structure 558d in the third semiconductor fin 548c as shown in FIG. 32B, and/or the epitaxial source/drain structure 558c in the first semiconductor fin 548a as shown in FIG. 32A is laterally spaced apart from the epitaxial source/drain structure 558e in the third semiconductor fin 548c as shown in FIG. 32B.

Figure 33A:
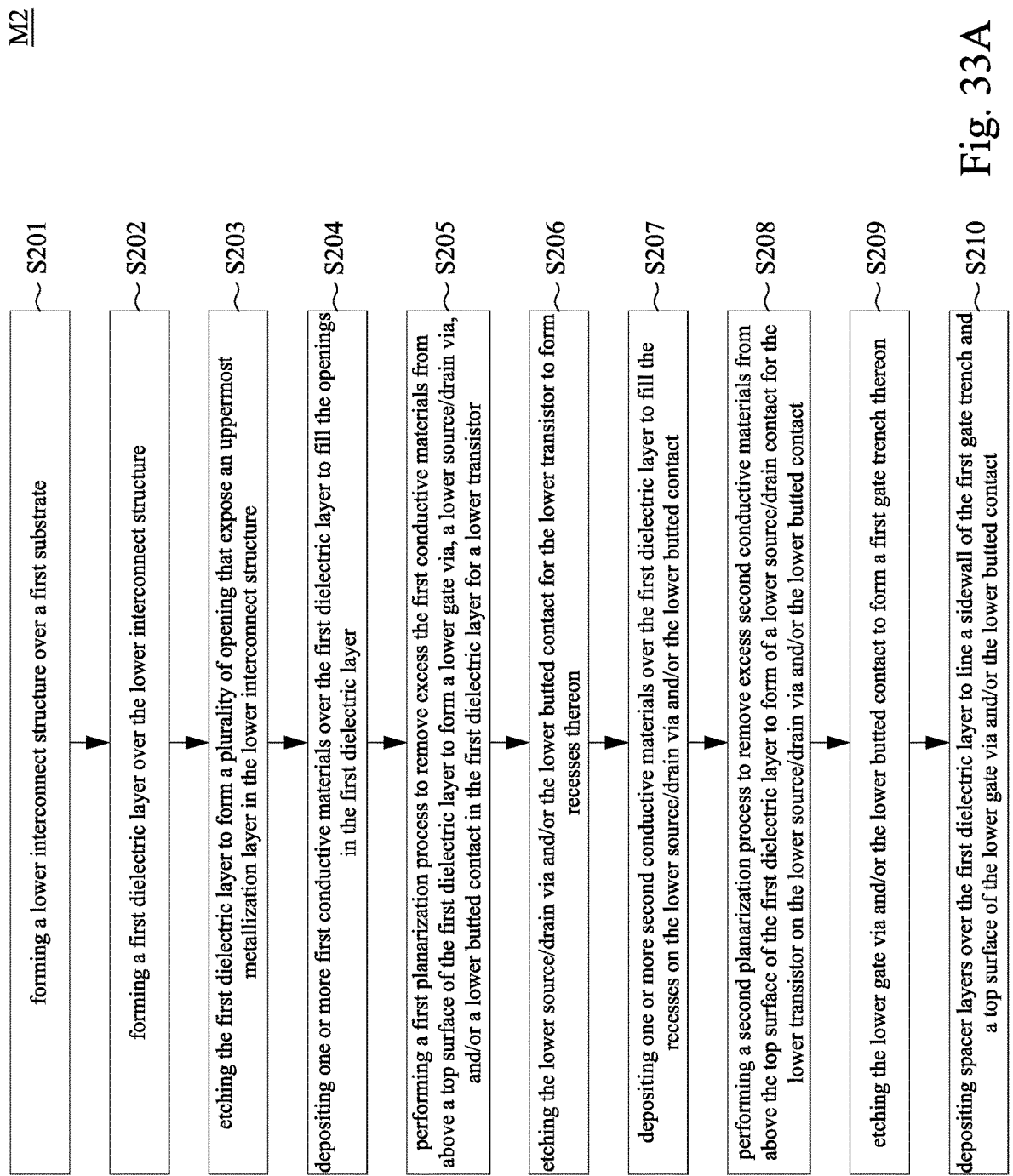
FIGS. 33A-33C are flowcharts of a method for forming an integrated circuit structure in accordance with some embodiments of the present disclosure.
Figure 33B:
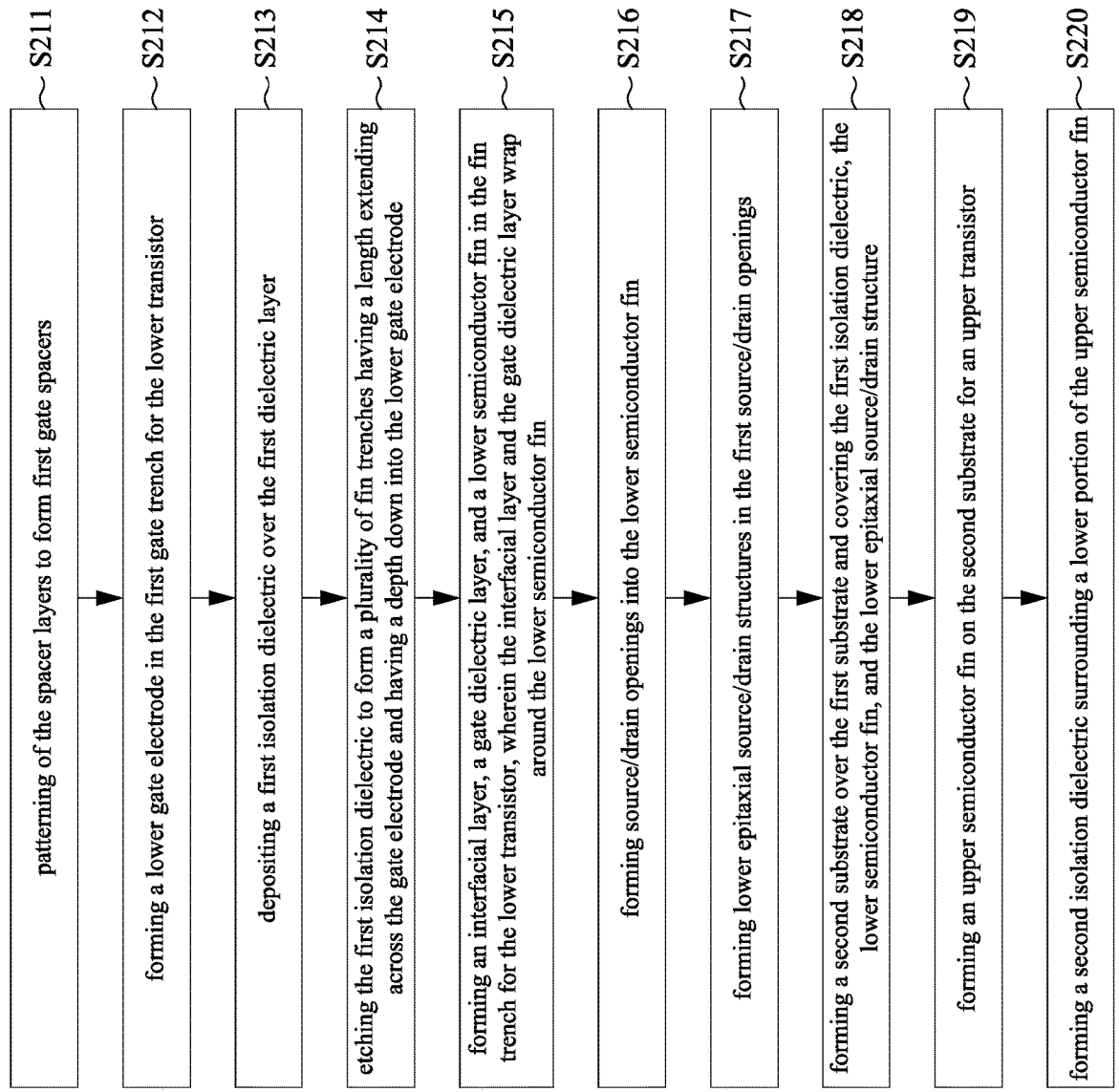
Figure 33C:
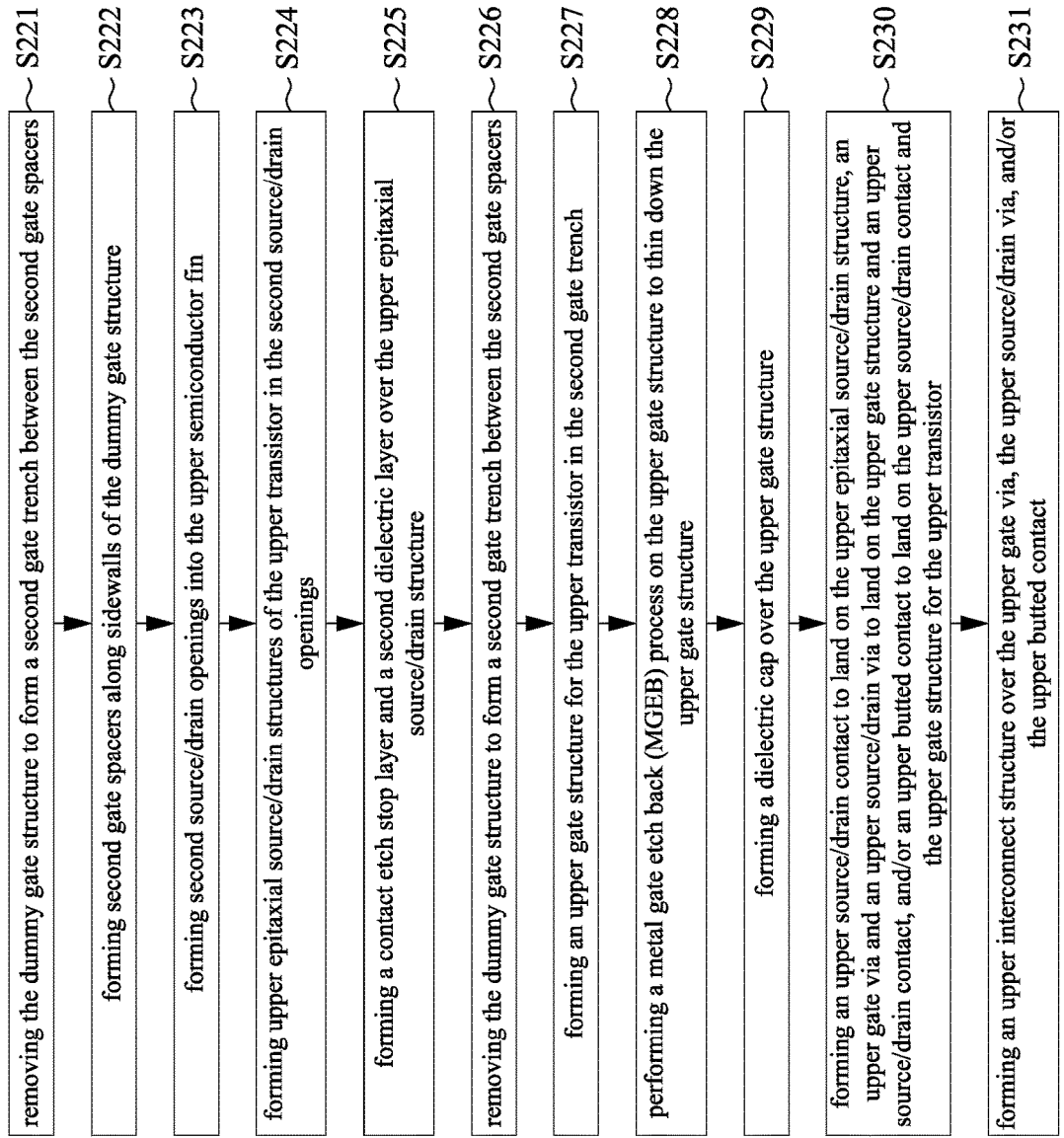

Referring now to FIGS. 33A-33C, illustrated are flowcharts of an exemplary method M2 for fabrication of an integrated circuit structure in accordance with some embodiments. The method M2 includes a relevant part of the entire manufacturing process. It is understood that additional operations may be provided before, during, and after the operations shown by FIGS. 33A-33C, and some of the operations described below can be replaced or eliminated for additional embodiments of the method. The order of the operations/processes may be interchangeable. The method M2 includes fabrication of an integrated circuit structure. However, the fabrication of the integrated circuit structure is merely an example for describing the manufacturing process according to some embodiments of the present disclosure.

Figure 35:
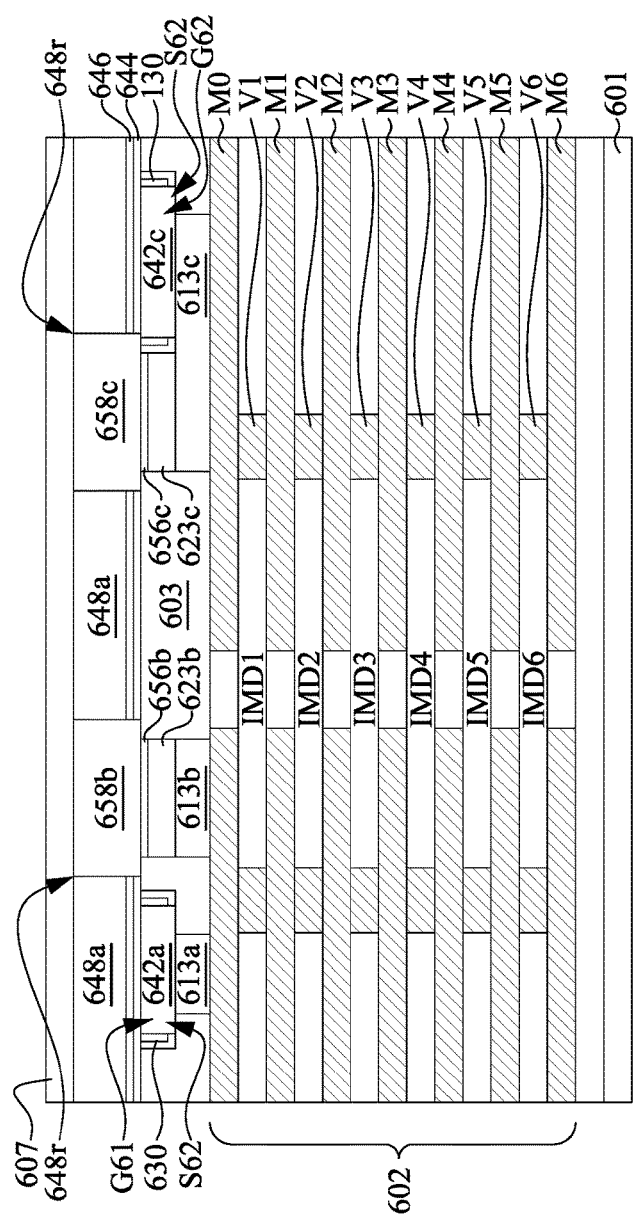
Figure 36:
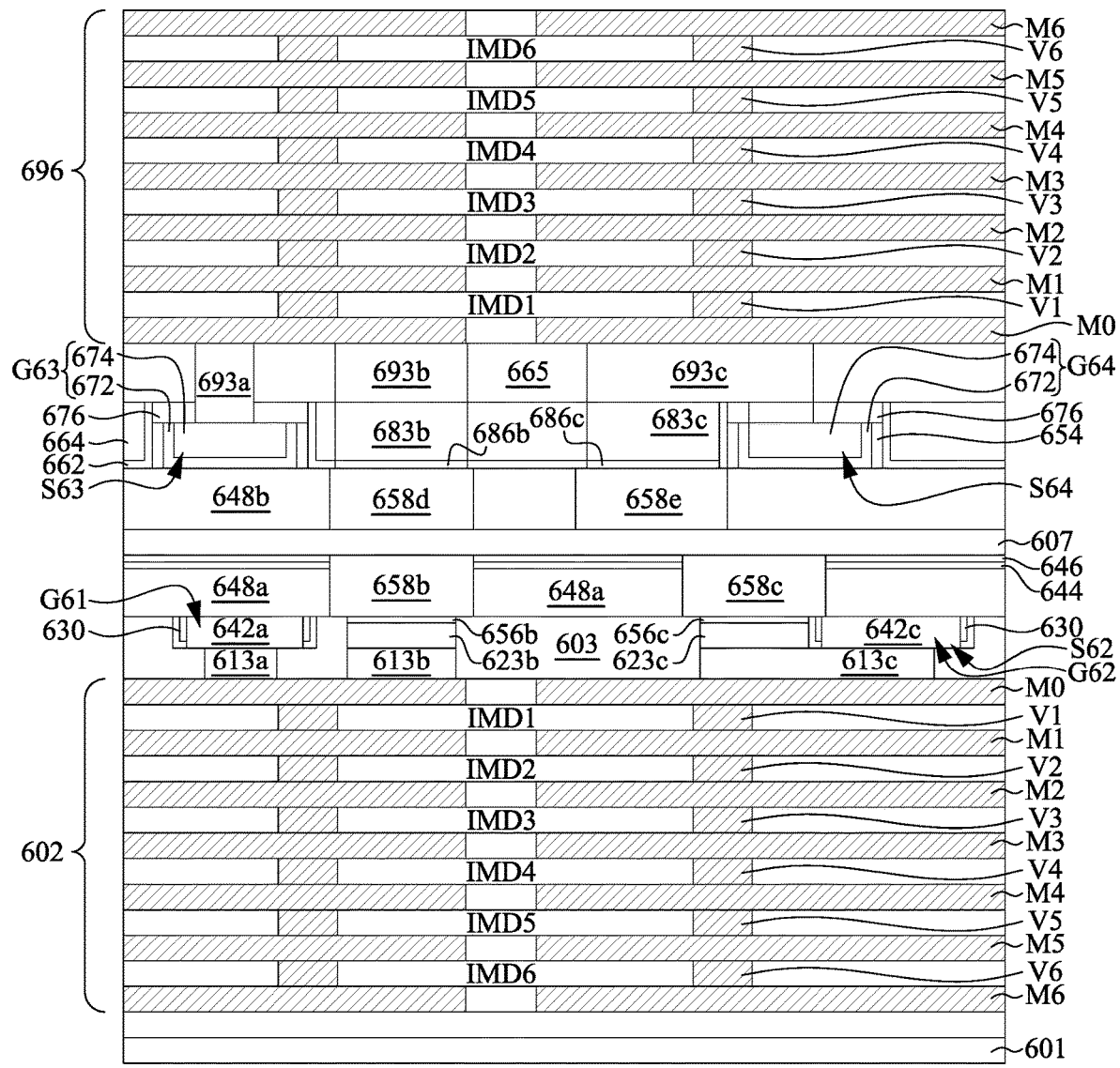

FIGS. 34-36 illustrate the method M2 in various stages of forming an integrated circuit structure 600 in accordance with some embodiments of the present disclosure. Blocks S201-S215 of method M2 for forming the integrated circuit structure 600 prior to FIG. 34 of the present embodiment are substantially the same as the block S201-S215 of method M1 for forming the integrated circuit structure 100 described in foregoing descriptions associated with FIGS. 2 to 16C and thus are not repeated herein for the sake of clarity. For example, materials and manufacturing processes related to a substrate 601, an interconnect structure 602, a semiconductor fin 648a, gate structures G61 and G62, a gate via 613a, source/drain contacts 623b and 623c, a source/drain via 613b, a butted contact 613c, gate spacers 630, and a dielectric layer 603 may be substantially the same as those of the substrate 101, the interconnect structures 102 and 196, the semiconductor fin 148, the gate structures G1 and G2, the gate via 113a, the source/drain contacts 123b and 123c, the source/drain via 113b, the butted contact 113c, the gate spacers 130, and the dielectric layer 103 as shown in FIGS.

2 to 16C. Therefore, reference may be made to the foregoing paragraphs for the related detailed descriptions, and are not described again herein.

Referring back to FIG. 33B, the method M2 then proceeds to block S216 where source/drain openings are formed into the lower semiconductor fin. With reference to FIG. 34, in some embodiments of block S216, portions of the semiconductor fin 648a are removed to form source/drain openings 648r to expose the source/drain contacts 623b and 623c. In some embodiments, the source/drain openings 648r are formed by using a photolithography and the etching process. The etching process may include a dry etching process, a wet etching process, or combination dry and wet etching processes. By way of example but not limiting the present disclosure, this etching process may include reactive ion etch (RIE) or by any other suitable removal process. After the etching process, a pre-cleaning process may be performed to clean the source/drain openings 648r with hydrofluoric acid (HF) or other suitable solution in some embodiments.

Referring back to FIG. 33B, the method M2 then proceeds to block S217 where lower epitaxial source/drain structures are formed in the first source/drain openings. With reference to FIG. 34, in some embodiments of block S217, the epitaxial source/drain structures 658b and 658c are respectively formed in the source/drain openings 648r. Therefore, the gate structure G61 and source/drain structures on opposite sides of the gate structure G61 collectively form a first transistor S61 (as shown in FIG. 38, epitaxial source/drain structures 858b and 858c on opposite sides of a gate structure G82/G85), and the gate structure G62 and source/drain structures on opposite sides of the gate structure G62 collectively form a second transistor S62.

The epitaxial source/drain structures 658b and 658c may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 648a. In some embodiments, lattice constants of the epitaxial source/drain structures 658b and 658c are different from that of the semiconductor fin 648a, so that the channel region between the epitaxial source/drain structures 658b and 658c can be strained or stressed by the epitaxial source/drain structures 658b and 658c to improve carrier mobility of the semiconductor device and enhance the device performance.

The epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 648a (e.g., silicon, silicon germanium, silicon phosphate, or the like). The epitaxial source/drain structures 658b and 658c may be in-situ doped. The doping species include p-type dopants, such as boron or BF$_2$; n-type dopants, such as phosphorus or arsenic; and/or other suitable dopants including combinations thereof. If the epitaxial source/drain structures 658b and 658c are not in-situ doped, an implantation process is performed to dope the epitaxial source/drain structures 658b and 658c. One or more annealing processes may be performed to activate the epitaxial source/drain structures 658b and 658c. The annealing processes include rapid thermal annealing (RTA) and/or laser annealing processes.

After forming the epitaxial source/drain structures 658b and 658c on the source/drain contacts 623b and 623c, one or more annealing steps are performed to induce a reaction between semiconductor materials of the epitaxial source/drain structures 658b and 658c and metal materials of the source/drain contacts 623b and 623c, thus forming silicide layers 656b and 656c between the epitaxial source/drain structures 658b and 658c and the source/drain contacts 623b and 623c. The silicidation process is to make a reaction between metal and silicon (or polycrystalline silicon). A first rapid thermal annealing (RTA) process may be performed in, for example, Ar, He, N2 or other inert atmosphere at a first temperature, such as lower than about 200~300° C., to convert the metal material of the source/drain contacts 623b and 623c into metal silicide. A subsequent second annealing or RTA step at a second temperature higher than the first temperature, such as about 400~500° C., thereby forming stable silicide layers 656b and 656c with low resistance. In some embodiments, the silicide layers 656b and 656c may include titanium silicide (TiSi), nickel silicide (NiSi), cobalt silicide (CoSi), Ni—Pt, or combinations thereof.

Referring back to FIG. 33B, the method M2 then proceeds to block S218 where a second substrate is bonded to the first substrate and covering the first isolation dielectric, the lower semiconductor fin, and the lower epitaxial source/drain structure. With reference to FIG. 35, in some embodiments of block S218, a substrate 607 includes silicon. Alternatively, the substrate 607 may include germanium, silicon germanium, gallium arsenide or other appropriate semiconductor materials. Also alternatively, the substrate 607 may include an epitaxial layer. For example, the substrate 607 may have an epitaxial layer overlying a bulk semiconductor. Further, the substrate 607 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such a strained substrate may be formed by selective epitaxial growth (SEG). Furthermore, the substrate 607 may include a semiconductor-on-insulator (SOI) structure. Also alternatively, the substrate 607 may include a buried dielectric layer, such as a buried oxide (BOX) layer, such as that formed by separation by implantation of oxygen (SIMOX) technology, wafer bonding, SEG, or another appropriate method. In some embodiments, the substrate 607 may be formed by a deposition processes, such as chemical vapor deposition (CVD), plasma enhanced atomic layer deposition (PEALD), atomic layer deposition (ALD), plasma enhanced CVD (PECVD) or other suitable techniques.

Referring back to FIG. 33B, the method M2 then proceeds to block S219 where an upper semiconductor fin is formed on the second substrate for an upper transistor. With reference to FIG. 36, in some embodiments of block S219, a substrate 607 may undergo a series of deposition and photolithography processes, such that a pad layer, a mask layer, and a patterned photoresist layer (not shown) may be formed on the substrate 607. In some embodiments, the pad layer is a thin film including silicon oxide formed using, for example, a thermal oxidation process. The pad layer may act as an adhesion layer between the substrate 607 and mask layer. pad layer may also act as an etch stop layer for etching the mask layer. In some embodiments, the mask layer is formed of silicon nitride, for example, using low-pressure chemical vapor deposition (LPCVD) or plasma enhanced chemical vapor deposition (PECVD). The mask layer is used as a hard mask during subsequent photolithography processes. A photoresist layer is formed on the mask layer and is then patterned, forming openings in the photoresist layer, so that regions of the mask layer are exposed.

The substrate 607 may be patterned to form at least one semiconductor fin 648b. The mask layer and pad layer (not shown) may be etched through the photoresist layer, exposing underlying substrate 607. The exposed substrate 607 is then etched, forming trenches. A portion of the substrate 607 between neighboring trenches can be referred to as the semiconductor fin 648b. After etching the substrate 607, the photoresist layer is removed. Next, a cleaning step may be optionally performed to remove a native oxide of the semiconductor substrate 607. The cleaning may be performed using diluted hydrofluoric (HF) acid, for example.

Referring back to FIG. 33B, the method M2 then proceeds to block S220 where a second isolation dielectric is formed to surround a lower portion of the upper semiconductor fin. With reference to FIG. 36, in some embodiments of block S220, an isolation dielectric material (not shown) is formed to cover the semiconductor fin 648b. The isolation dielectric material is formed to overfill the trenches and cover the semiconductor fin 648b. The isolation dielectric material in the trenches can be referred to as a shallow trench isolation (STI) structure. In some embodiments, the isolation dielectric material may be made of silicon oxide, silicon nitride, silicon oxynitride, fluoride-doped silicate glass (FSG), or other low-K dielectric materials. In some embodiments, the isolation dielectric material may be formed using a high-density-plasma (HDP) chemical vapor deposition (CVD) process, using silane ($SiH_4$) and oxygen ($O_2$) as reacting precursors. In some other embodiments, the isolation dielectric material may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric material may be formed using a spin-on-dielectric (SOD) process, such as hydrogen silsesquioxane (HSQ) or methyl silsesquioxane (MSQ). Other processes and materials may be used. In some embodiments, the isolation dielectric material can have a multi-layer structure, for example, a thermal oxide liner layer with silicon nitride formed over the liner. Thereafter, a thermal annealing may be optionally performed to the isolation dielectric material.

Subsequently, a planarization process such as chemical mechanical polish (CMP) is performed to remove the excess isolation dielectric material over the semiconductor fin 648b. In some embodiments, the planarization process may also remove the mask layer and the pad layer such that a top surface of the semiconductor fin 648b is exposed. In some other embodiments, the planarization process stops when the mask layer is exposed. In such embodiments, the mask layer may act as the CMP stop layer in the planarization. If the mask layer and the pad layer are not removed by the planarization process, the mask layer, if formed of silicon nitride, may be remove by a wet process using hot $H_3PO_4$, and the pad layer, if formed of silicon oxide, may be removed using diluted HF. Subsequently, the isolation dielectric material is recessed, for example, through an etching operation, in which diluted HF, SiCoNi (including HF and $NH_3$), or the like, may be used as the etchant. After recessing the isolation dielectric material, a portion of the semiconductor fin 648b is higher than a top surface of the isolation dielectric material.

It is understood that the blocks S219 and S220 described above are merely an example of how the semiconductor fin 648b and the STI structure material are formed. In other embodiments, a dielectric layer can be formed over a top surface of the substrate 607; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fin. For example, the semiconductor fin 648b can be recessed, and a material different from the recessed semiconductor fin 648b is epitaxially grown in its place. In even further embodiments, a dielectric layer can be formed over a top surface of the substrate 607; trenches can be etched through the dielectric layer; heteroepitaxial structures can be epitaxially grown in the trenches using a material different from the substrate 607; and the dielectric layer can be recessed such that the heteroepitaxial structures protrude from the dielectric layer to form fins. In some embodiments where homoepitaxial or heteroepitaxial structures are epitaxially grown, the grown materials may be in-situ doped during growth, which may obviate prior implanting of the fins although in-situ and implantation doping may be used together. In some embodiments, the semiconductor fin 648b may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

Referring back to FIG. 33C, the method M2 then proceeds to block S221 where at least one dummy gate structure is formed to extend across the upper semiconductor fin. With reference to FIG. 36, in some embodiments of block S221, dummy gate structures (not shown) are formed to extend across the semiconductor fin 648b. In some embodiments, materials and manufacturing processes related to the dummy gate structures of the present embodiment may be substantially the same as those of the dummy gate structures 152a and 152c as shown in FIGS. 2 to 28. Therefore, reference may be made to the foregoing paragraphs for the related detailed descriptions, and are not described again herein. The dummy gate structures of the present embodiment have substantially parallel longitudinal axes that are substantially perpendicular to a longitudinal axis of the semiconductor fin 648b. The dummy gate structures will be replaced with replacement gate structures G63 and G64 using a "gate-last" or replacement-gate process.

Referring back to FIG. 33C, the method M2 then proceeds to block S222 where second gate spacers are formed along sidewalls of the dummy gate structure. With reference to FIG. 36, in some embodiments of block S222, gate spacers 654 are formed along sidewalls of the dummy gate structures which will be replaced with the replacement gate structures G63 and G64. In some embodiments, materials and manufacturing processes related to the gate spacers 654 of the present embodiment may be substantially the same as those of the gate spacers 154 as shown in FIGS. 2 to 28. Therefore, reference may be made to the foregoing paragraphs for the related detailed descriptions, and are not described again herein. In some embodiments, the gate spacers 654 may be used to offset subsequently formed doped regions, such as source/drain regions. The gate spacers 654 may further be used for designing or modifying the source/drain region profile.

Referring back to FIG. 33C, the method M2 then proceeds to block S223 where second source/drain openings are formed into the upper semiconductor fin. With reference to FIG. 36, in some embodiments of block S223, portions of the semiconductor fin 648b not covered by the dummy gate structures 652a and 652c and the gate spacers 654 are removed to form source/drain openings. In some embodiments, manufacturing processes related to the source/drain openings of the present embodiment may be substantially the same as those of the source/drain openings 148r as shown in FIGS. 2 to 28. Therefore, reference may be made to the foregoing paragraphs for the related detailed descriptions, and are not described again herein. After the forming of the source/drain opening, a pre-cleaning process may be performed to clean the source/drain openings with hydrofluoric acid (HF) or other suitable solution in some embodiments.

Referring back to FIG. 33C, the method M2 then proceeds to block S224 where upper epitaxial source/drain structures of the upper transistor are formed in the second source/drain openings. With reference to FIG. 36, in some embodiments of block S224, epitaxial source/drain structures 658d and 658e are respectively formed in the source/drain openings. Therefore, the gate structure G63 and source/drain structures on opposite sides of the gate structure G63 (as shown in FIG. 38, epitaxial source/drain structures 858b and 858c on opposite sides of a gate structure G82/G85) collectively form a third transistor S63, and the gate structure G64 and source/drain structures on opposite sides of the gate structure G64 collectively form a fourth transistor S64. This is described in greater detail with reference to FIGS. 38 and 39, the gate structure G63 of the third transistor S63 overlaps with the gate structure G61 of the first transistor S61, and the gate structure G64 of the fourth transistor S64 partially overlaps with the gate structure G62 of the second transistor S62.

The epitaxial source/drain structures 658d and 658e may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 648b. In some embodiments, lattice constants of the epitaxial source/drain structures 658d and 658e are different from that of the semiconductor fin 648b, so that the channel region between the epitaxial source/drain structures 658d and 658e can be strained or stressed by the epitaxial source/drain structures 658d and 658e to improve carrier mobility of the semiconductor device and enhance the device performance. The epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 648b (e.g., silicon, silicon germanium, silicon phosphate, or the like). The epitaxial source/drain structures 658d and 658e may be in-situ doped. The doping species include p-type dopants, such as boron or $BF_2$; n-type dopants, such as phosphorus or arsenic; and/or other suitable dopants including combinations thereof. If the epitaxial source/drain structures 658e and 658e are not in-situ doped, an implantation process is performed to dope the epitaxial source/drain structures 658d and 658e. One or more annealing processes may be performed to activate the epitaxial source/drain structures 658d and 658e. The annealing processes include rapid thermal annealing (RTA) and/or laser annealing processes.

In some embodiments, before the source/drain epitaxy process, silicide layers 686b and 686c are formed on the epitaxial source/drain structures 658d and 658e by a silicidation process. In some embodiments, materials and manufacturing processes related to the silicide layers 686b and 686c of the present embodiment may be substantially the same as those of the silicide layers 186b and 186c as shown in FIGS. 2 to 28. Therefore, reference may be made to the foregoing paragraphs for the related detailed descriptions, and are not described again herein.

Subsequently, blocks S225-S231 of method M2 for forming the integrated circuit structure 600 of the present embodiment are substantially the same as the block S121-S127 of method M1 for forming the integrated circuit structure 100 described in foregoing descriptions associated with FIGS. 22 to 28 and thus are not repeated herein for the sake of clarity. For example, materials and manufacturing processes related to an interconnect structure 696, gate structures G63 and G64, a gate via 693a, source/drain contacts 683b and 683c, a source/drain via 693b, a butted contact 693c, gate spacers 654, a dielectric layer 665, a CESL 662, and a dielectric cap 676 may be substantially the same as those of the interconnect structure 196, the gate structures G3 and G4, the gate via 193a, the source/drain contacts 183b and 183c, the source/drain via 193b, the butted contact 193c, the gate spacers 154, the dielectric layer 165, the CESL 162, and the dielectric cap 176 as shown in FIGS. 22 to 28. Therefore, reference may be made to the foregoing paragraphs for the related detailed descriptions, and are not described again herein.

Figure 37A:
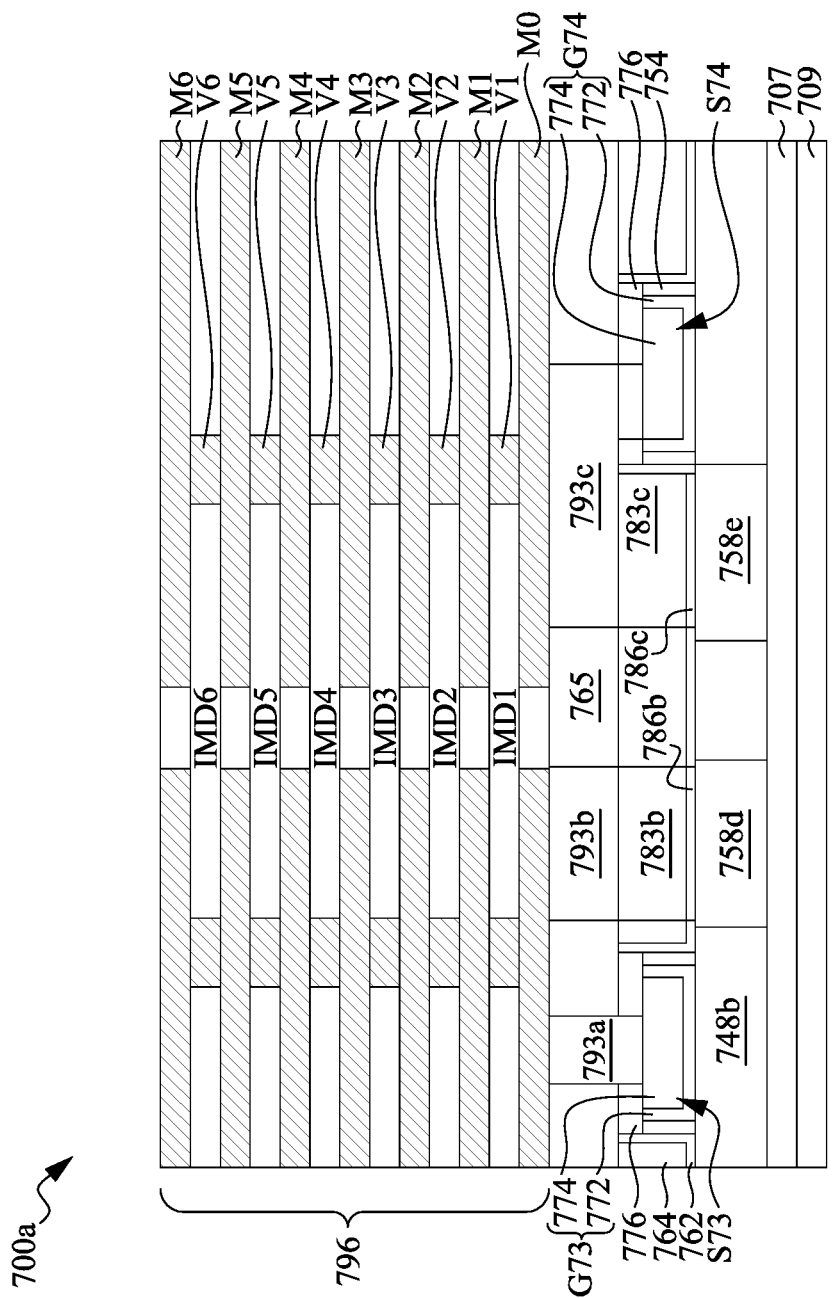
FIGS. 37A-37C illustrate schematic diagrams of an integrated circuit structure according to some other embodiments.
Figure 37B:
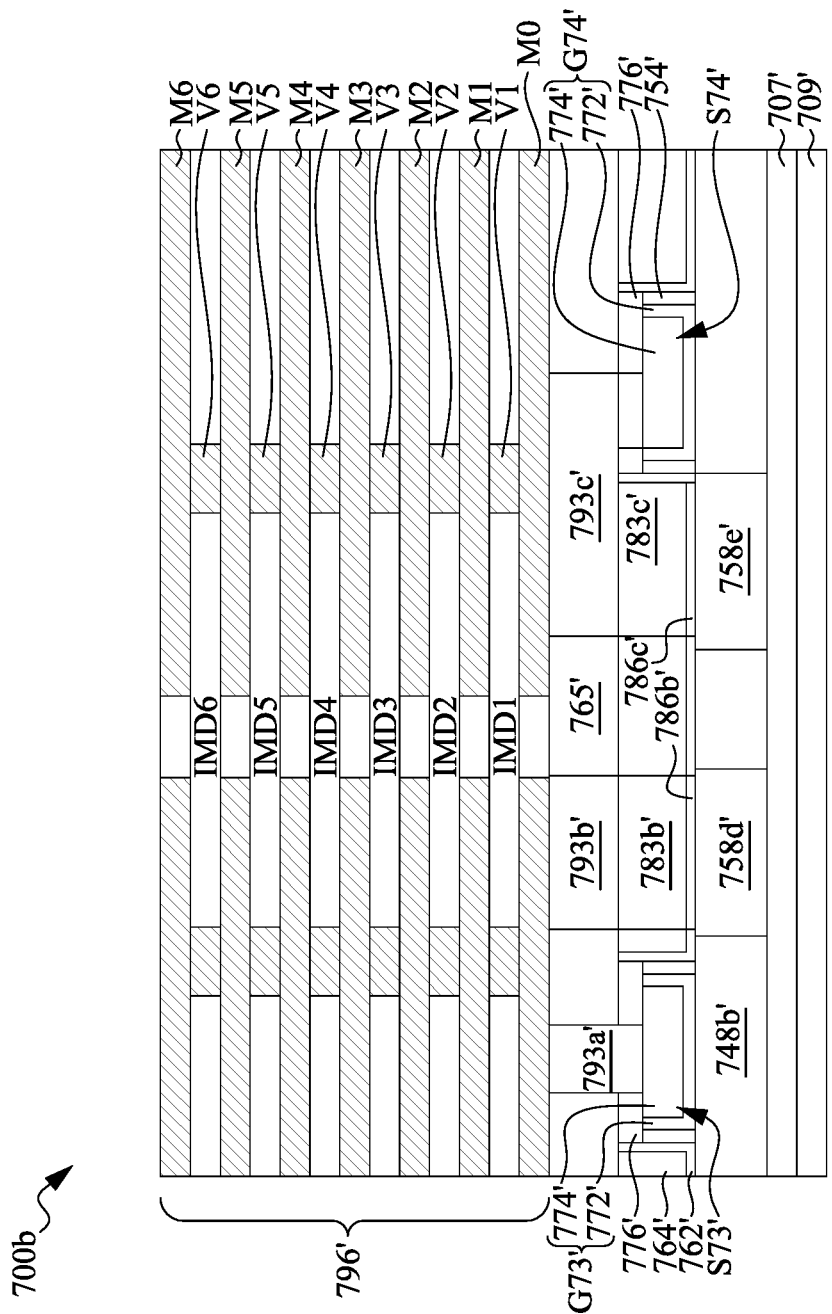
Figure 37C:
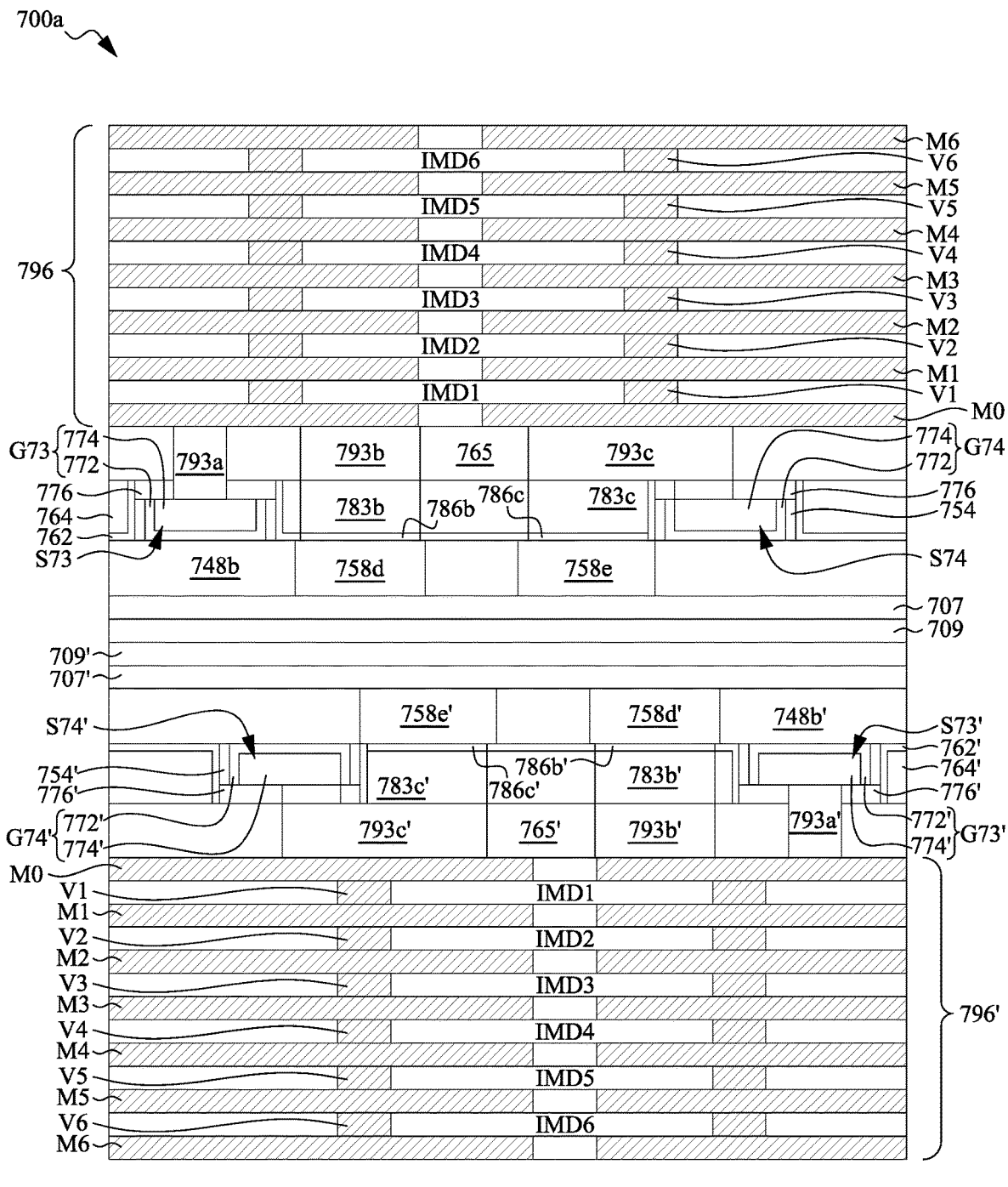

FIGS. 37A-37C illustrate cross-sectional views in fabricating an integrated circuit structure 700 according to some other embodiments. The method for forming the integrated circuit structure 700 prior to FIG. 37A of the present embodiment is substantially the same as the block S218-S231 of method M2 for forming the integrated circuit structure 600 described in foregoing descriptions associated with FIG. 36 and thus are not repeated herein for the sake of clarity. For example, materials and manufacturing processes related to a substrate 707, a semiconductor fin 748b, gate structures G73 and G74, gate spacers 754, a dielectric cap 776, epitaxial source/drain structures 758d and 758e, an interconnect structure 796, a gate via 793a, source/drain contacts 783b and 783c, a source/drain via 793b, a butted contact 793c, a dielectric layer 765, and the CESL 762 of a semiconductor structure 700a in FIG. 37A may be substantially the same as those of the substrate 607, the semiconductor fin 648b, the gate structures G63 and G64, the gate spacers 654, the dielectric cap 676, the epitaxial source/drain structures 658d and 658e, the interconnect structure 696, the gate via 693a, the source/drain contacts 683b and 683c, the source/drain via 693b, the butted contact 693c, the dielectric layer 665, and the CESL 662 as shown in FIG. 36. Therefore, reference may be made to the foregoing paragraphs for the related detailed descriptions, and are not described again herein.

With reference to FIG. 37A, the substrate 707 of the semiconductor structure 700a may be thinned using grinding and/or wet or dry etching techniques by way of example but not limitation. The remaining substrate thickness is in a range from about 50 nm to about 500 nm, by way of example but not limitation. In some embodiments, further reduction of the thickness is then performed, down to a semiconductor thickness of about 1 μm, by way of example but not limitation. In some embodiments, the thinning may be achieved by incorporating in the device wafer a doped layer which can act as an etch stop layer. A selective wet etching step stopping on the doped layer is then applied for thinning the semiconductor wafer to the required thickness of about 1 μm by way of example but not limitation. Subsequently, a passivation layer 709 is formed on a backside of the substrate 707, by a passivation process. In some embodiments, the passivation layer 709 may include silicon oxide, SiCN, or any other material for achieving subsequent direct dielectric-to-dielectric bonding process. In some embodiments, the backside of the substrate 707 is subjected to a grinding process before forming the passivation layer 709.

FIG. 37B illustrates a schematic diagram of a semiconductor structure 700b. The method for forming the semiconductor structure 700b is substantially the same as the method for forming the semiconductor structure 700a, and thus is not repeated herein for the sake of clarity. For example, materials and manufacturing processes related to a passivation layer 709', a substrate 707', a semiconductor fin 748b', gate structures G73' and G74', gate spacers 754', a dielectric cap 776', epitaxial source/drain structures 758d' and 758e', an interconnect structure 796', a gate via 793a', source/drain contacts 783b' and 783c', a source/drain via 793b', a butted contact 793c', a dielectric layer 765', and the CESL 762' of a semiconductor structure 700b as shown in FIG. 37B may be substantially the same as those of the passivation layer 709a, the substrate 707a, the semiconductor fin 748b, the gate structures G73 and G74, gate spacers 754, the dielectric cap 776, the epitaxial source/drain structures 758d and 758e, the interconnect structure 796, the gate via 793a, the source/drain contacts 783b and 783c, the source/drain via 793b, the butted contact 793c, the dielectric layer 765, and the CESL 762 of the semiconductor structure 700a as shown in FIG. 36. Therefore, reference may be made to the foregoing paragraphs for the related detailed descriptions, and are not described again herein.

Subsequently, with reference to FIG. 37C, the semiconductor structure 700a as shown in FIG. 37A is bonded to the semiconductor structure 700b as shown in FIG. 37B through the passivation layers 709 and 709' for achieving direct dielectric-to-dielectric bonding, thus obtaining a bonded semiconductor structure stack as shown in FIG. 37C.

FIG. 38 illustrates a schematic diagram of an integrated circuit structure 800 in accordance with some embodiments of the present disclosure. Operations for forming the integrated circuit structure 800 of the present embodiment are substantially the same as the operations for forming the integrated circuit structure 100 described in foregoing descriptions associated with FIGS. 2 to 28 and thus are not repeated herein for the sake of clarity. For example, materials and manufacturing processes related to a semiconductor fin 848, gate structures G81, G82, G83, G84, G85, and G86, epitaxial source/drain structures 858b and 858c, gate vias 813a and 893a, source/drain contacts 823b, 823c, 883b, and 883c, source/drain vias 813b and 893b, butted contacts 813c and 893c, silicide layers 856b, 856c, 886b, and 886c, gate spacers 830 and 854, and dielectric layers 803 and 865 may be substantially the same as those of the semiconductor fin 148, the gate structures G1, G2, G3, and G4, the epitaxial source/drain structures 158b and 158c, the gate vias 113a and 193a, silicide layers 156b, 156c, 186b, and 186c, the source/drain contacts 123b, 123c, 183b, and 183c, the source/drain vias 113b and 193b, the butted contacts 113c and 193c, the gate spacers 130 and 154, and the dielectric layers 103 and 165 as shown in FIGS. 2 to 28. Therefore, reference may be made to the foregoing paragraphs for the related detailed descriptions, and are not described again herein.

Figure 39:
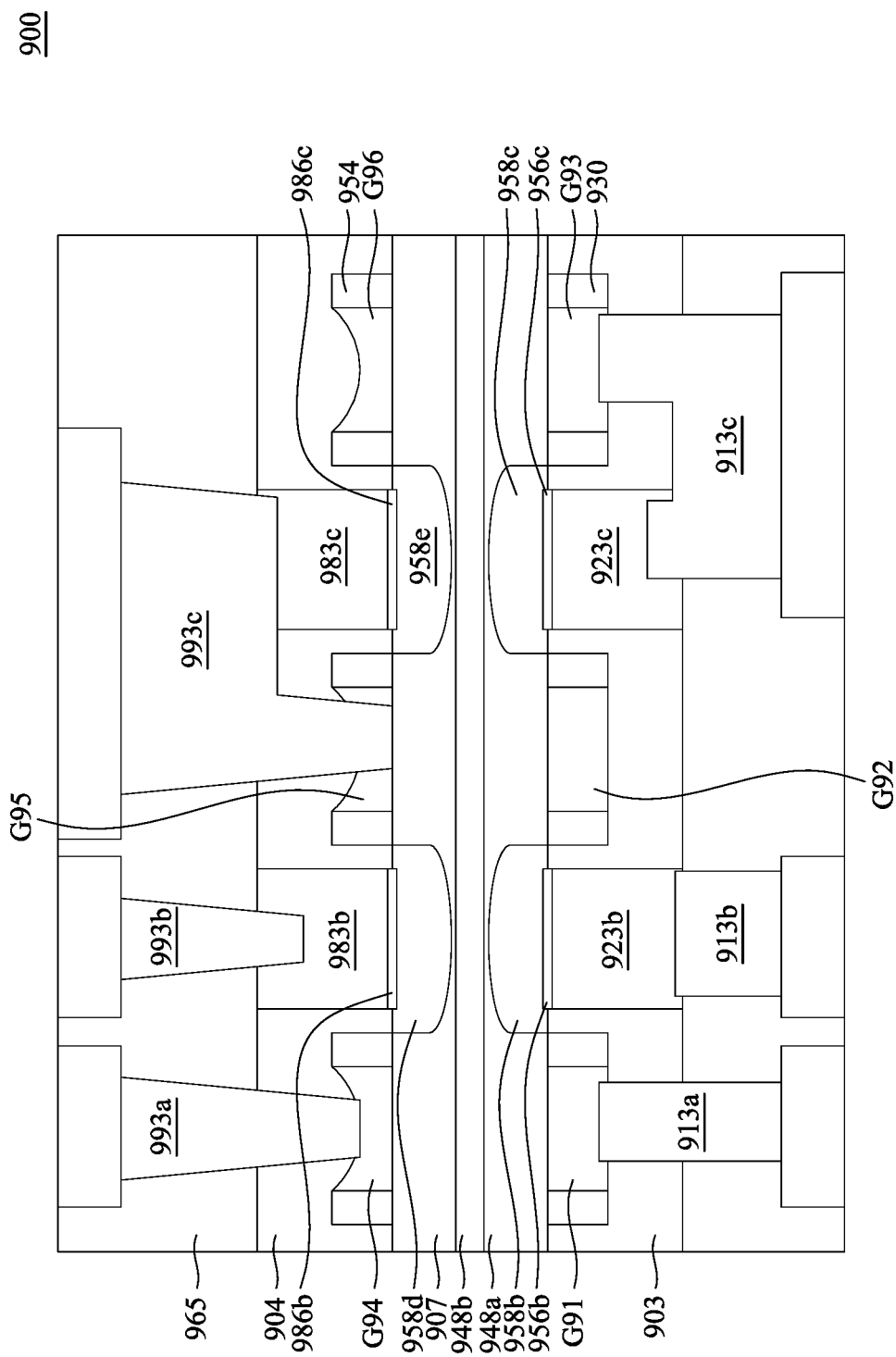

FIG. 39 illustrates a schematic diagram of an integrated circuit structure 900 in accordance with some embodiments of the present disclosure. Operations for forming the integrated circuit structure 900 of the present embodiment are substantially the same as the operations for forming the integrated circuit structure 600 described in foregoing descriptions and thus are not repeated herein for the sake of clarity. For example, materials and manufacturing processes related to a substrate 907, semiconductor fins 948a and 948b, gate structures G91, G92, G93, G94, G95, and G96, epitaxial source/drain structures 958b, 958c, 958d, and 958e, gate vias 913a and 993a, source/drain contacts 923b, 923c, 983b, and 983c, source/drain vias 913b and 993b, butted contacts 913c and 993c, silicide layers 956b, 956c, 986b, and 986c, gate spacers 930 and 954, dielectric layers 903 and 965 may be substantially the same as those of the substrate 607, the semiconductor fins 648a and 648b, the gate structures G61, G62, G63, and G64, the epitaxial source/drain structures 658b and 658c, the gate vias 613a and 693a, silicide layers 656b, 656c, 686b, and 686c, the source/drain contacts 623b, 623c, 683b, and 683c, the source/drain vias 613b and 693b, the butted contacts 613c and 693c, the gate spacers 630 and 654, and the dielectric layers 603 and 665 as shown in FIGS. 34 to 36. Therefore, reference may be made to the foregoing paragraphs for the related detailed descriptions, and are not described again herein.

Based on the above discussion, it can be seen that the present disclosure offers advantages. It is understood, however, that other embodiments may offer additional advantages, and not all advantages are necessarily disclosed herein. Moreover, no particular advantage is required for all embodiments. The present disclosure in various embodiments provides "double semiconductor devices" on a given transistor area of a chip. More particularly, within a given transistor area, a transistor is disposed above another transistor, which in turn doubles the number of transistors within the given transistor area, so that a functional density of the IC can be increased.

In some embodiments, an integrated circuit structure includes a lower interconnect structure, a first semiconductor fin, a lower gate structure, first source/drain structures, an upper gate structure, and an upper interconnect structure. The first semiconductor fin is above the lower interconnect structure. The lower gate structure is under the first semiconductor fin and extends across the first semiconductor fin. The first source/drain structures are in the first semiconductor fin and on opposite sides of the lower gate structure. The first source/drain structures form a lower transistor with the lower gate structure. The upper gate structure is above the first semiconductor fin and extends across the first semiconductor fin. The upper gate structure forms an upper transistor with the first source/drain structures. The upper interconnect structure is above the upper gate. In some embodiments, the upper gate structure overlaps with the lower gate structure. In some embodiments, the first source/drain structures penetrate through the first semiconductor fin. In some embodiments, the first semiconductor fin has a bottom end embedded in the lower gate structure and a top end embedded in the upper gate structure. In some embodiments, a top surface of the lower gate structure has a recessed region. In some embodiments, the integrated circuit structure further includes a lower gate via extending downwardly from the lower gate structure to the lower interconnect structure and an upper gate via extending upwardly from the upper gate structure to the upper interconnect structure. In some embodiments, the upper gate via overlaps with the lower gate via. In some embodiments, the integrated circuit structure further includes a butted contact electrically connected the lower gate structure to one of the first source/drain structures. In some embodiments, the integrated circuit structure further includes a second semiconductor fin extending in parallel to the first semiconductor fin and second source/drain structures in the second semiconductor fin, and the lower and upper gate structures further extend across the second semiconductor fin. In some embodiments, the second source/drain structures in the second semiconductor fin are spaced apart from the first source/drain structures in the first semiconductor fin.

In some embodiments, an integrated circuit structure includes a first interconnect structure, a first gate structure, a first semiconductor fin, a first semiconductor substrate, a second semiconductor fin, a second gate structure, and a second interconnect structure. The first gate structure extends above the first interconnect structure at a first level height. The first semiconductor fin extends above and is across the first gate structure. The first semiconductor substrate is over the semiconductor fin. The second semiconductor fin extends above the first semiconductor substrate. The second gate structure extends above and is across the second semiconductor fin at a second level height higher than the first level height. The second interconnect structure is over the second gate structure. In some embodiments, the second gate structure overlaps with the first gate structure. In some embodiments, the second gate structure non-overlaps with the first gate structure. In some embodiments, the first semiconductor substrate is between the first and second semiconductor fins. In some embodiments, the integrated circuit structure further includes second semiconductor substrate between the first semiconductor substrate and the second semiconductor fin and a passivation layer between the first and second semiconductor substrates. In some embodiments, the integrated circuit structure further includes a first epitaxial structure in the first semiconductor fin and on opposite sides of the first gate structure and a second epitaxial structure in the second semiconductor fin and on opposite sides of the second gate structure.

In some embodiments, a method for forming an integrated circuit structure includes: forming a first interconnect structure over a substrate; forming a first dielectric layer over the first interconnect structure; etching a gate trench in the first dielectric layer; forming a first gate structure in the gate trench in the first dielectric layer; depositing a second dielectric layer over the first gate structure; etching a fin trench in the second dielectric layer and extending in a direction perpendicular to the gate trench; forming a semiconductor fin in the fin trench in the second dielectric layer; and forming a second gate structure extending across the second semiconductor fin. In some embodiments, etching the fin trench is performed such that the fin trench extends into the first gate structure. In some embodiments, the method further includes: after forming the semiconductor fin and before forming the second gate structure, etching back the second dielectric layer to below a top surface of the semiconductor fin. In some embodiments, the method further includes: etching the semiconductor fin to form a plurality of openings on opposite sides of the first gate structure; and epitaxially growing a plurality of source/drain structures in the plurality of the openings, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit structure, comprising:
    forming a first interconnect structure over a substrate;
    forming a first dielectric layer over the first interconnect structure;
    etching a gate trench in the first dielectric layer;
    forming a first gate structure in the gate trench in the first dielectric layer;
    depositing a second dielectric layer over the first gate structure;
    etching a fin trench in the second dielectric layer and extending in a direction perpendicular to the gate trench;
    forming a semiconductor fin in the fin trench in the second dielectric layer; and
    forming a second gate structure extending across the semiconductor fin.

2. The method of claim 1, wherein etching the fin trench is performed such that the fin trench extends into the first gate structure.

3. The method of claim 1, further comprising:
    after forming the semiconductor fin and before forming the second gate structure, etching back the second dielectric layer to below a top surface of the semiconductor fin.

4. The method of claim 1, further comprising:
    etching the semiconductor fin to form a plurality of openings on opposite sides of the first gate structure; and
    epitaxially growing a plurality of source/drain structures in the plurality of the openings, respectively.

5. A method, comprising:
    forming a first gate via over a first interconnect structure;
    after forming the first gate via, forming a first gate structure over the first interconnect structure, such that after forming the first gate structure, the first gate via extends downwardly from the first gate structure to the first interconnect structure;
    forming a first semiconductor fin over the first gate structure, wherein the first gate structure extends across the first semiconductor fin;
    forming first source/drain structures in the first semiconductor fin and on opposite sides of the first gate structure, wherein the first source/drain structures form a first transistor with the first gate structure;
    forming a second gate structure above the first semiconductor fin, wherein the second gate structure extends across the first semiconductor fin, and the second gate structure forms a second transistor with the first source/drain structures;
    forming a second gate via over the second gate structure; and
    forming a second interconnect structure above the second gate structure, such that the second gate via extends upwardly from the second gate structure to the second interconnect structure.

6. The method of claim 5, wherein the second gate structure overlaps with the first gate structure.

7. The method of claim 5, wherein the first source/drain structures penetrate through the first semiconductor fin.

8. The method of claim 5, wherein the first semiconductor fin has a bottom end embedded in the first gate structure and a top end embedded in the second gate structure.

9. The method of claim 5, wherein a top surface of the first gate structure has a recessed region.

10. The method of claim 5, wherein the second gate via overlaps with the first gate via.

11. The method of claim 5, further comprising:
forming a source/drain contact over the first interconnect structure prior to forming the first semiconductor fin, such that after forming the first source/drain structures, the source/drain contact electrically connects one of the first source/drain structures to the first interconnect structure.

12. The method of claim 11, further comprising:
forming a source/drain via over the first interconnect structure prior to forming the source/drain contact, such that after forming the source/drain contact, the source/drain via electrically connects the source/drain contact to the first interconnect structure.

13. A method, comprising:
forming a first gate structure over a first interconnect structure;
forming a first metal contact over the first interconnect structure;
after forming the first metal contact, forming a channel region over the first gate structure;
forming a plurality of epitaxial structures on opposite sides of the channel region, such that after forming the epitaxial structures, the first metal contact electrically connects one of the epitaxial structures to the first interconnect structure;
forming a second gate structure over the channel region; and
forming a second interconnect structure over the second gate structure.

14. The method of claim 13 further comprising:
after forming the second gate structure, forming a second metal contact over the one of the epitaxial structures.

15. The method of claim 14, wherein the second metal contact overlaps with the first metal contact.

16. The method of claim 13, wherein a gate dielectric layer of the first gate structure is spaced apart from a gate dielectric layer of the second gate structure.

17. The method of claim 13, wherein the second gate structure overlaps with the first gate structure.

18. The method of claim 13, further comprising:
forming a first conductive via over the first interconnect structure prior to forming the first gate structure, such that after forming the first gate structure, the first conductive via extends downwardly from the first gate structure to the first interconnect structure.

19. The method of claim 18, further comprising:
forming a second conductive via over the second gate structure, such that after forming the second interconnect structure, the second conductive via extends upwardly from the second gate structure to the second interconnect structure.

20. The method of claim 13, further comprising:
forming a via over the first interconnect structure prior to forming the first metal contact, such that after forming the first metal contact, the via electrically connects the first metal contact to the first interconnect structure.

* * * * *